(12) United States Patent
Chiang et al.

(10) Patent No.: US 10,872,825 B2
(45) Date of Patent: Dec. 22, 2020

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Hung-Li Chiang, Taipei (TW); I-Sheng Chen, Taipei (TW); Tzu-Chiang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/281,686

(22) Filed: Feb. 21, 2019

(65) Prior Publication Data

US 2020/0006154 A1   Jan. 2, 2020

Related U.S. Application Data

(60) Provisional application No. 62/693,162, filed on Jul. 2, 2018.

(51) Int. Cl.
*H01L 27/01* (2006.01)
*H01L 27/12* (2006.01)
(Continued)

(52) U.S. Cl.
CPC ............. *H01L 21/823807* (2013.01); *H01L 21/02532* (2013.01); *H01L 21/02603* (2013.01);
(Continued)

(58) Field of Classification Search
CPC .......... H01L 21/823807; H01L 21/845; H01L 27/092; H01L 21/823821; H01L 27/0924;
(Continued)

(56) References Cited

U.S. PATENT DOCUMENTS 9,236,267 B2   1/2016   De et al.
9,502,265 B1   11/2016  Jiang et al.
(Continued)

FOREIGN PATENT DOCUMENTS

KR   10-2011-0049806 A   5/2011
KR   10-2017-0003354 A   1/2017
(Continued)

*Primary Examiner* — Theresa T Doan
(74) *Attorney, Agent, or Firm* — McDermott Will & Emery LLP

(57) ABSTRACT

A semiconductor device includes a first plurality of stacked nanowire structures extending in a first direction disposed over a first region of a semiconductor substrate. Each nanowire structure of the first plurality of stacked nanowire structures includes a plurality of nanowires arranged in a second direction substantially perpendicular to the first direction. A nanowire stack insulating layer is between the substrate and a nanowire closest to the substrate of each nanowire structure of the first plurality of stacked nanowire structures. At least one second stacked nanowire structure is disposed over a second region of the semiconductor substrate, and a shallow trench isolation layer is between the first region and the second region of the semiconductor substrate.

20 Claims, 46 Drawing Sheets

(51) Int. Cl.
  *H01L 31/0392* (2006.01)
  *H01L 21/8238* (2006.01)
  *H01L 27/092* (2006.01)
  *H01L 29/06* (2006.01)
  *H01L 29/423* (2006.01)
  *H01L 29/786* (2006.01)
  *H01L 29/66* (2006.01)
  *H01L 21/308* (2006.01)
  *H01L 21/02* (2006.01)
  *H01L 21/762* (2006.01)
  *H01L 21/306* (2006.01)

(52) U.S. Cl.
  CPC ...... *H01L 21/308* (2013.01); *H01L 21/30604* (2013.01); *H01L 21/76224* (2013.01); *H01L 21/823828* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/66742* (2013.01); *H01L 29/78696* (2013.01)

(58) Field of Classification Search
  CPC ............. H01L 29/0649; H01L 29/0673; H01L 27/0251
  USPC ........................................................ 257/351
  See application file for complete search history.

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2012/0276695 A1* | 11/2012 | Cheng ................. H01L 27/1211 438/154 |
| 2017/0005195 A1 | 1/2017 | Ching et al. |
| 2017/0104061 A1* | 4/2017 | Peng .................... H01L 29/0673 |
| 2019/0393130 A1* | 12/2019 | Mahnkopf .......... H01L 23/3736 |
| 2020/0051869 A1* | 2/2020 | Chiang ............. H01L 29/66545 |

FOREIGN PATENT DOCUMENTS

| | | |
|---|---|---|
| KR | 10-2017-0041605 A | 4/2017 |
| WO | 2010/011287 A1 | 1/2010 |

\* cited by examiner

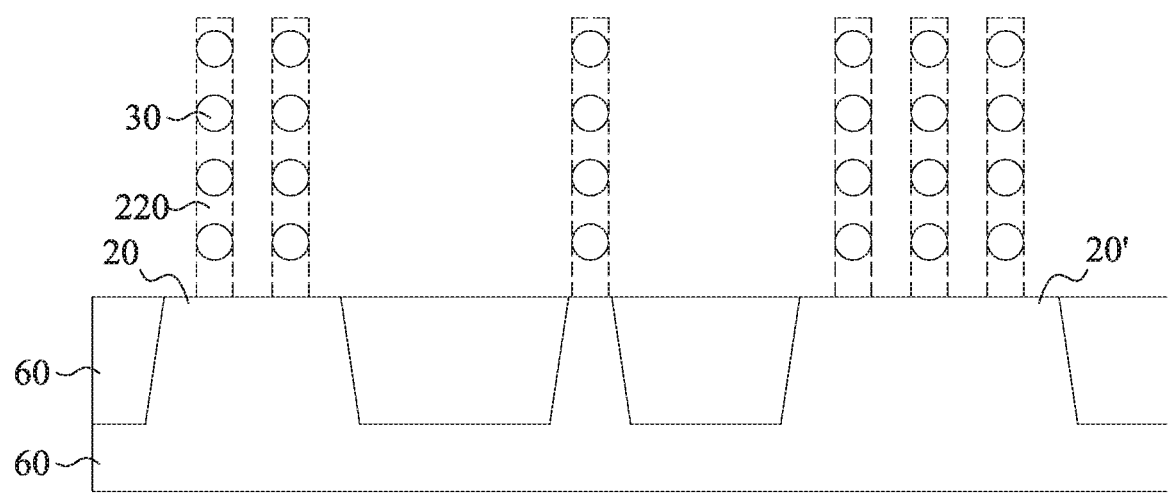
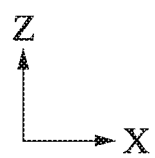
Fig. 1

METHOD OF MANUFACTURING A SEMICONDUCTOR DEVICE AND A SEMICONDUCTOR DEVICE

CROSS-REFERENCE TO RELATED APPLICATION

This application claims the benefit of priority to U.S. Provisional Patent Application 62/693,162, filed Jul. 2, 2018, the entire disclosures of which is incorporated herein by reference.

TECHNICAL FIELD

The disclosure relates to a method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a FinFET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. The fourth side, the bottom part of the channel is further away from the gate electrode and thus is not under close gate control. In contrast, in a GAA FET, all side surfaces of the channel region are surrounded by the gate electrode. As transistor dimensions are continually scaled down to sub 10-15 nm technology nodes, further improvements of FinFETs and GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows an schematic cross-sectional view of a semiconductor device according to embodiments of the present disclosure.

FIG. 4A is an isometric view. FIG. 4B is a cross-sectional view taken along line A-A' of FIG. 4A.

FIG. 5A is an isometric view. FIG. 5B is a cross-sectional view taken along line B-B' of FIG. 5A.

FIG. 6A is an isometric view. FIG. 6B is a cross-sectional view taken along line C-C' of FIG. 6A.

FIG. 7A is an isometric view. FIG. 7B is a cross-sectional view taken along line D-D' of FIG. 7A.

FIG. 8A is an isometric view. FIG. 8B is a cross-sectional view taken along line E-E' of FIG. 8A.

FIG. 9A is an isometric view. FIG. 9B is a cross-sectional view taken along line F-F' of FIG. 9A.

FIG. 10A is an isometric view. FIG. 10B is a cross-sectional view taken along line G-G' of FIG. 10A.

FIG. 11A is an isometric view. FIG. 11B is a cross-sectional view taken along line H-H' of FIG. 11A.

FIG. 12A is an isometric view. FIG. 12B is a cross-sectional view taken along line J-J' of FIG. 12A.

FIG. 13A is an isometric view. FIG. 13B is a cross-sectional view taken along line K-K' of FIG. 13A.

FIG. 14A is an isometric view. FIG. 14B is a cross-sectional view taken along line L-L' of FIG. 14A.

FIG. 15A is an isometric view. FIG. 15B is a cross-sectional view taken along line M-M' of FIG. 15A.

FIG. 16A is an isometric view. FIG. 16B is a cross-sectional view taken along line N-N' of FIG. 16A. FIG. 16C is a cross-sectional view taken along line O-O' of FIG. 16A. FIG. 16D is a cross-sectional view taken along line P-P' of FIG. 16A.

DETAILED DESCRIPTION

Figure 2:
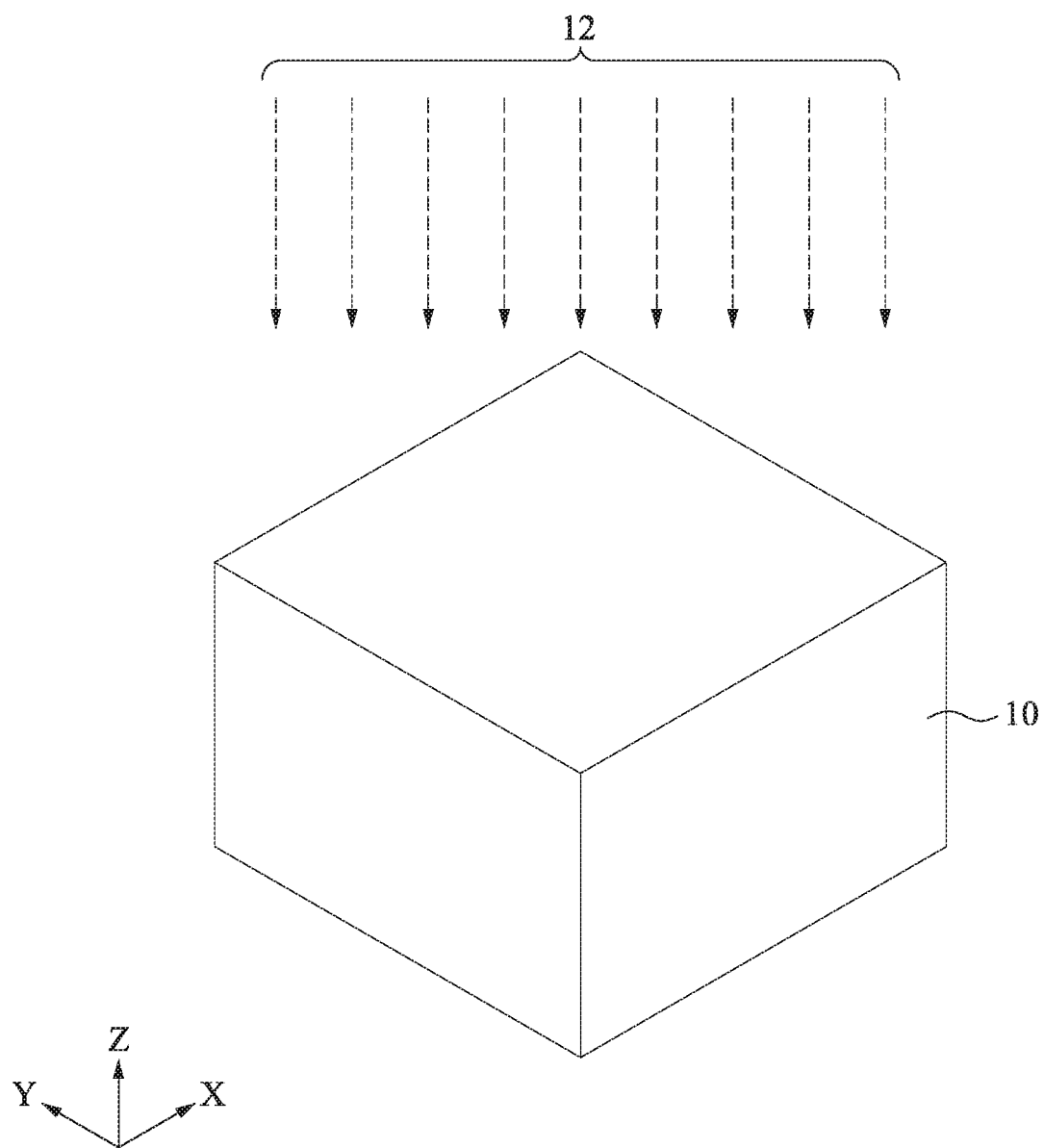
FIG. 2 shows an isometric view of one of the various stages of manufacturing a GAA FET semiconductor device according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the present disclosure, a method for fabricating a GAA FET and a stacked channel FET are provided. It is noted that in the present disclosure, a source and a drain are interchangeably used and the structures thereof are substantially the same.

As semiconductor device size decreases, difficulties arise in forming high aspect ratio fin or stacked nanowire structures. The fin structure or stacked nanowire structure height includes the height of the active area or upper portion of the structure and the height of the shallow trench isolation region. To form high aspect ratio structures deep etching of the substrate is required. The total amount of etching required can be difficult to control when forming high aspect ratio fin or nanowire structures. Embodiments of the present disclosure address these issues as set forth herein.

FIG. 1 shows a schematic cross-sectional view of a semiconductor device according to embodiments of the present disclosure. Semiconductor devices according to some embodiments of the present disclosure include a plurality of mesa structures 20, 20' formed from a semiconductor substrate 10. A plurality of nanowire structures 220 arranged along the X direction are formed over the mesa structures 20, 20'. The nanowire structures 220 include a plurality of nanowires 30 stacked substantially parallel to each other along the Z direction. Shallow trench isolation layers (or isolation insulating layers) 60 are formed in the semiconductor substrate 10 between mesa structures 20. In some embodiments, individual nanowire structures 220 are separated from the mesa structures 20, 20' by a shallow trench isolation layer 60.

FIGS. 2 to 16D illustrate a method of manufacturing a GAA FET semiconductor device according to embodiments of the present disclosure. As shown in FIG. 2, impurity ions (dopants) 12 are implanted into a silicon substrate 10 to form a well region. The ion implantation is performed to prevent a punch-through effect. In one embodiment, substrate 10 includes a single crystalline semiconductor layer on at least its surface. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 includes silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. In some embodiments of the present disclosure, the substrate 10 includes various regions that have been suitably doped with impurities (e.g., p-type or n-type conductivity). The dopants 12 are, for example, boron ($BF_2$) for an n-type FinFET and phosphorus for a p-type FinFET.

Figure 3:
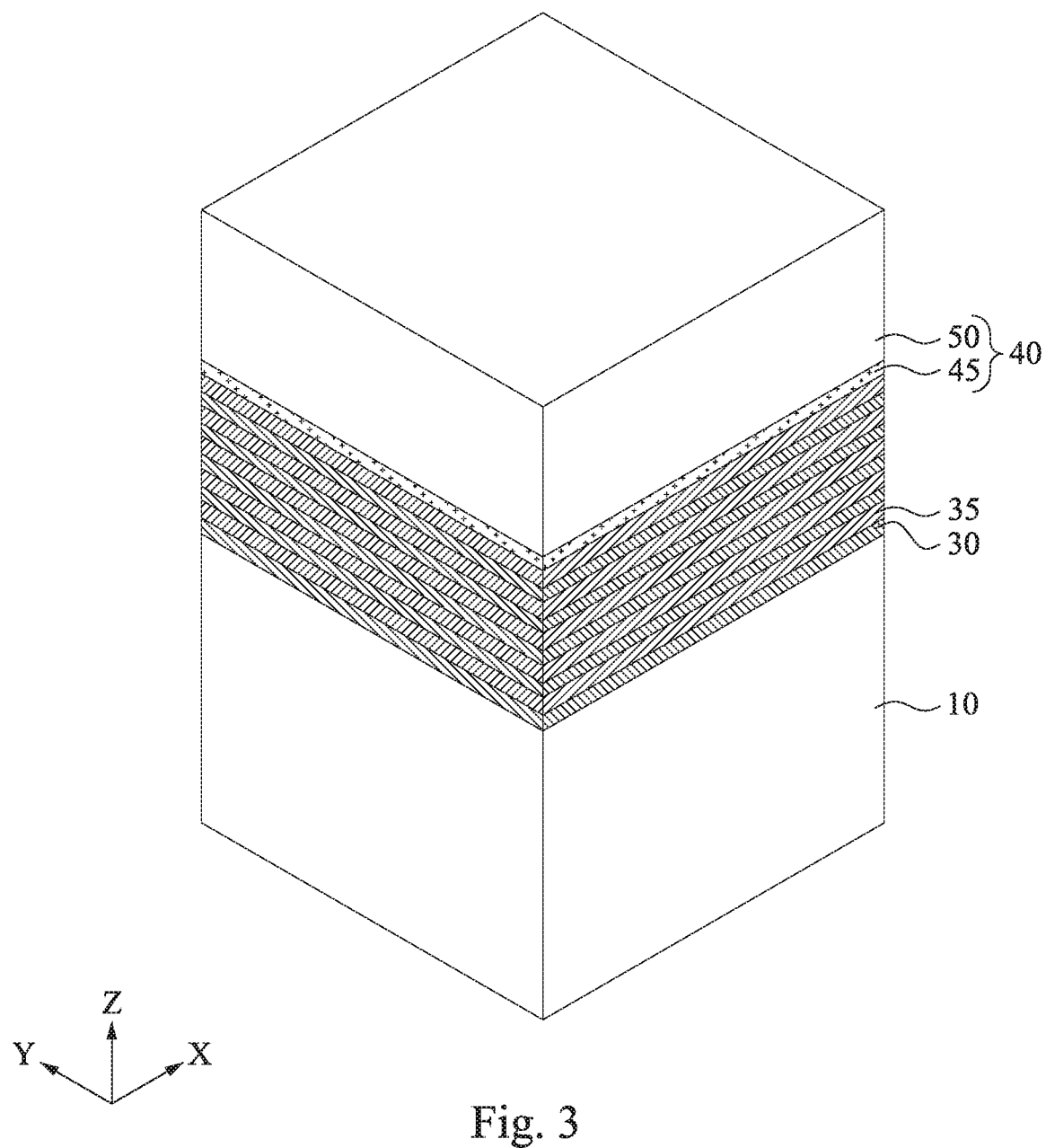
FIG. 3 shows an isometric view of one of the various stages of manufacturing a GAA FET semiconductor device according to an embodiment of the present disclosure.

In FIG. 3, an alternating stack of first semiconductor layers 30 and second semiconductor layers 35 made of different materials are formed over the substrate 10. The first semiconductor layers 30 and the second semiconductor layers 35 are formed of materials having different lattice constants, and include one or more layers of Si, Ge, SiGe, GaAs, InSb, GaP, GaSb, InAlAs, InGaAs, GaSbP, GaAsSb or InP in some embodiments of the present disclosure.

In some embodiments, the first semiconductor layers 30 and the second semiconductor layers 35 are formed of Si, a Si compound, SiGe, Ge or a Ge compound. In one embodiment, the first semiconductor layers 30 are $Si_{1-x}Ge_x$, where x is more than about 0.3, or Ge (x=1.0) and the second semiconductor layers 35 are Si or $Si_{1-y}Ge_y$, where y is less than about 0.4 and x>y. In this disclosure, an "M" compound" or an "M based compound" means the majority of the compound is M.

In another embodiment, the second semiconductor layers 35 are $Si_{1-y}Ge_y$, where y is more than about 0.3, or Ge, and the first semiconductor layers 30 are Si or $Si_{1-x}Ge_x$, where x is less than about 0.4 and x<y. In yet other embodiments, the first semiconductor layer 30 is made of $Si_{1-x}Ge_x$, where x is in a range from about 0.3 to about 0.8, and the second semiconductor layer 35 is made of $Si_{1-x}Ge_x$, where x is in a range from about 0.1 to about 0.4.

FIG. 3 shows five layers of the first semiconductor layer 30 and second semiconductor layer 35. However, the number of the layers are not limited to five, and may be as small as 1 (one layer each) in some embodiments, or 2 to 10 layers of each of the first and second semiconductor layers. By adjusting the numbers of the stacked layers, a driving current of the GAA FET device can be adjusted.

The first semiconductor layers 30 and the second semiconductor layers 35 are epitaxially formed over the substrate 10. The thickness of the first semiconductor layers 30 may be equal to, greater than, or less than that of the second semiconductor layers 30, and is in a range from about 2 nm to about 40 nm in some embodiments, in a range from about 3 nm to about 30 nm in other embodiments, and in a range of about 5 nm to about 10 nm in other embodiments. The thickness of the second semiconductor layers 35 is in a range from about 2 nm to about 40 nm in some embodiments, in a range from about 3 nm to about 30 nm in other embodiments, and in a range of about 5 nm to about 10 nm in other embodiments. In some embodiments, the bottom first semiconductor layer 30 (the closest layer to the substrate 10) is thicker than the remaining first semiconductor layers 30. The thickness of the bottom first semiconductor layer 30 is in a range from about 10 nm to about 40 nm in some embodiments, or is in a range from about 10 nm to about 30 nm in other embodiments.

Further, as shown in FIG. 3, a hard mask layer 40 is formed over the stacked first and second semiconductor layers 30, 35. In some embodiments, the hard mask layer 40 includes a first mask layer 45 and a second mask layer 50. The first mask layer 45 is a pad oxide layer made of a silicon oxide in some embodiments. The first mask layer 45 may be formed by thermal oxidation. The second mask layer 50 is made of a silicon nitride in some embodiments. The second mask layer 50 may be formed by chemical vapor deposition (CVD), including low pressure CVD (LPCVD) and plasma enhanced CVD (PECVD); physical vapor deposition (PVD), including sputtering; atomic layer deposition (ALD); or other suitable process.

Figure 4A:
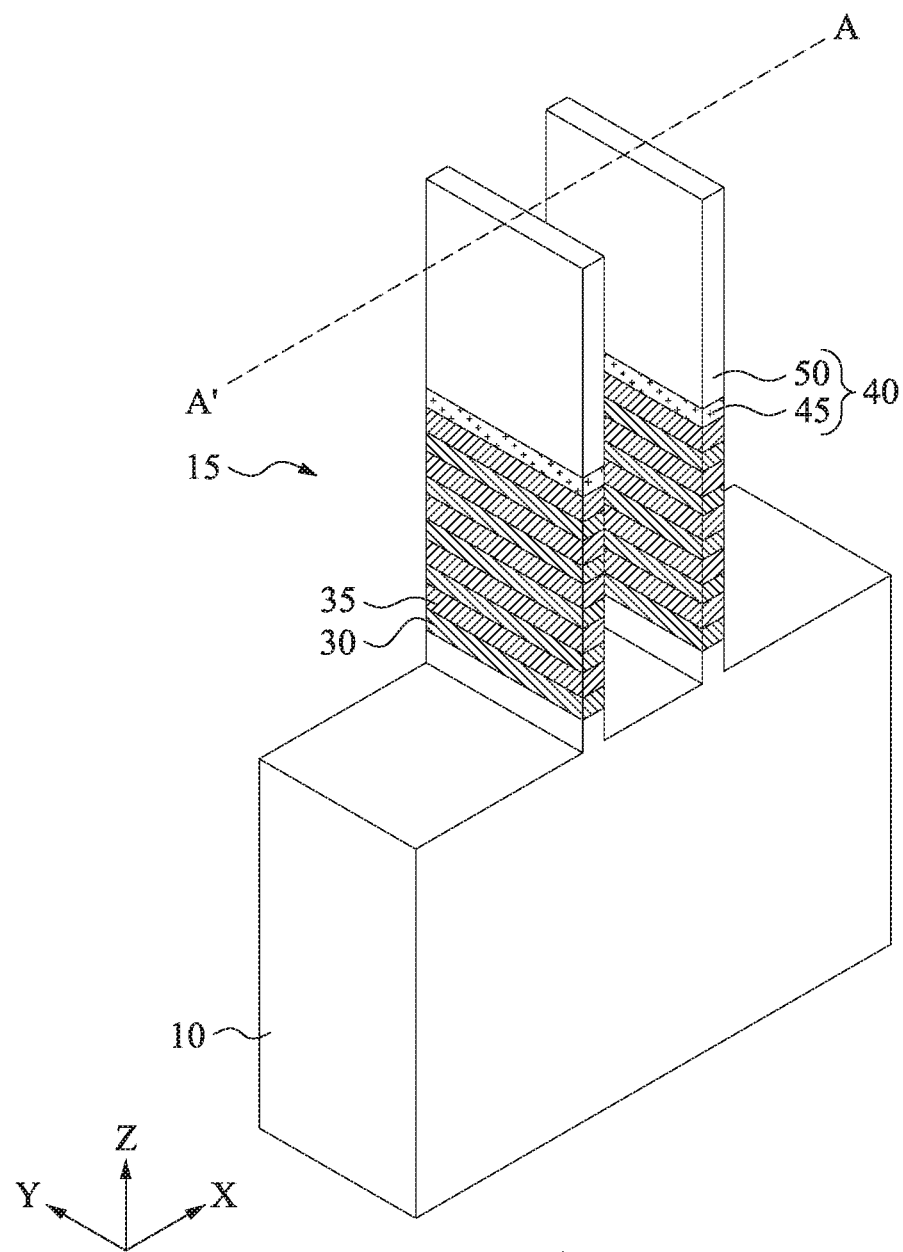
FIGS. 4A and 4B show views of one of the various stages of manufacturing a GAA FET semiconductor device according to embodiments of the present disclosure.
Figure 4B:
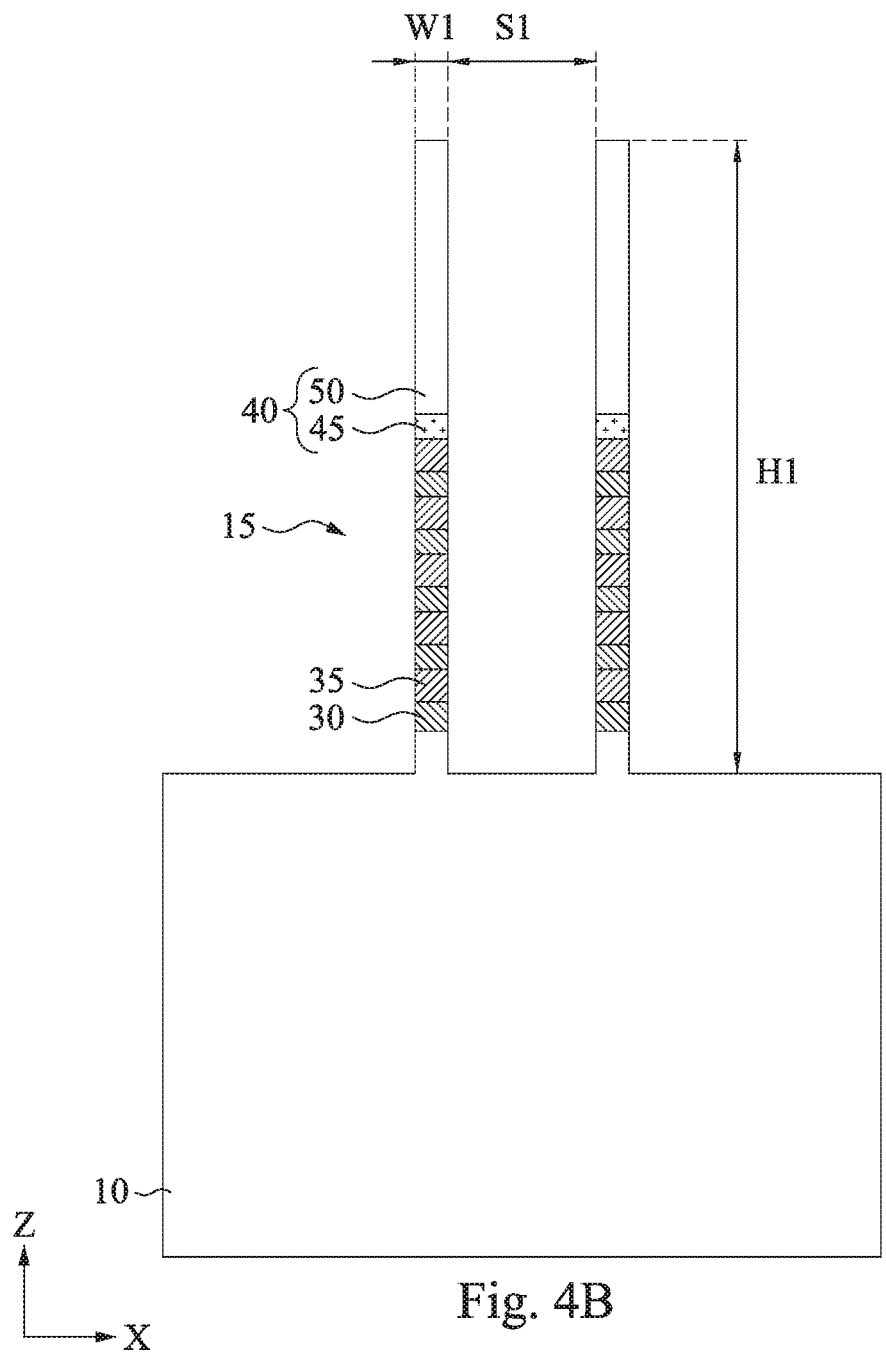

FIGS. 4A and 4B show views of one of the various stages of manufacturing a GAA FET semiconductor device according to embodiments of the present disclosure. FIG. 4A is an isometric view. FIG. 4B is a cross-sectional view taken along line A-A' of FIG. 4A.

The hard mask layer 40 is patterned into a mask pattern by using patterning operations including photolithography and etching. Next, as shown in FIGS. 4A and 4B the stacked layers of the first and second semiconductor layers 30, 35 are patterned by using the patterned mask layer, thereby the stacked layers are formed into a plurality of fin structures 15 extending in the Y direction. In some embodiments, an upper portion of the substrate 10 is also etched, as shown in FIGS. 4A and 4B. In some embodiments, the upper portion of the substrate is etched to a depth of about 2 nm to about 40 nm. In FIGS. 4A and 4B, two fin structures 15 are arranged in the X direction. But the number of the fin structures is not limited to two, and may be more than two. In some embodiments, one or more dummy fin structures are formed on both sides of the plurality of fin structures 15 to improve pattern fidelity in the patterning operations.

The width W1 of the fin structure 15 along the X direction is in a range from about 4 nm to about 40 nm in some embodiments, in a range from about 5 nm to about 30 nm in other embodiments, and in a range from about 6 nm to about 20 nm in other embodiments. The space S1 between adjacent fin structures ranges from about 20 nm to about 80 nm in some embodiments, and ranges from about 30 nm to about 60 nm in other embodiments. The height H1 along the Z direction of the fin structure 15 is in a range from about 75 nm to about 300 nm in some embodiments, and ranges from about 100 nm to about 200 nm in other embodiments.

The fin structures 15 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 15.

Figure 5A:
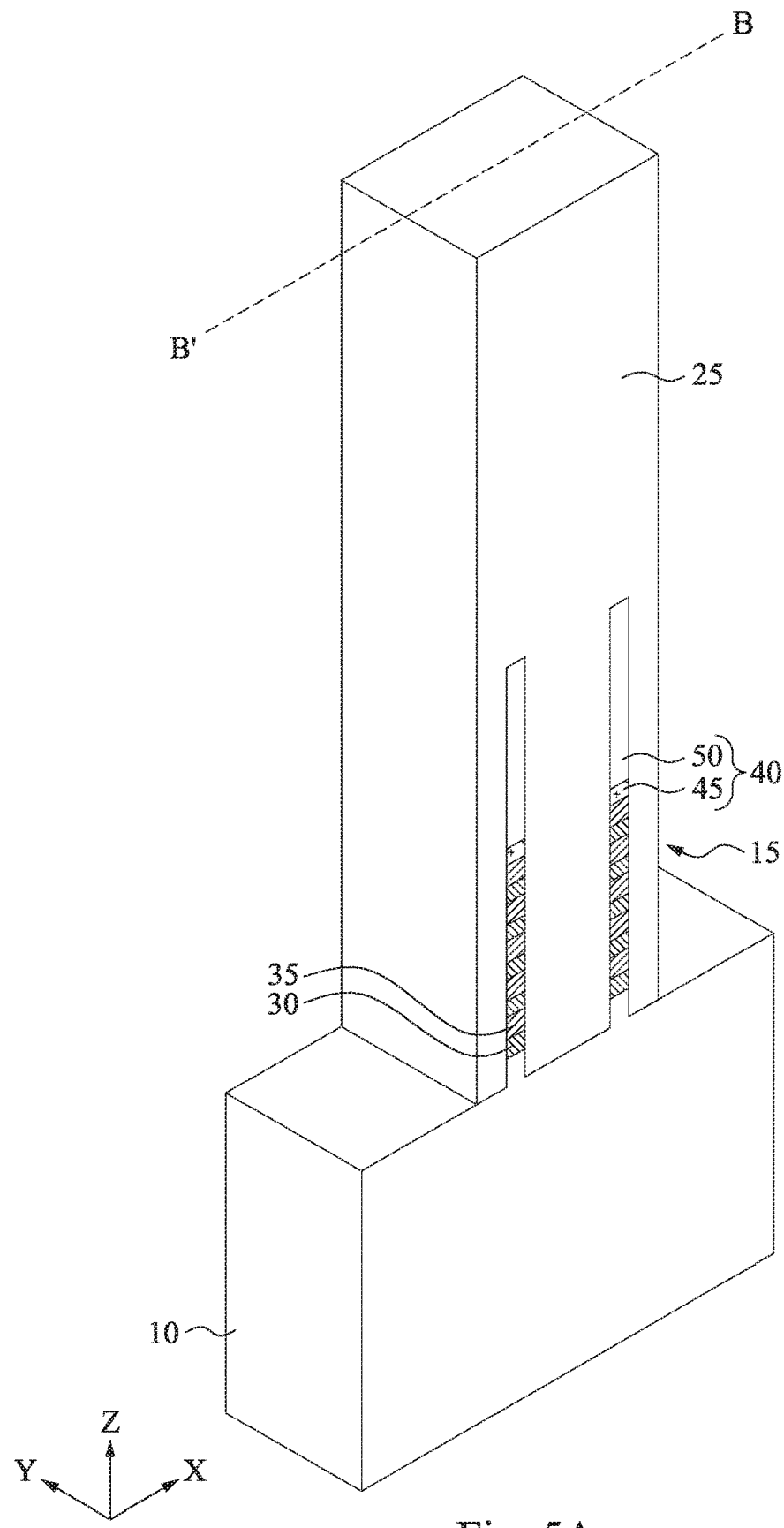
FIGS. 5A and 5B show views of one of the various stages of manufacturing a GAA FET semiconductor device according to embodiments of the present disclosure.
Figure 5B:
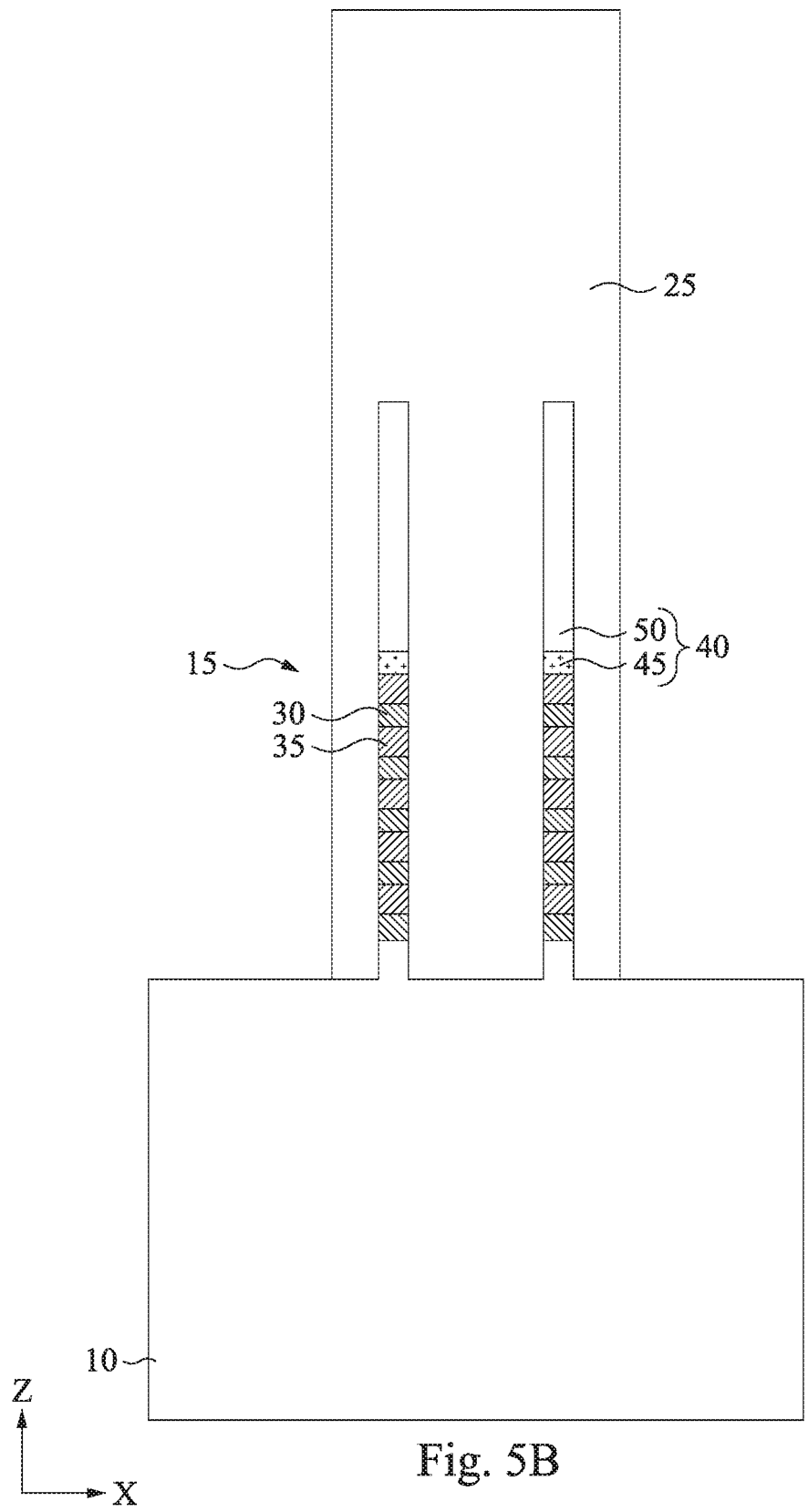

FIGS. 5A and 5B show views of one of the various stages of manufacturing a GAA FET semiconductor device according to embodiments of the present disclosure. FIG. 5A is an isometric view. FIG. 5B is a cross-sectional view taken along line B-B' of FIG. 5A.

A photoresist is subsequently formed over the fin structures 15 and the substrate 10. In some embodiments, the photoresist is a negative tone or a positive resist. The photoresist layer is patterned using suitable photolithographic techniques, including selective exposure to actinic radiation such as deep ultraviolet radiation or extreme ultraviolet radiation, and subsequent development, as shown in FIGS. 5A and 5B. The photoresist pattern 25 corresponds to a subsequently formed mesa structure in some embodiments. The photoresist pattern 25 protects the fin structures during a subsequent etching step of the substrate 10 to form a mesa structure 20. In some embodiments, a bottom anti-reflective coating (BARC) layer is formed over the substrate 10 before forming the photoresist layer.

Figure 6A:
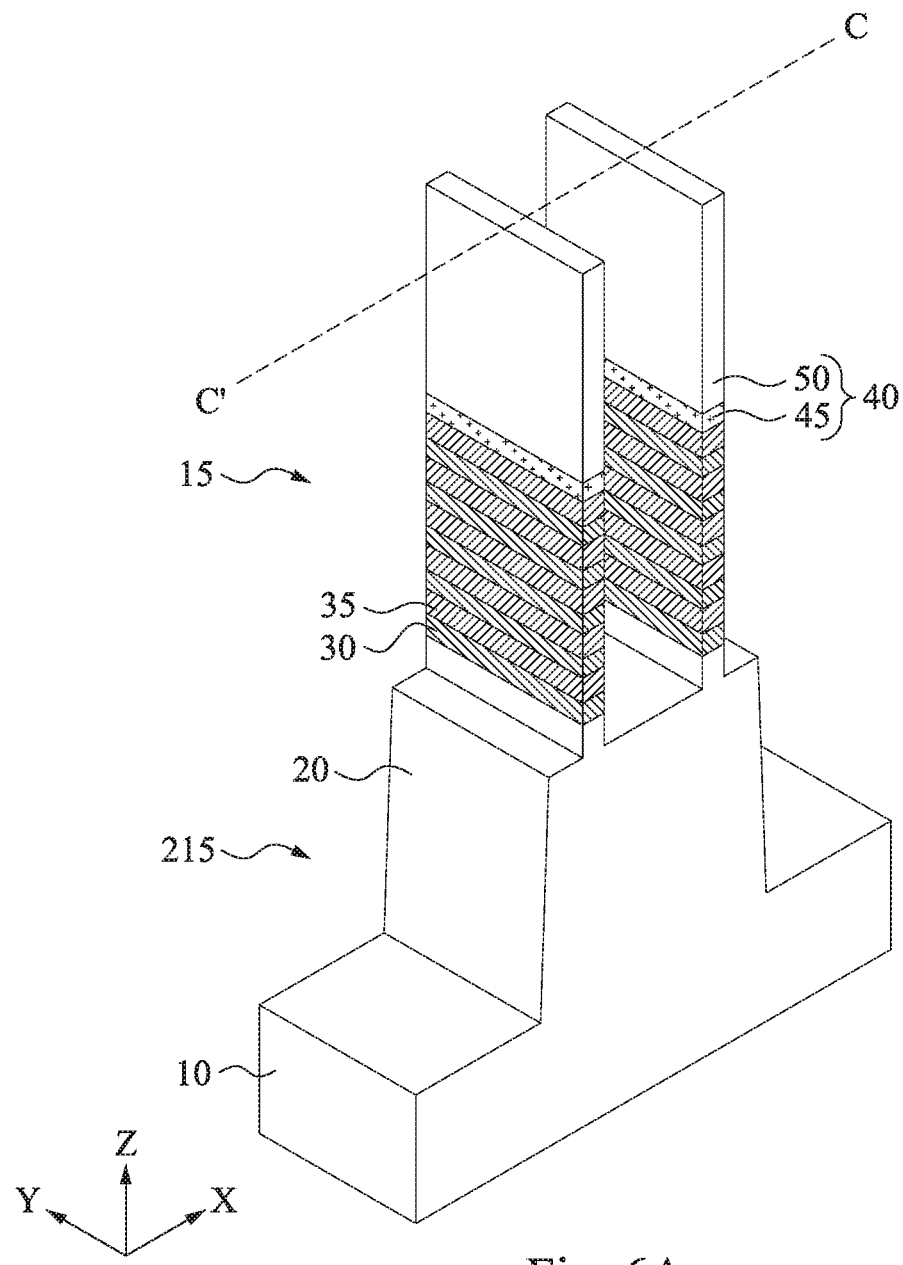
FIGS. 6A and 6B show views of one of the various stages of manufacturing a GAA FET semiconductor device according to embodiments of the present disclosure.
Figure 6B:
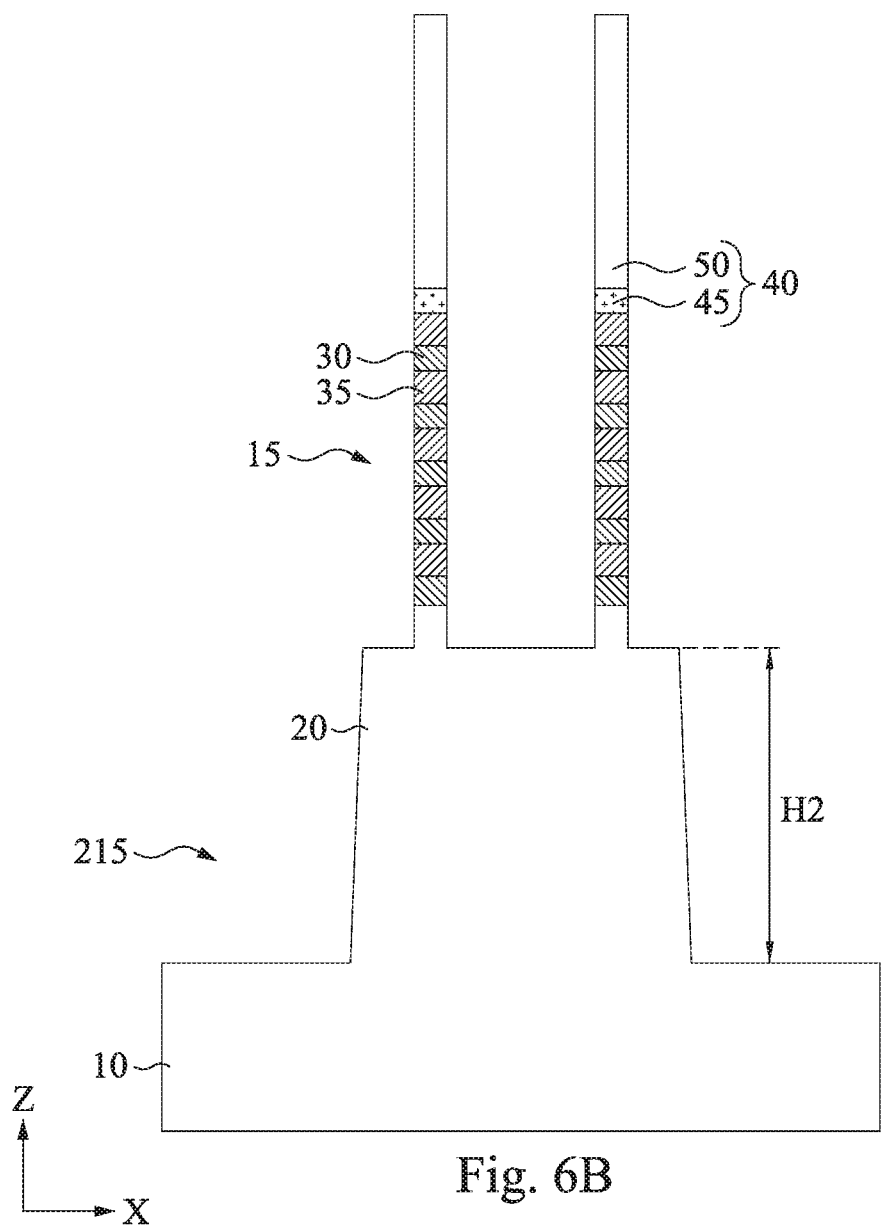

Using the patterned photoresist and/or BARC layer 25 as a mask, the substrate 10 is selectively etched using a suitable etching operation, as shown in FIGS. 6A and 6B, to form a mesa structure 20. FIG. 6A is an isometric view. FIG. 6B is a cross-sectional view taken along line C-C' of FIG. 6A. The etchant used in the etching operation is selective to the substrate 10. Thereby, the fin structures negatively impacted by the substrate etching operation. In some embodiments, the substrate is etched to form a recess 215 having a depth H2 in a range from about 20 nm to about 100 nm from the upper surface of the substrate 10. In other embodiments, the depth of the recess H2 ranges from about 40 nm to about 80 nm. As shown in FIGS. 6A and 6B, a plurality of fin structures 15 are formed on a common mesa structure 20. No recesses are formed between adjacent fin structures 15 on a common mesa structure 20 in some embodiments. Two fin structures 15 on a common mesa structure 20 are shown in FIGS. 6A and 6B but three, four, five, or more fin structures 15 are on a common mesa structure 20 in some embodiments. In some embodiments, up to ten fin structures 15 are included on a common mesa structure 20.

Figure 7A:
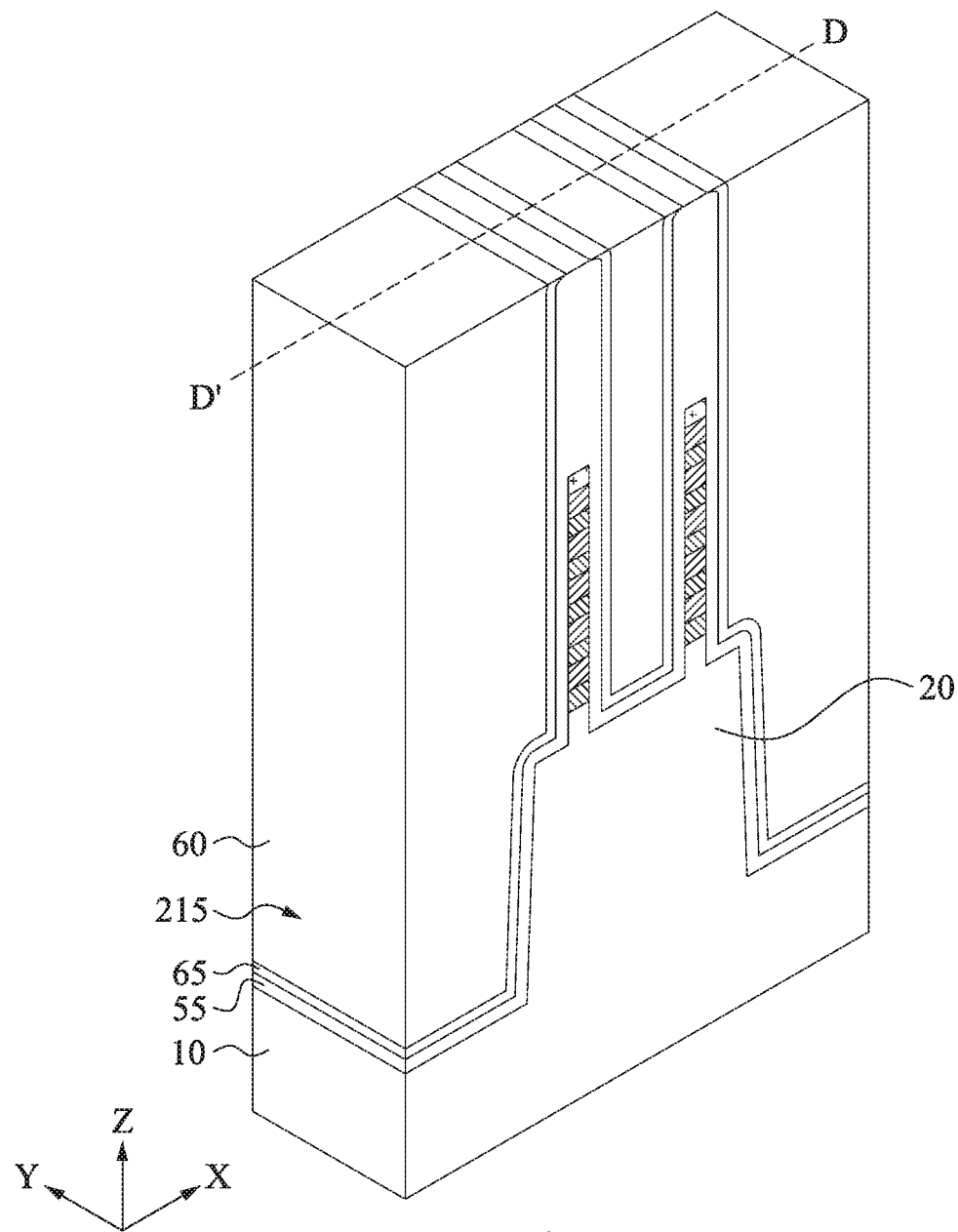
FIGS. 7A and 7B show views of one of the various stages of manufacturing a GAA FET semiconductor device according to embodiments of the present disclosure.
Figure 7B:
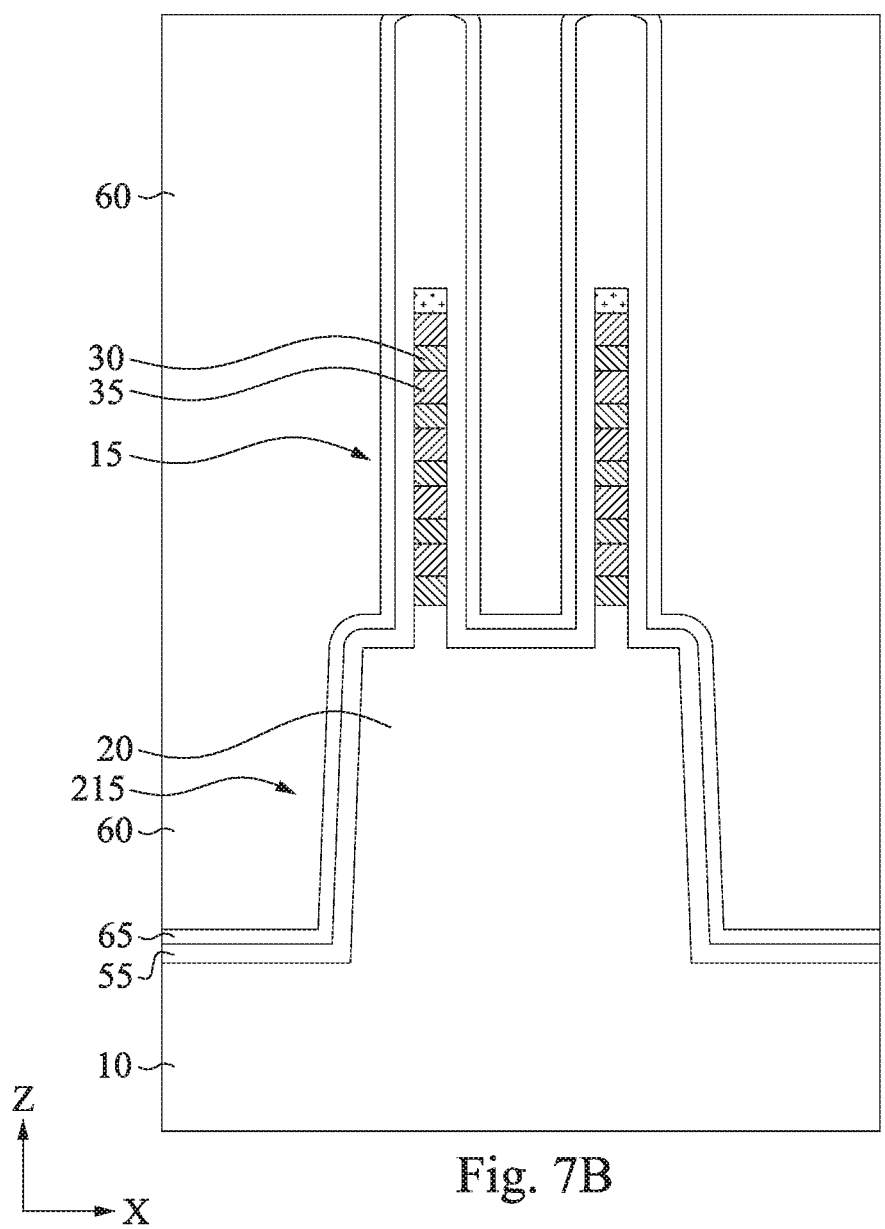

The patterned photoresist and/or BARC layer is subsequently removed. The patterned photoresist and/or BARC layer 25 is removed by a suitable photoresist stripping operation. In some embodiments, a suitable solvent is used to remove the photoresist and/or BARC layer 25. In some embodiments, the photoresist and/or BARC layer 25 is removed by oxygen plasma ashing operation. Then, an insulating liner layer 55 is subsequently formed over the hard mask layer 40, fin structures 15, and substrate 10, as shown in FIGS. 7A and 7B. FIG. 7A is an isometric view. FIG. 7B is a cross-sectional view taken along line D-D' of FIG. 7A. The insulating liner layer 55 conformally covers the hard mask layer 40, fin structures 15, and substrate 10 in some embodiments. In an embodiment, the insulating liner layer 55 is made of a nitride, such as silicon nitride, a silicon nitride-based material (e.g., SiON, SiCN, or SiOCN). The insulating liner layer 55 may be formed by CVD, LPCVD, PECVD, PVD, ALD, or other suitable process. The thickness of the insulating liner layer 55 ranges from about 1 nm to about 20 nm in some embodiments. In some embodiments, the thickness of the insulating liner layer ranges from about 3 nm to about 15 nm. In some embodiments, the insulating liner layer 55 includes two or more layers of different materials.

In some embodiments, an additional liner layer 65, such as a silicon oxide liner layer is formed over the nitride insulating liner layer 55. The additional liner layer 65 may be formed by CVD, LPCVD, PECVD, PVD, ALD, or other suitable process. The thickness of the additional liner layer 65 ranges from about 1 nm to about 20 nm in some embodiments. In some embodiments, the thickness of the additional liner layer 65 ranges from about 3 nm to about 15 nm.

Then, a first insulating material layer 60 including one or more layers of insulating material is formed over the substrate 10 so that the fin structures are fully embedded in the insulating layer. The insulating material for the first insulating material layer 60 may include silicon oxide, silicon nitride, silicon oxynitride (SiON), SiOCN, SiCN, fluorine-doped silicate glass (FSG), or a low-K dielectric material, formed by LPCVD, PECVD, or flowable CVD. An anneal operation may be performed after the formation of the insulating material layer 60. Then, a planarization operation, such as a chemical mechanical polishing (CMP) method and/or an etch-back method, is performed such that the upper surface of the insulating liner layer 55 is exposed from the first insulating material layer 60, as shown in FIGS. 7A and 7B.

Figure 8A:
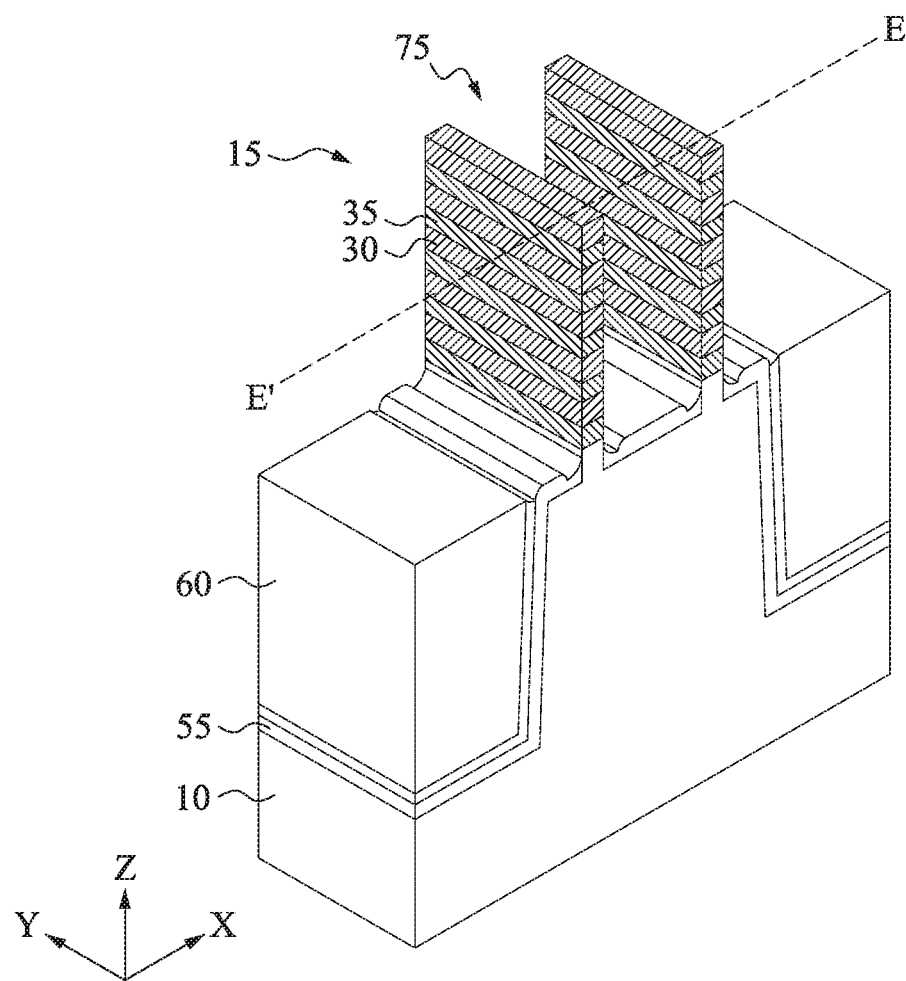
FIGS. 8A and 8B show views of one of the various stages of manufacturing a GAA FET semiconductor device according to embodiments of the present disclosure.
Figure 8B:
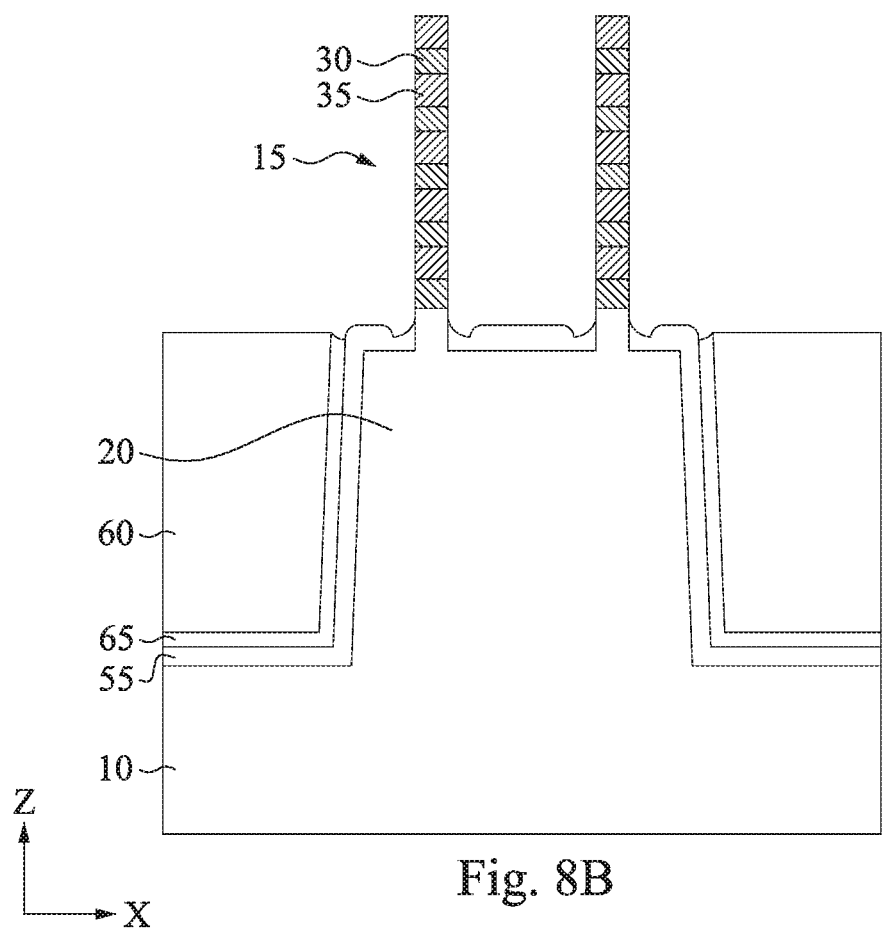

Then, as shown in FIGS. 8A and 8B, an upper portion of the first insulating material layer 60 is removed exposing the fin structures 15 and the insulating liner layer 55 over the mesa 20. FIG. 8A is an isometric view. FIG. 8B is a cross-sectional view taken along line E-E' of FIG. 8A. Suitable etching operations are used to remove the portions of the insulating material 60 from between the fin structures 15. The first insulating material layer 60 filling the recesses 215 is also called an isolation insulating layer or a shallow trench isolation (STI) layer. There are no shallow trench isolation layers 60 formed between fin structures 15 on a common mesa structure 20 in some embodiments.

Figure 9A:
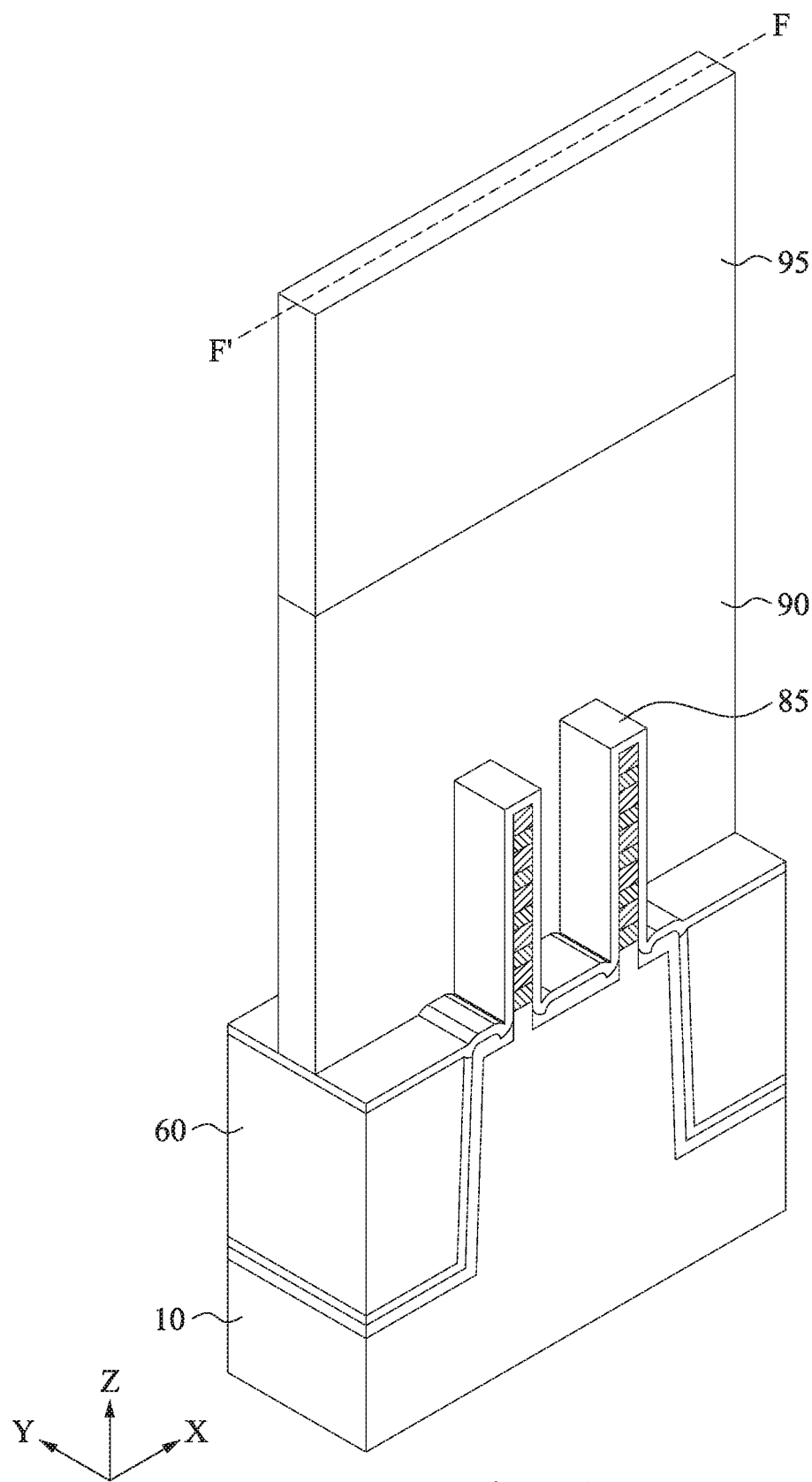
FIGS. 9A and 9B show views of one of the various stages of manufacturing a GAA FET semiconductor device according to embodiments of the present disclosure.
Figure 9B:
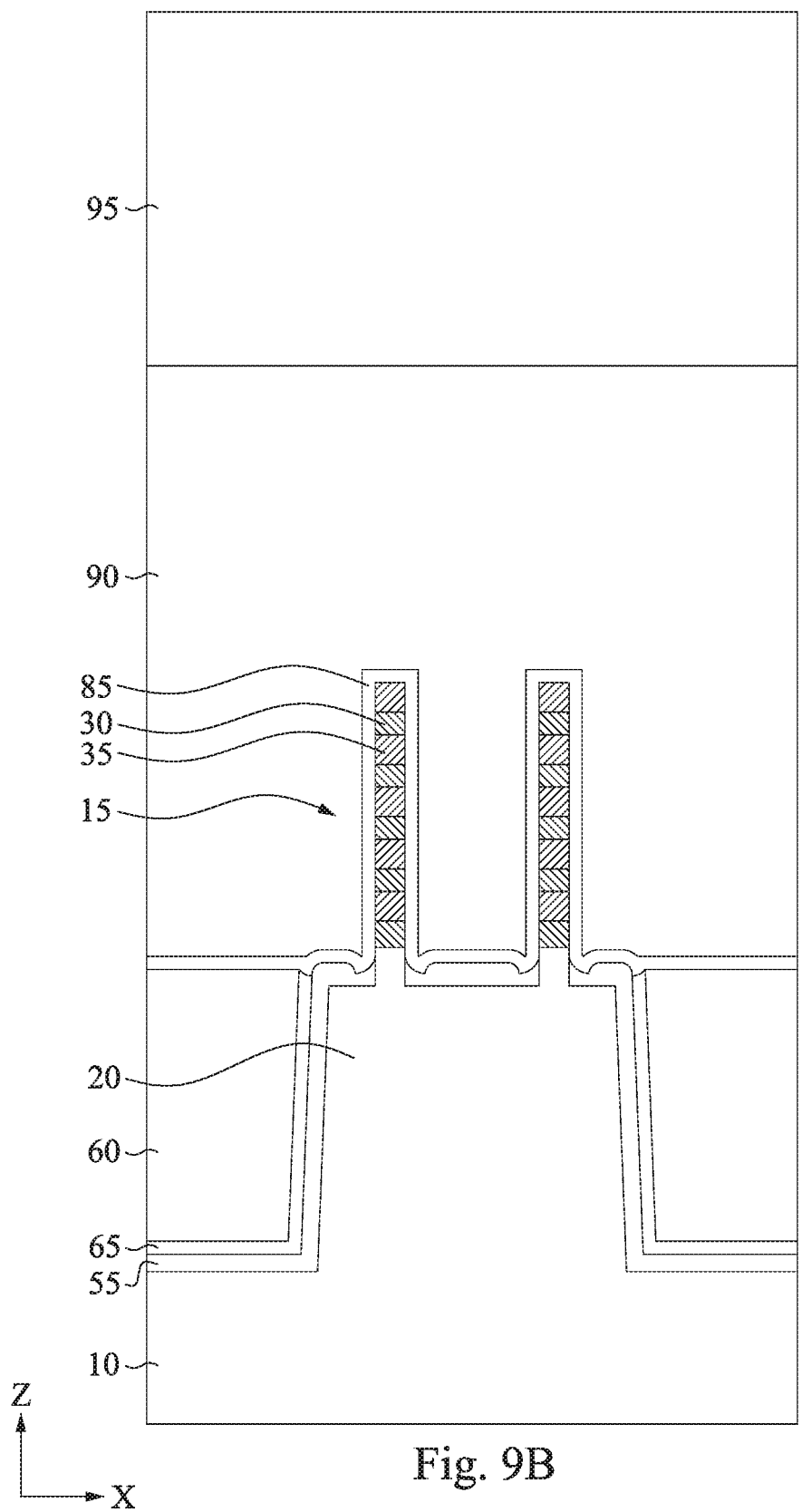

As shown in FIGS. 9A and 9B, a sacrificial gate dielectric layer 85 is formed over the fin structures 15. FIG. 9A is an isometric view. FIG. 9B is a cross-sectional view taken along line F-F' of FIG. 9A. A sacrificial conductive layer 90 is formed over the sacrificial gate dielectric layer 85. In some embodiments, the sacrificial conductive layer 90 is a sacrificial gate electrode layer, which will be subsequently removed.

The sacrificial gate dielectric layer 85 includes one or more layers of insulating material, such as a silicon oxide-based material. In one embodiment, silicon oxide formed by CVD is used. The thickness of the sacrificial gate dielectric layer 85 is in a range from about 1 nm to about 5 nm in some embodiments.

The sacrificial gate dielectric layer 85 and sacrificial gate electrode layer 90 form a sacrificial gate structure. The sacrificial gate structure is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD; PVD; ALD, or other suitable process. Subsequently, an upper insulating layer 95 is formed over the sacrificial gate electrode layer 90. The upper insulating layer 95 may include one or more layers and may be formed by CVD, PVD, ALD, or other suitable process.

Next, a patterning operation is performed on the upper insulating layer 95 using suitable photolithographic and etching operations. The pattern in the upper insulating layer 95 is subsequently transferred to the sacrificial gate electrode layer 90 (and the sacrificial gate dielectric layer 85) using suitable etching operations. The etching operations expose the source/drain regions of the semiconductor device. The etching operations removes the sacrificial gate electrode layer 90 in the exposed areas, thereby leaving a sacrificial gate structure overlying the channel region of the semiconductor device. The sacrificial gate structure includes the sacrificial gate dielectric layer 85 and the remaining sacrificial gate electrode layer 90 (e.g., polysilicon).

Figure 10A:
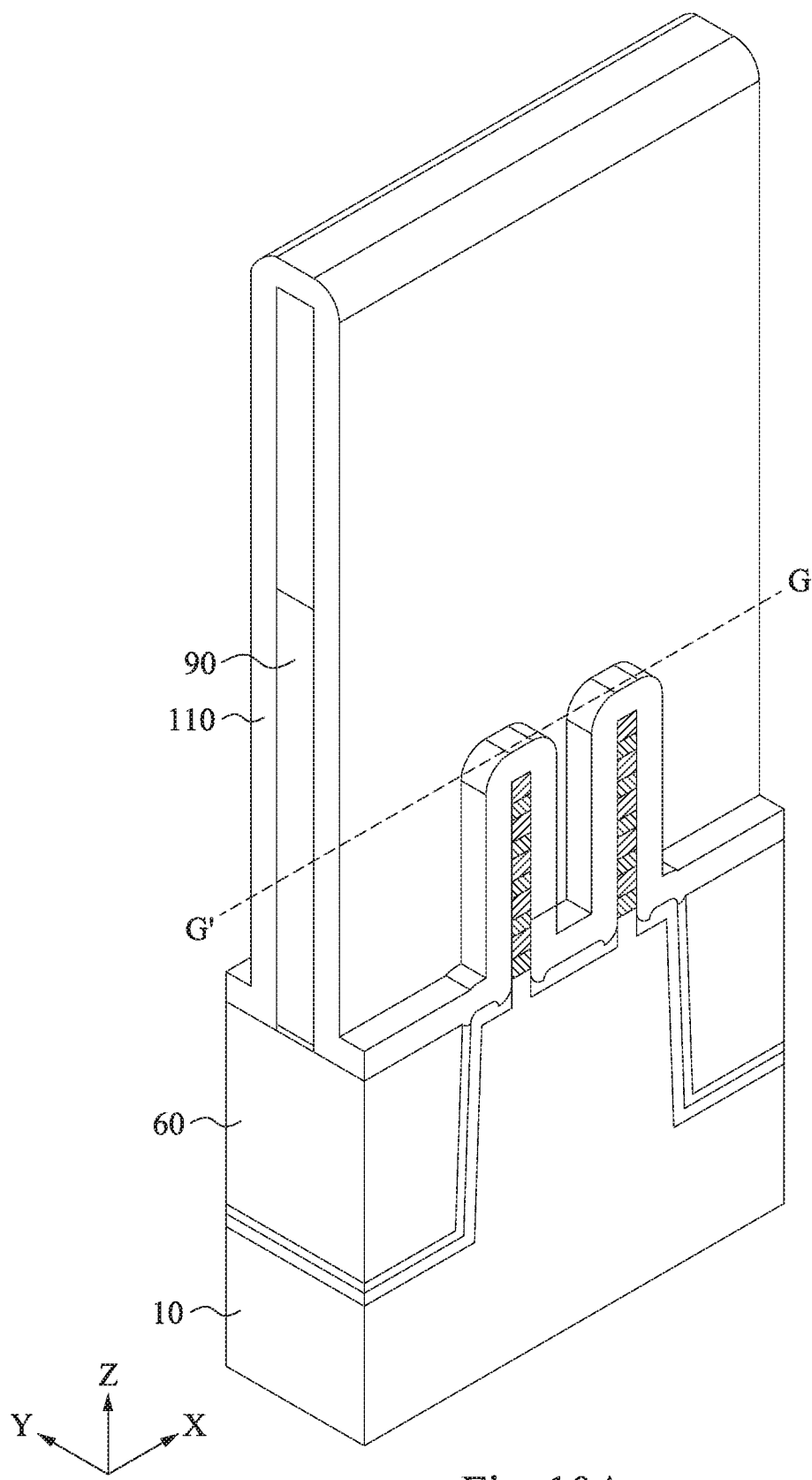
FIGS. 10A and 10B show views of one of the various stages of manufacturing a GAA FET semiconductor device according to embodiments of the present disclosure.
Figure 10B:
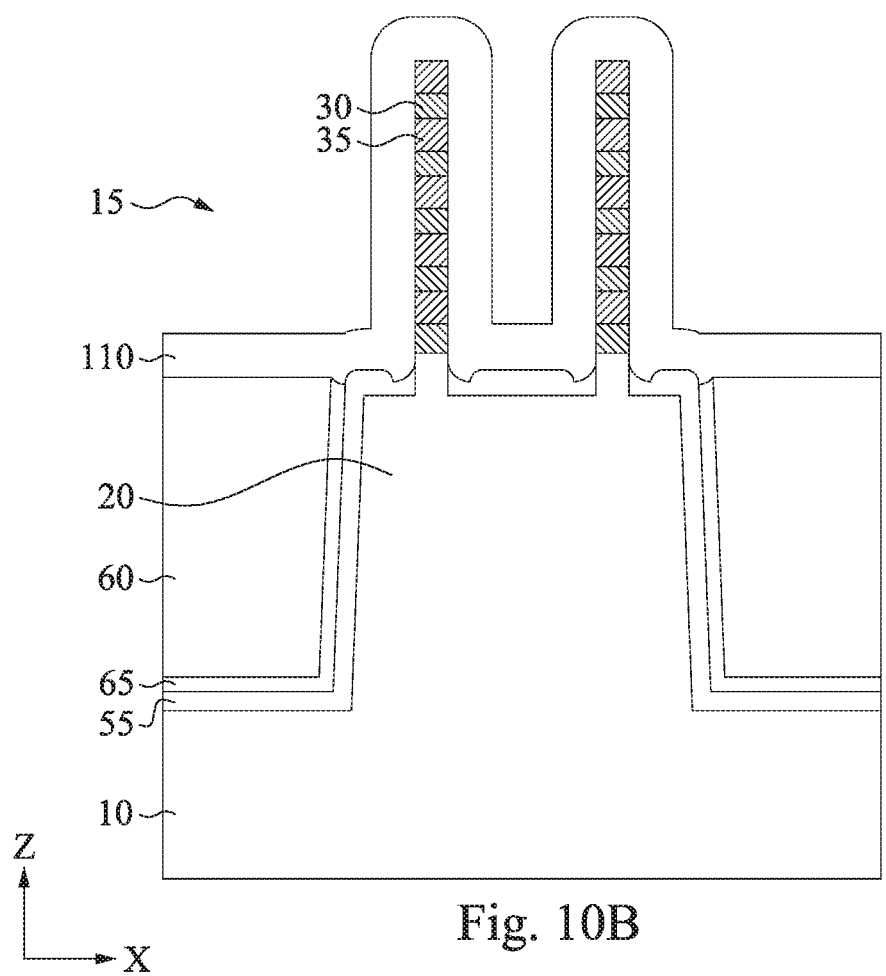

After the sacrificial gate structure is formed, the sacrificial gate dielectric layer 85 is removed from the source/drain regions by suitable photolithographic and etching operations to expose the fin structures 15 in the source/drain regions. Then, one or more sidewall spacer layers 110 is formed over the exposed fin structures 15 and the sacrificial gate structures 85, 90, as shown in FIGS. 10A and 10B. FIG. 10A is an isometric view. FIG. 10B is a cross-sectional view taken along line G-G' of FIG. 10A. The sidewall spacer layer 110 is deposited in a conformal manner so it is formed to have substantially equal thicknesses on vertical surfaces, such as the sidewalls, horizontal surfaces, and the top of the sacrificial gate structure, respectively. In some embodiments, the sidewall spacer layer 110 has a thickness in a range from about 2 nm to about 20 nm, in other embodiments, the sidewall spacer layer has a thickness in a range from about 5 nm to about 15 nm.

In some embodiments, the sidewall spacer layer 110 includes a first sidewall spacer layer and a second sidewall spacer layer. The first sidewall spacer layer may include an oxide, such as silicon oxide or any other suitable dielectric material, and the second sidewall spacer layer may include one or more of $Si_3N_4$, SiON, and SiCN or any other suitable dielectric material. The first sidewall spacer layer and the second sidewall spacer layer are made of different materials in some embodiments so they can be selectively etched. The first sidewall spacer layer and the second sidewall spacer layer can be formed by ALD or CVD, or any other suitable method.

Figure 11A:
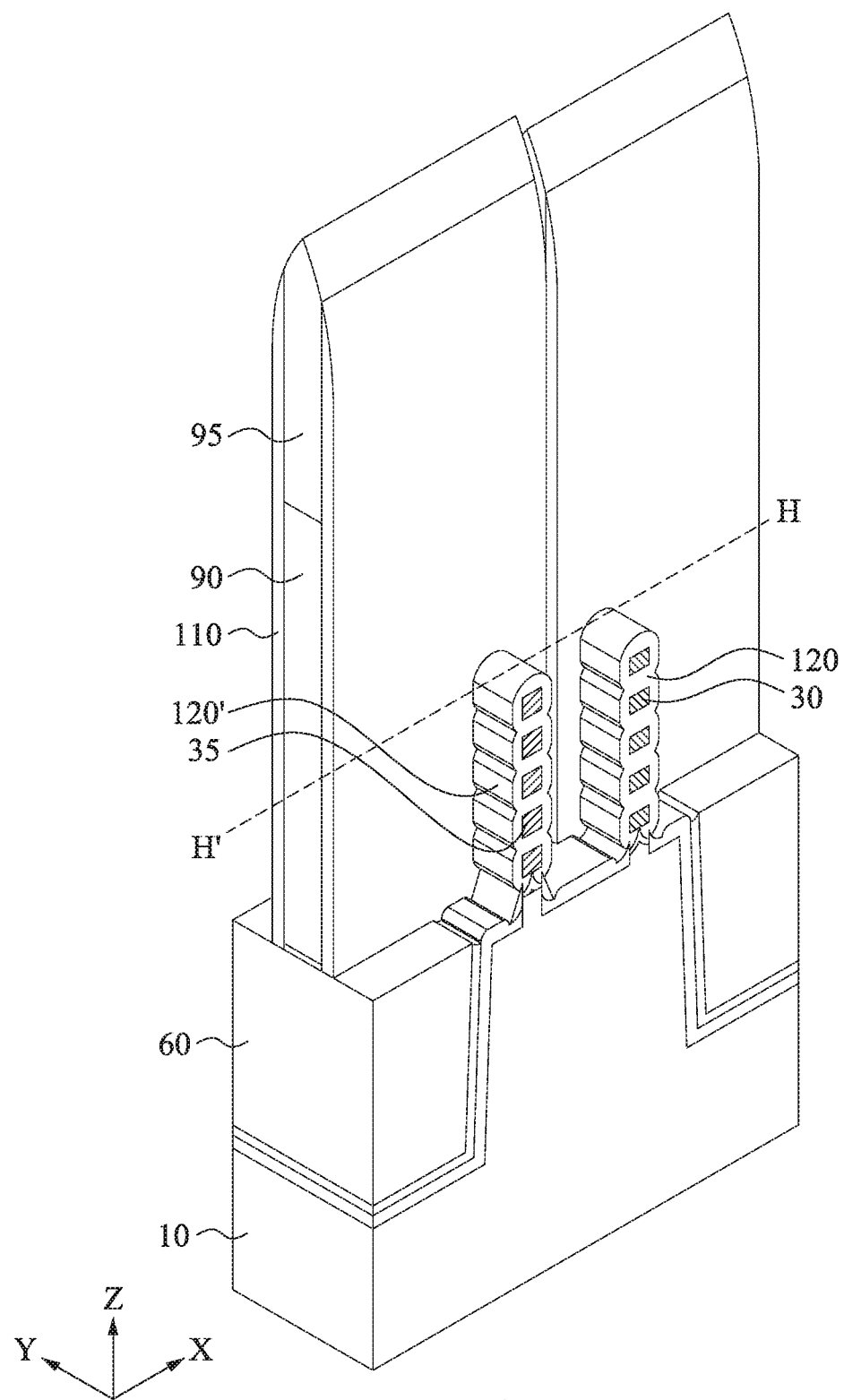
FIGS. 11A and 11B show views of one of the various stages of manufacturing a GAA FET semiconductor device according to embodiments of the present disclosure.
Figure 11B:
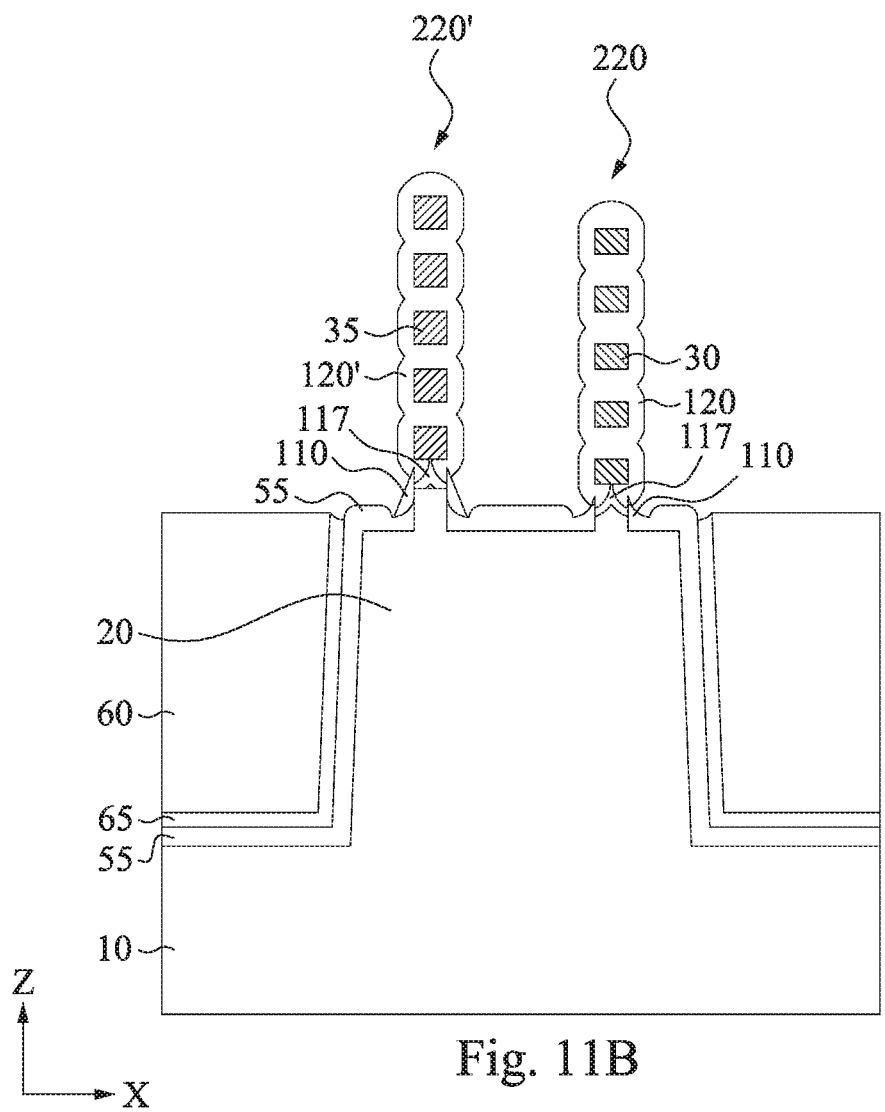

Then, as shown in FIGS. 11A and 11B, the sidewall spacer layer 110 is subjected to anisotropic etching to remove the sidewall spacer layer formed over the upper insulating layer 95 and the source/drain regions of the fin structures 15, and the first isolation material layer 60. FIG. 11A is an isometric view. FIG. 11B is a cross-sectional view taken along line H-H' of FIG. 11A.

Next, the first semiconductor layers 30 or second semiconductor layers 35 in the source/drain regions of the fin structures 15 are removed using suitable etching operations to form stacked nanowire structures 220, 220'. The removal of the first semiconductor layers 30 or second semiconductor layers 35 results in the formation of first nanowires 30 and second nanowires 35 from the remaining first semiconductor layers 30 or second semiconductor layers 35, respectively. The first nanowires (or first semiconductor layers 30) or the second nanowires (or second semiconductor layers) 35 are arranged substantially parallel to each other along the Z direction.

The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first semiconductor layers 30. In some embodiments, a portion of the sidewall spacer layer 110 remains below the nanowire 30, 35 closest to the substrate along the Z direction.

The first semiconductor layer removal and second semiconductor layer removal are performed in separate operations in some embodiments. In some embodiments, a first fin structure 15 is masked and the first semiconductor layers 30 are removed from a second unmasked fin structure 15 to form a second nanowire structure 220'. Then the first fin structure 15 is unmasked, and the second nanowire structure 220' is masked. The second semiconductor layers 35 are subsequently removed from the unmasked first fin structure 15 forming a first nanowire structure 220. Then the second nanowire structure 220' is unmasked. Thus, nanowire structures 220, 220' having nanowires of different materials are formed, and different devices, such as nFETs and pFETs can be formed on the same mesa 20.

After removing the first semiconductor layers 30 in the source/drain regions, an inner spacer layer 115 is formed between along exposed sides sacrificial gate dielectric layer between the first semiconductor layers 30 and the second semiconductor layers 35 and a nanowire stack insulating layer 117 is formed between the substrate 10 and the first semiconductor layer 30 and second semiconductor layer 35 to electrically isolate the source/drains from the channel region and from the substrate 10. In some embodiments, the nanowire stack insulating layer 117 substantially fills the space between the nanowire 30, 35 closest to the substrate and the substrate 10. In some embodiments, the inner spacer layer 115 substantially fills the space between the nanowires 30, 35 below the sidewall spacers 110 (see FIGS. 16C and 16D). In some embodiments, the nanowire stack insulating layer 117 and inner spacer layer 115 are formed of the same material, including an oxide, such as silicon oxide or a nitride, such as $Si_3N_4$, SiON, and SiCN, or any other suitable dielectric material, including low-k materials. In some embodiments, the low-k material is selected from the group consisting of porous silicon dioxide, carbon doped silicon dioxides, and fluorine doped silicon dioxide. The inner spacer layer 115 and nanowire stack insulating layer can be formed by ALD or CVD, or any other suitable process.

In some embodiments, the nanowire stack insulating layer 117 is formed by deposition and etching operations. In some embodiments, nanowire stack insulating layer metal is formed around all the exposed nanowires or in the space between the first nanowires 30 and the second nanowires and the space between the first nanowires 30 and the second nanowires 35, and then the nanowire stack insulating material is removed from between the first nanowires 30 and the second nanowires 35 and from around all the nanowires except between the nanowire 30, 35 closest to the substrate and the substrate 10.

Subsequently, a source/drain epitaxial layer 120, 120' is formed, as shown in FIGS. 11A and 11B, thereby forming source/drains. The source/drain epitaxial layer 120, 120' includes one or more layers of Si, SiP, SiC and SiCP for an n-channel FET or Si, SiGe, Ge for a p-channel FET. For the P-channel FET, boron (B) may also be contained in the source/drain. The source/drain epitaxial layers 120 are formed by an epitaxial growth method using CVD, ALD or molecular beam epitaxy (MBE). In some embodiments, the source/drains are disposed over the nanowire structures on opposing sides of the gate structures. The source/drain epitaxial layers 120, 120' grow on the first semiconductor layer 30 and the second semiconductor 35. In some embodiments, the source/drain epitaxial layers 120, 120' wrap around exposed portions of the first and second semiconductor layers (nanowires) 30, 35. In some embodiments, the grown source/drain epitaxial layers 120, 120' on adjacent fin structures merge with each other. In some embodiments, the source/drain epitaxial layer 120 has a diamond shape, a hexagonal shape, other polygonal shapes, or a semi-circular shape in cross section. In some embodiments, one source/drain layer 120 is for a pFET and the other source/drain layer 120' is for an nFET, or vice-versa.

Figure 12A:
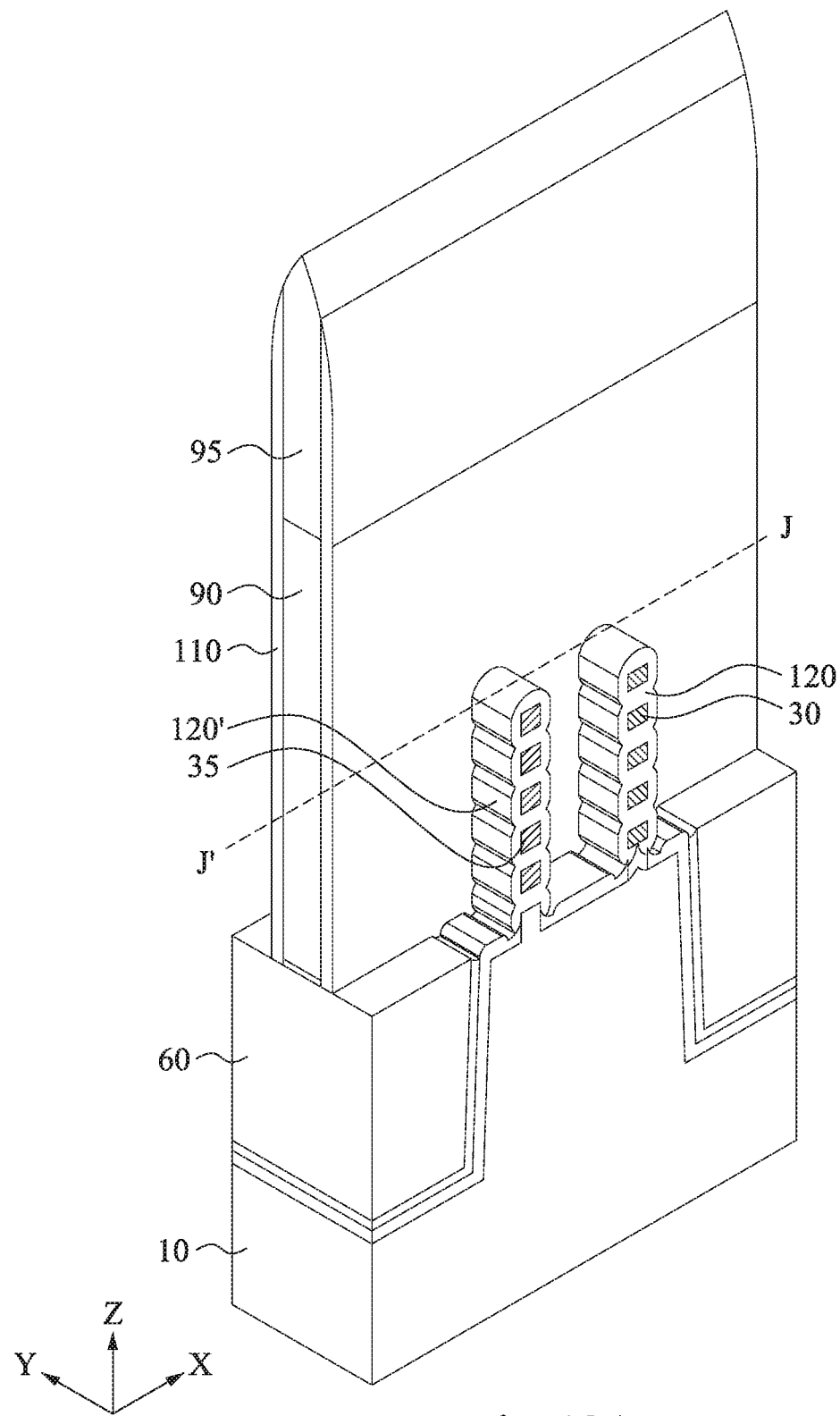
FIGS. 12A and 12B show views of one of the various stages of manufacturing a GAA FET semiconductor device according to embodiments of the present disclosure.
Figure 12B:
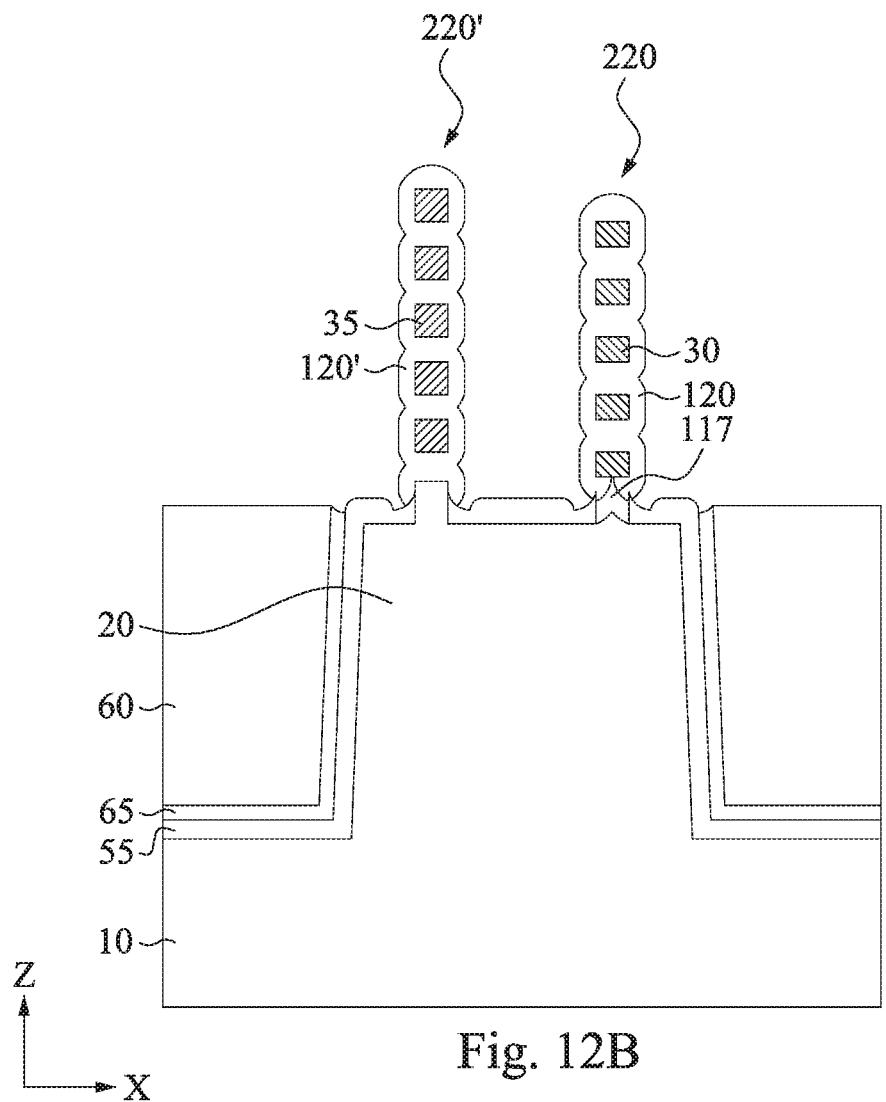

In some embodiments, the nanowire stack insulating layer 117 is only formed between the substrate 10 and the first semiconductor layer 30 closest to the substrate 10 and not between the substrate 10 and the second semiconductor layer 35 closest to the substrate, as shown in FIGS. 12A and 12B, thereby isolating the stacked nanowire structure 220 including the first nanowires 30 from the substrate 10. FIG. 12A is an isometric view. FIG. 12B is a cross-sectional view taken along line J-J' of FIG. 12A.

Figure 13A:
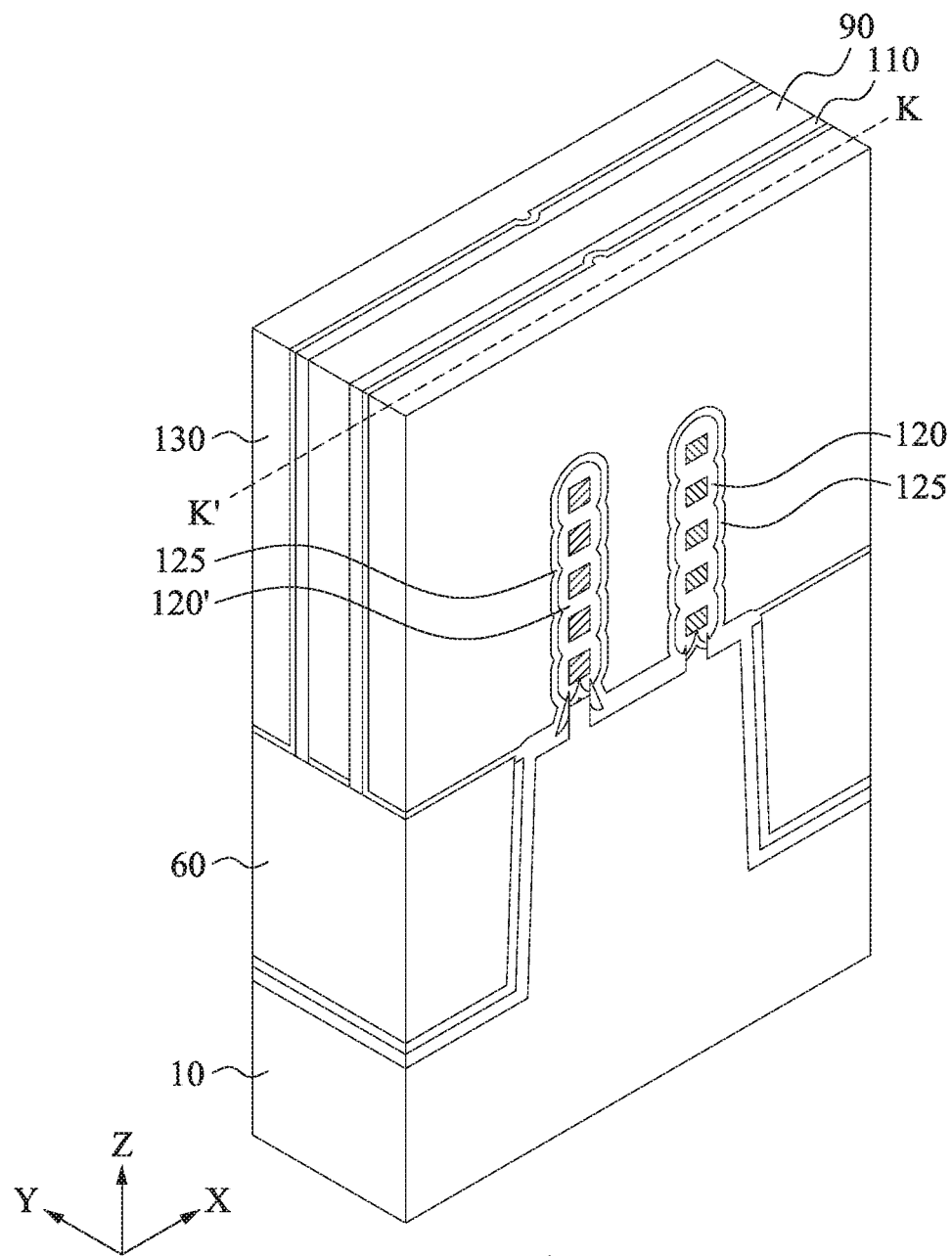
FIGS. 13A and 13B show views of one of the various stages of manufacturing a GAA FET semiconductor device according to embodiments of the present disclosure.
Figure 13B:
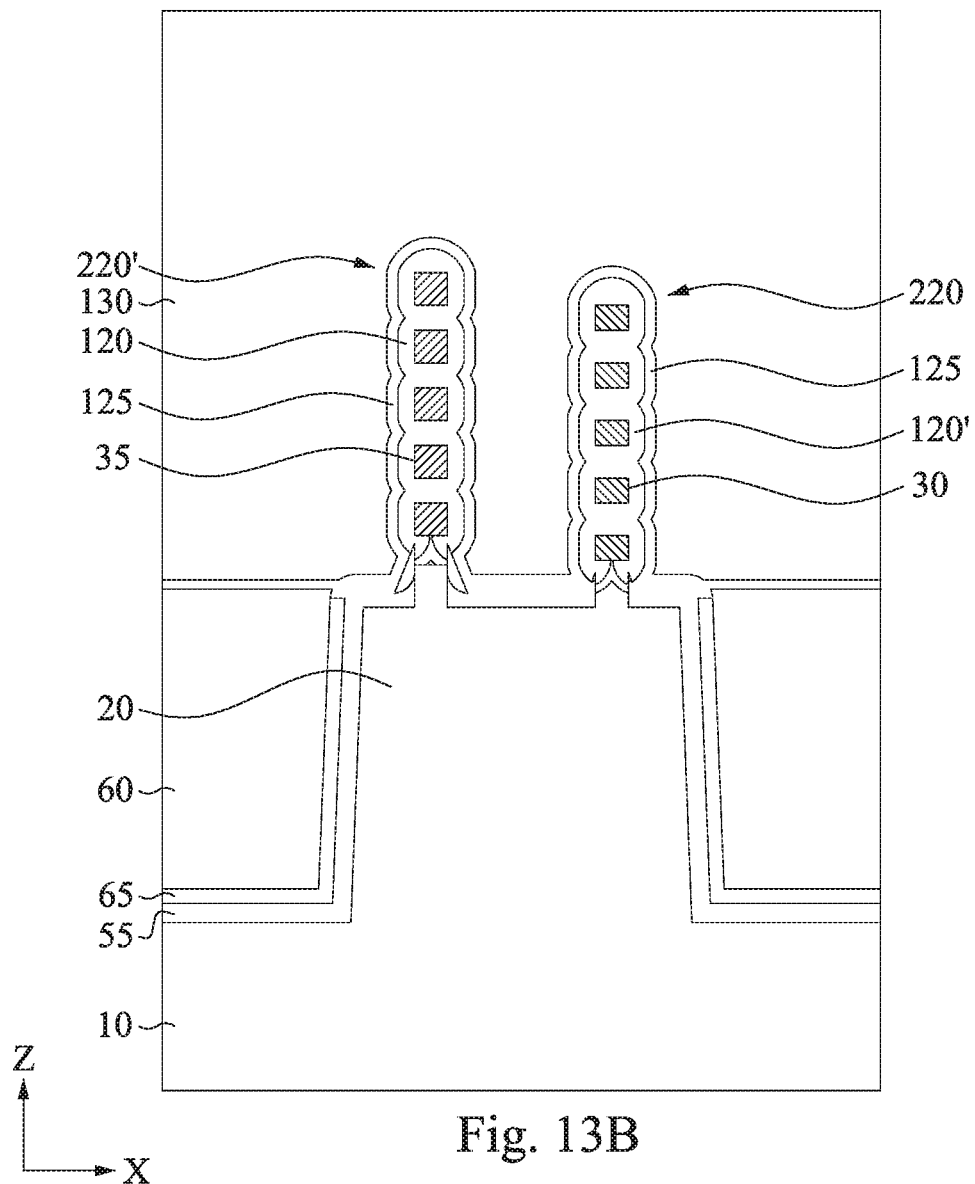

Subsequently, a contact etch stop layer (CESL) 125 is formed on the source/drain layers 120, 120', the shallow trench isolation layer 60, and sidewalls of the sidewall spacer layers 110, and then an interlayer dielectric (ILD) layer 130 is formed over the source/drain regions, as shown in FIGS. 13A and 13B. FIG. 13A is an isometric view. FIG. 13B is a cross-sectional view taken along line K-K' of FIG. 12A.

The CESL 125 overlying the source/drain regions has a thickness of about 1 nm to about 15 nm in some embodiments. The CESL 125 may include $Si_3N_4$, SiON, SiCN or any other suitable material, and may be formed by CVD, PVD, or ALD. The materials for the ILD layer 130 include compounds comprising Si, O, C, and/or H, such as silicon oxide, SiCOH and SiOC. Organic materials, such as polymers, may be used for the ILD layer 130. After the ILD layer 130 is formed, a planarization operation, such as chemical-mechanical polishing (CMP), is performed, so that the top portion of the sacrificial gate electrode layer 90 is exposed. The CMP also removes a portion of the sidewall spacer layer 110, and the upper insulating layer 95 covering the upper surface of the sacrificial gate electrode layer 90.

Figure 14A:
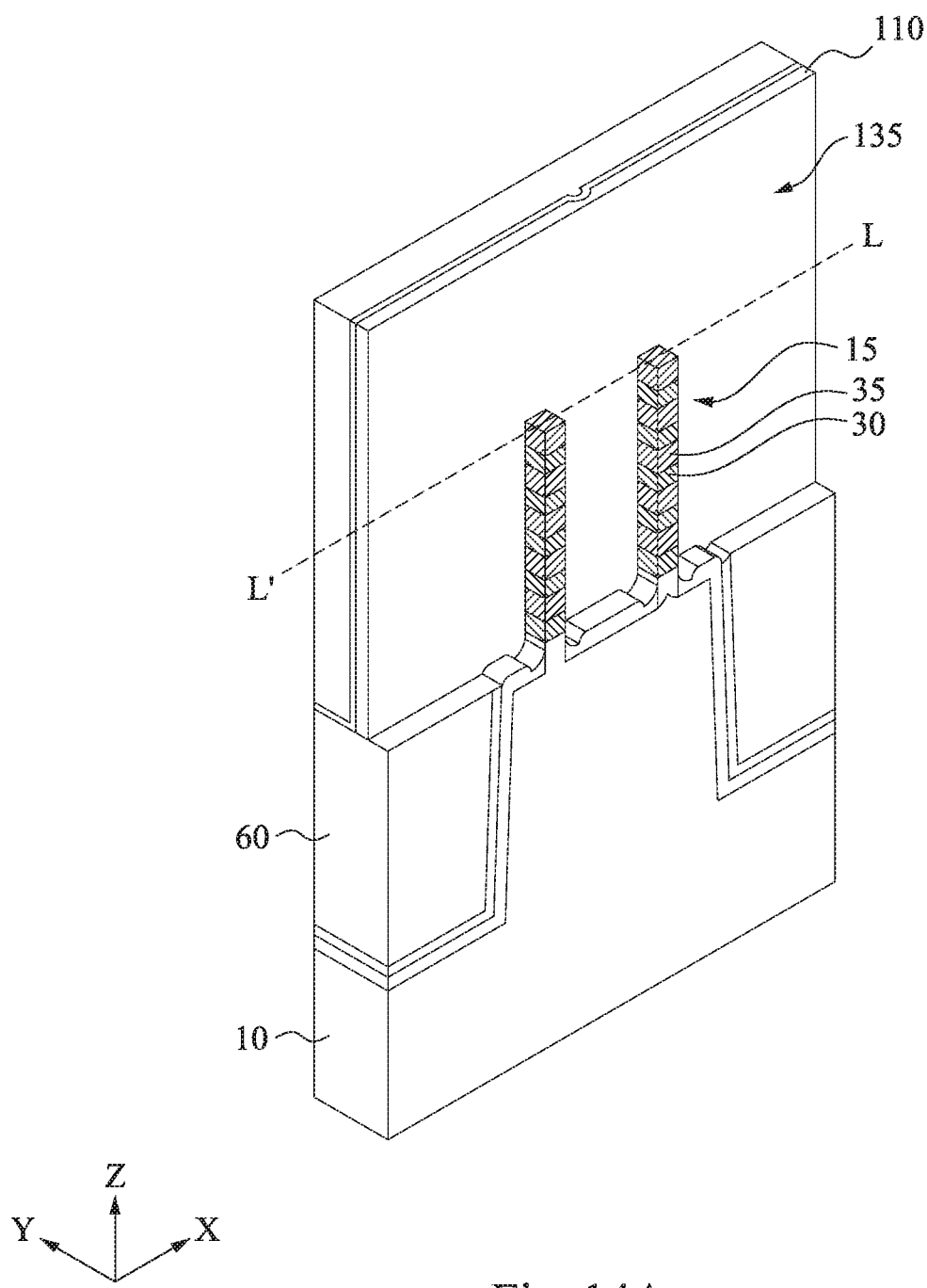
FIGS. 14A and 14B show views of one of the various stages of manufacturing a GAA FET semiconductor device according to embodiments of the present disclosure.
Figure 14B:
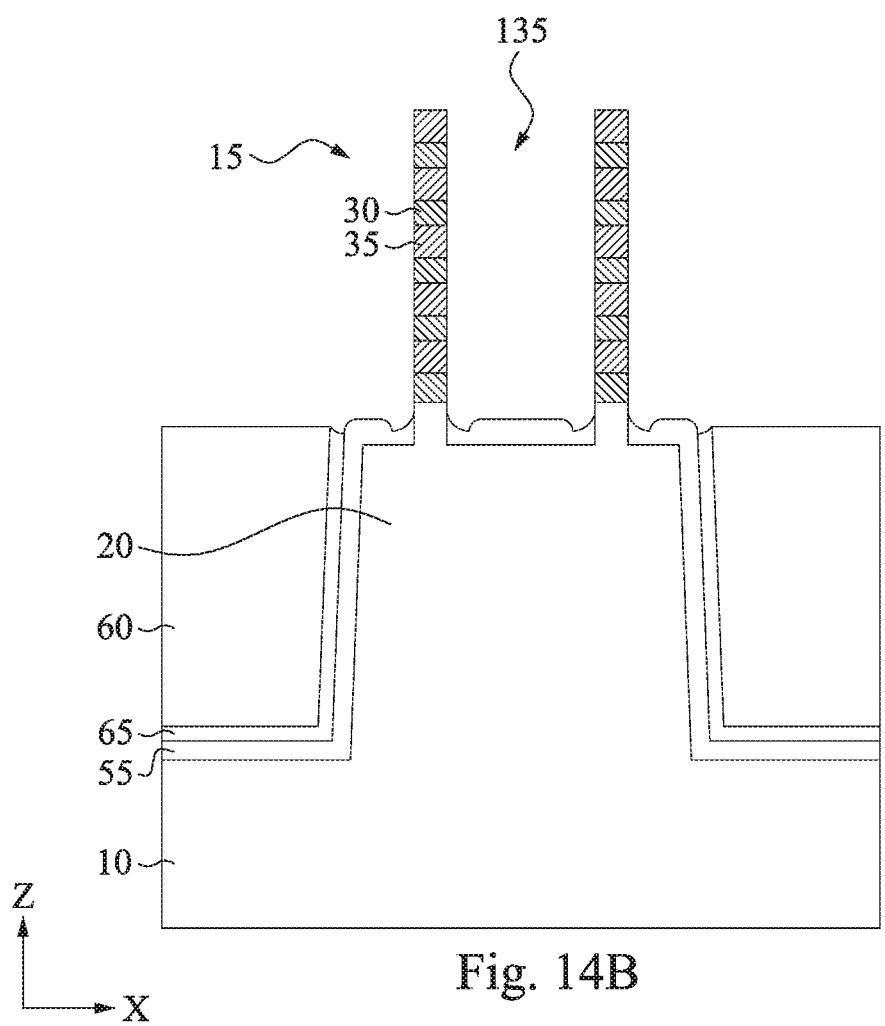

Then, the sacrificial gate structure 85, 90 is removed, thereby forming a gate space 135, in which the channel regions of the fin structures 15 are exposed, as shown in FIGS. 14A and 14B. FIG. 14A is an isometric view. FIG. 14B is a cross-sectional view taken along line L-L' of FIG. 14A. The ILD layer 130 protects the source/drain layers 120, 120' during the removal of the sacrificial gate structures. The sacrificial gate electrode layer 90 can be removed using plasma dry etching and/or wet etching. When the sacrificial gate electrode layer 90 is polysilicon and the ILD layer 130 is silicon oxide, a wet etchant such as a tetramethylammonium hydroxide (TMAH) solution can be used to selectively remove the sacrificial gate electrode layer 90. The sacrificial gate dielectric layer 85 is removed by using suitable plasma dry etching and/or wet etching operations.

Figure 15A:
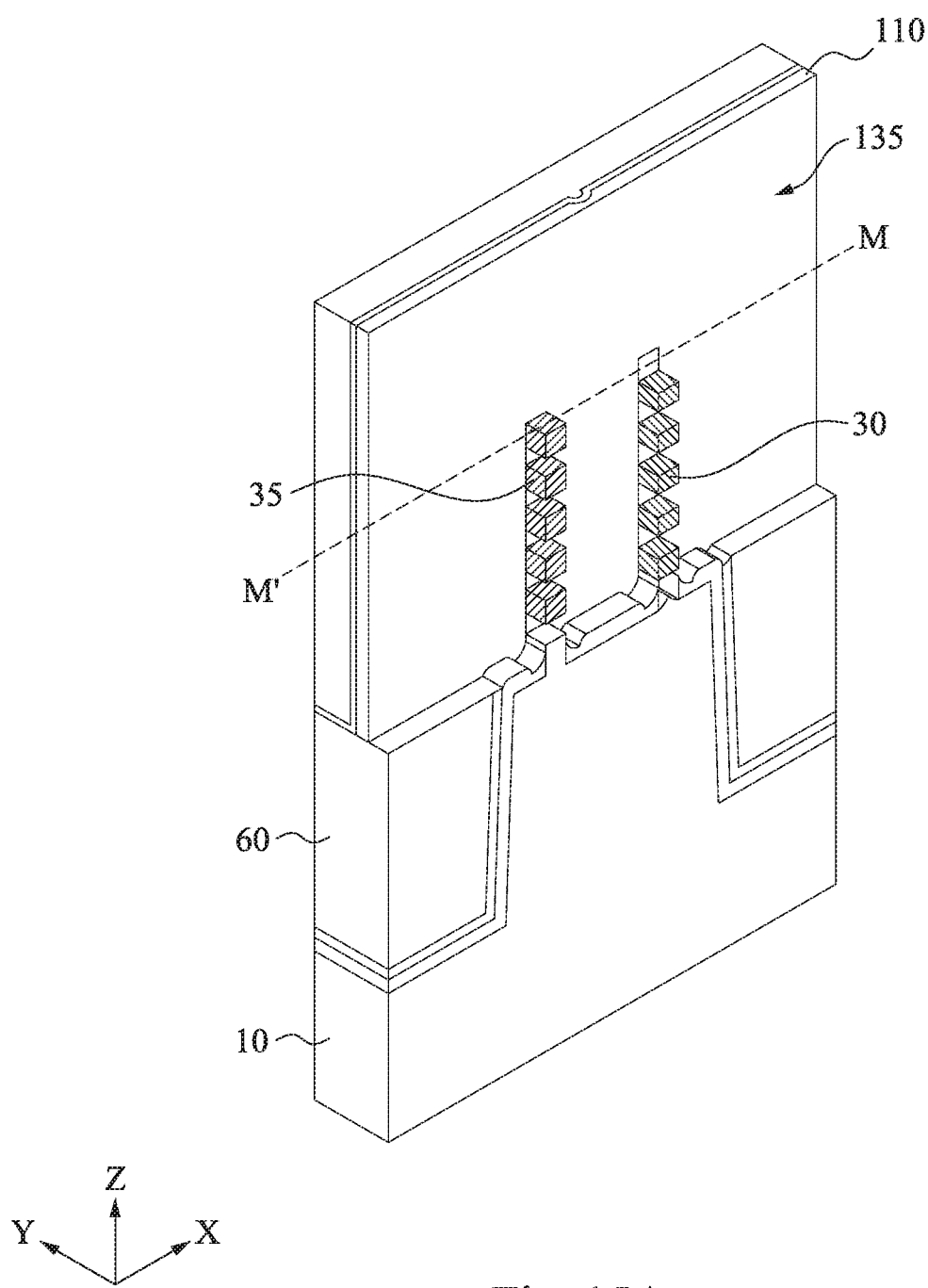
FIGS. 15A and 15B show views of one of the various stages of manufacturing a GAA FET semiconductor device according to embodiments of the present disclosure.
Figure 15B:
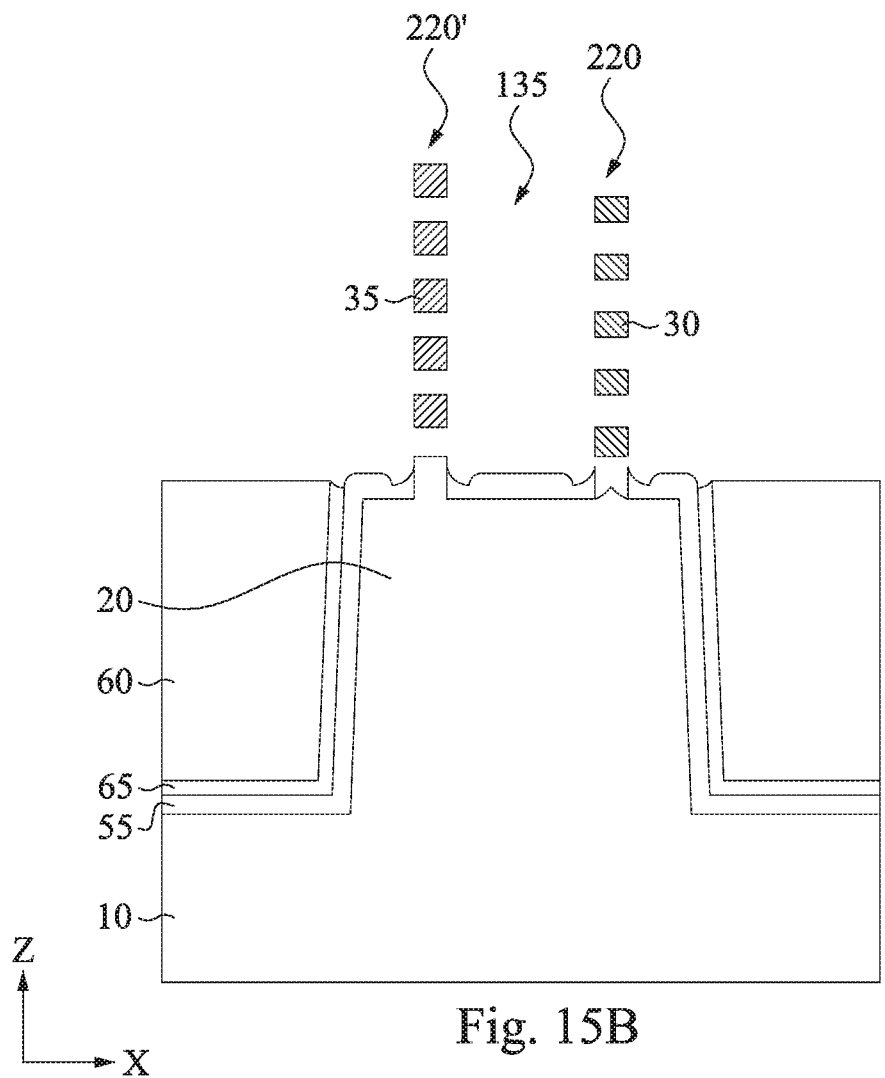

Adverting to FIGS. 15A and 15B, the first semiconductor layers 30 or second semiconductor layers 35 in the channel regions of the fin structures 15 are removed using suitable etching operations to form stacked nanowire structures 220, 220' made up of stack of either the first semiconductor layers or nanowires 30 or the second semiconductor layers or nanowires 35 arranged substantially parallel to each other along the Z direction. FIG. 15A is an isometric view. FIG. 15B is a cross-sectional view taken along line M-M' of FIG. 15A. As explained herein with reference to FIGS. 11A and 11B, the removal of the first and second semiconductor layers is performed in separate operations, where in one operation the first semiconductor layers 30 are removed and in another operation the second semiconductor layers 35 are removed.

The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first and second semiconductor layers 30, 35.

The cross sectional shape of the semiconductor nanowires 35 in the channel region are shown as rectangular, but can be any polygonal shape (triangular, diamond, etc.), polygonal shape with rounded corners, circular, or oval (vertically or horizontally).

Figure 16A:
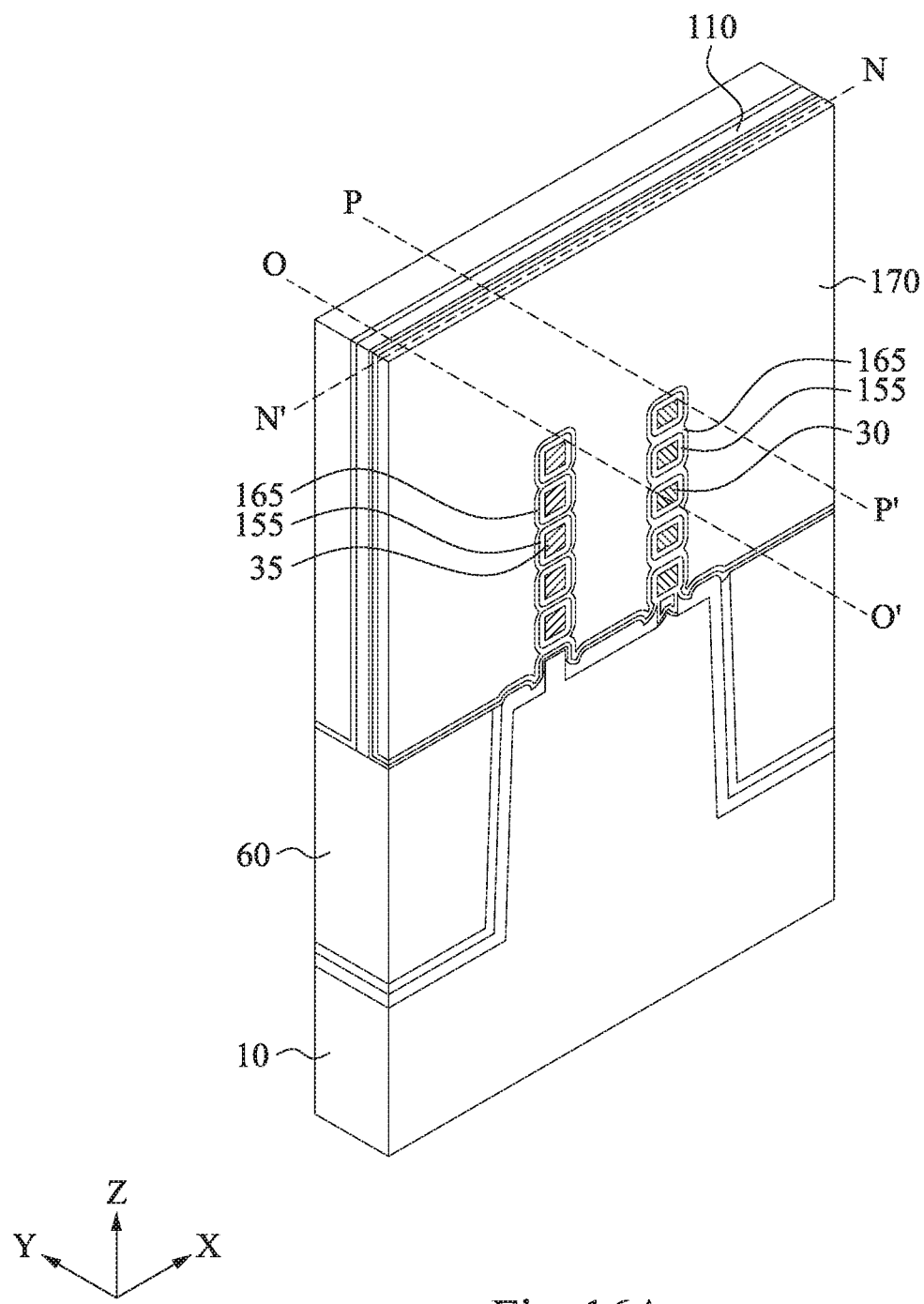
FIGS. 16A-16D show views of one of the various stages of manufacturing a GAA FET semiconductor device according to embodiments of the present disclosure.
Figure 16B:
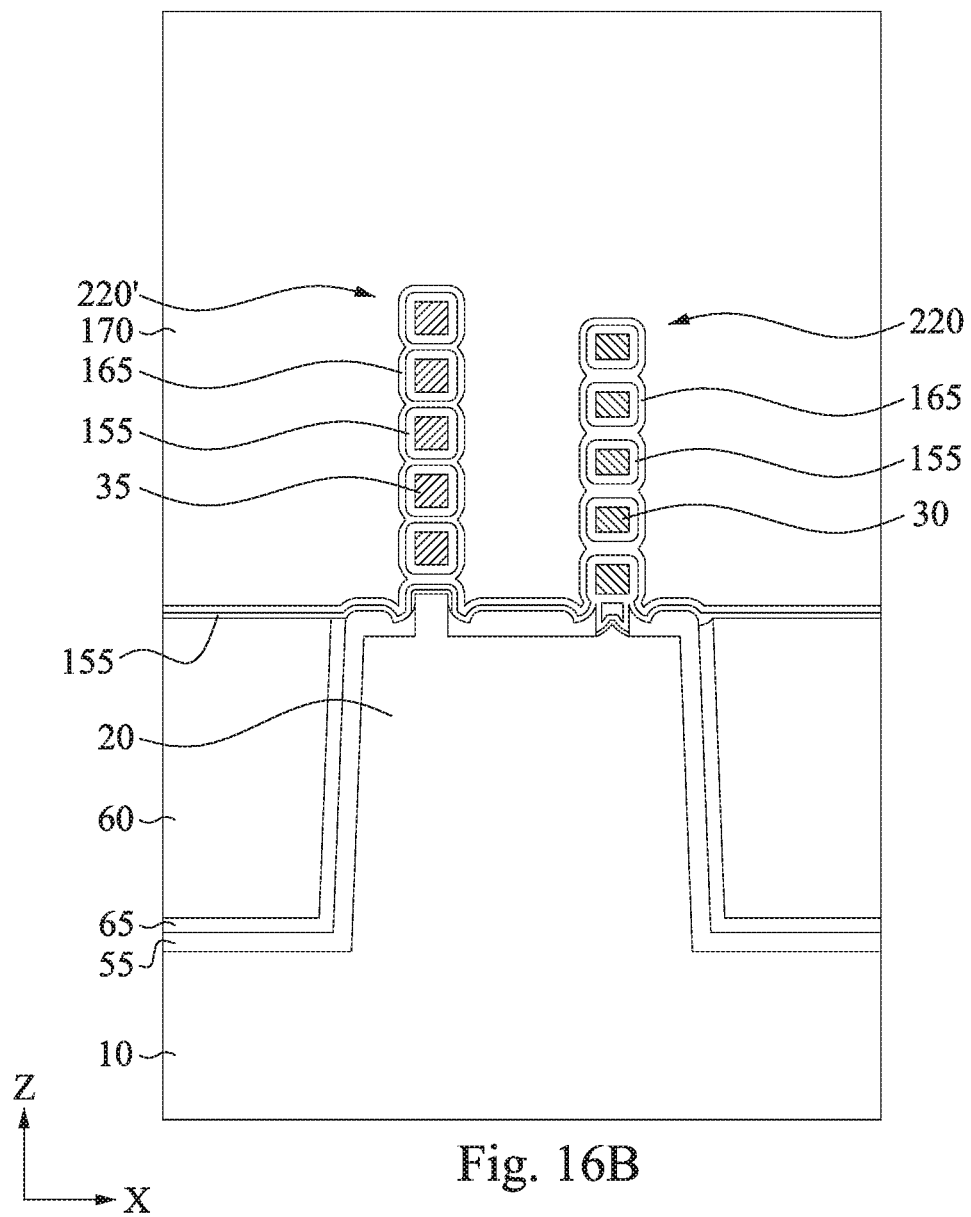
Figure 16C:
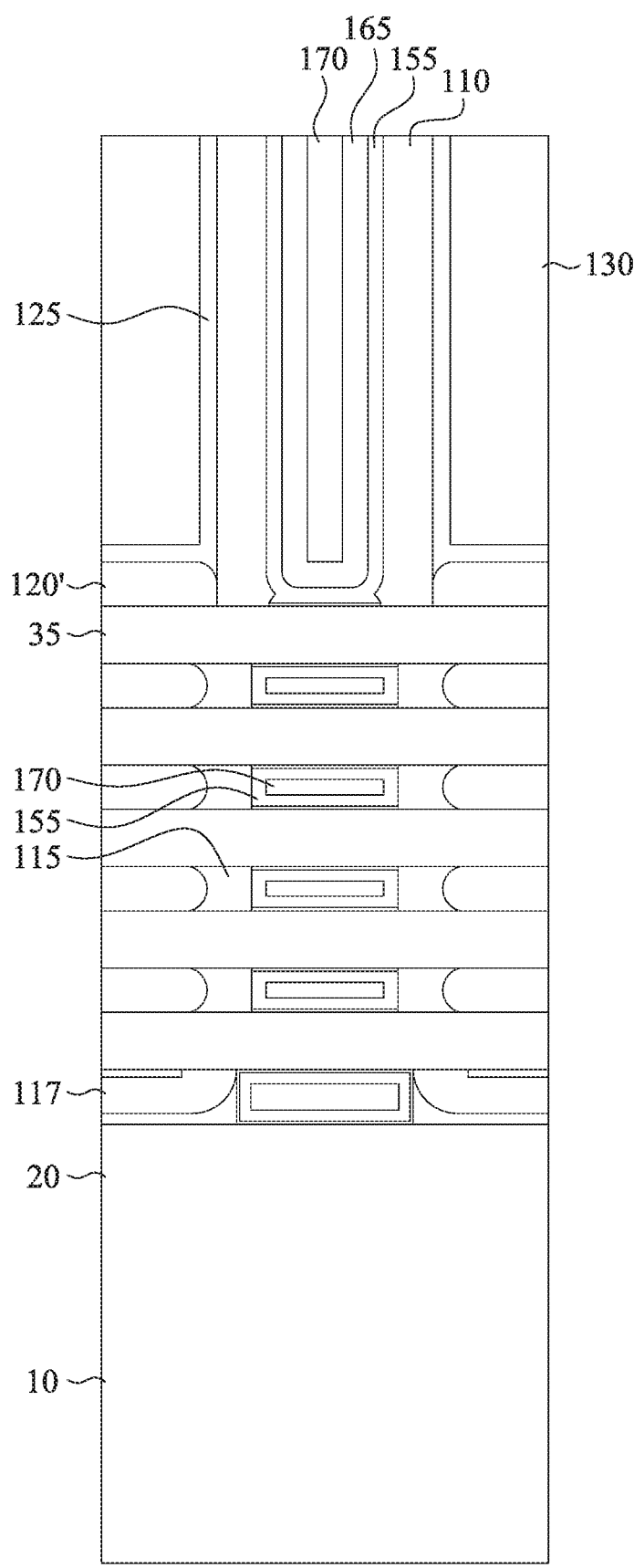
Figure 16D:
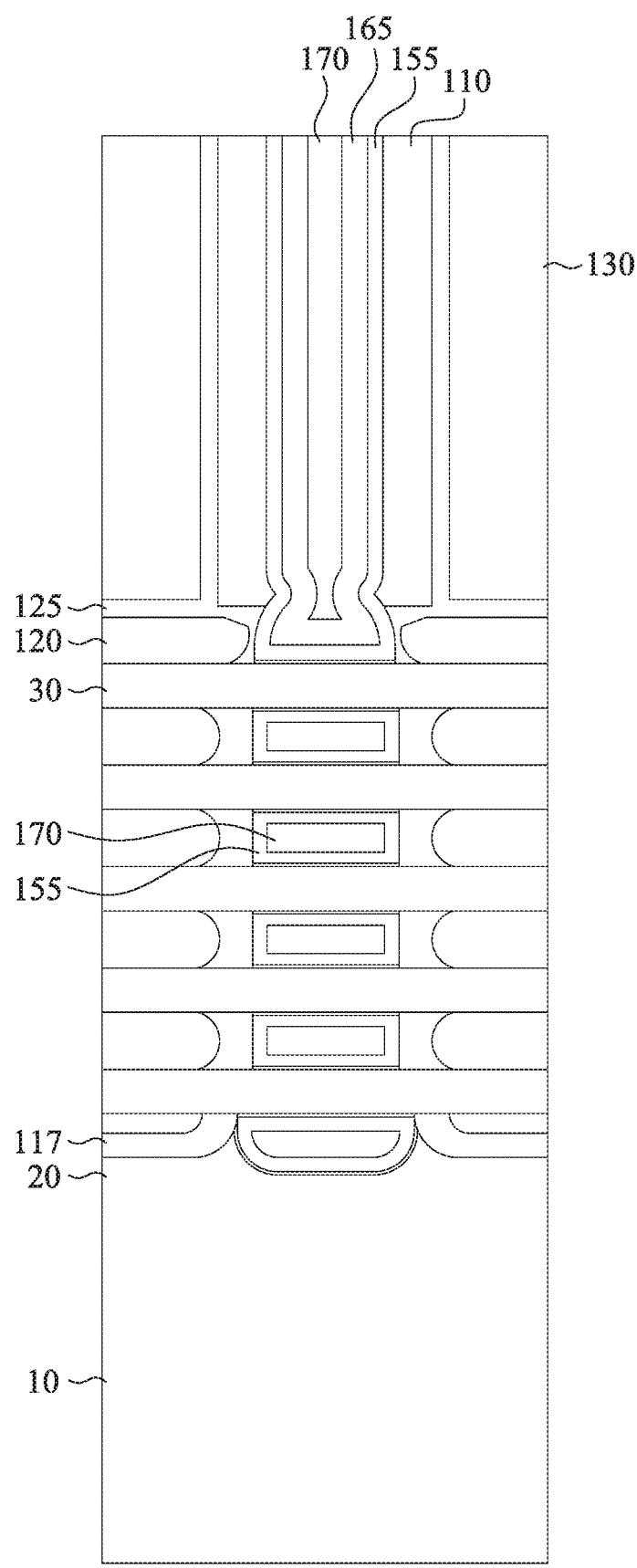

After the semiconductor nanowires of the first and second semiconductor layers 30, 35 are formed, a gate dielectric layer 155 is formed around each of the channel region nanowires 30, 35 as shown in FIGS. 16A-16D. FIG. 16A is an isometric view. FIG. 16B is a cross-sectional view taken along line N-N' of FIG. 16A. FIG. 16C is a cross-sectional view taken along line O-O'. FIG. 16D is a cross-sectional view taken along line P-P'.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 155 includes an interfacial layer formed between the channel layers and the dielectric material.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layer. The thickness of the gate dielectric layer 155 is in a range from about 1 nm to about 6 nm in some embodiments. In some embodiments, the gate dielectric layer 155 functions as a nanowire stack insulating layer isolating the nanowire stack from the substrate.

After the gate dielectric layer 155 is formed, a gate electrode layer 170 is formed over the gate dielectric layer 155 in the gate space 135 in some embodiments. The gate electrode layer 170 is formed on the gate dielectric layer 155 to surround or wrap around each nanowire 30, 35.

The gate electrode layer 170 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 170 may be formed by CVD, ALD, electro-plating, or other suitable method. The gate electrode layer 170 is also deposited over the upper surface of the ILD layer 130 in some embodiments, and then the portion of the gate electrode layer formed over the ILD layer 130 is planarized by using, for example, CMP, until the top surface of the ILD layer 130 is revealed.

In some embodiments of the present disclosure, one or more barrier layers and/or work function adjustment layers 165 are interposed between the gate dielectric layer 155 and the gate electrode layer 170. The barrier layer is made of a conductive material such as a single layer of TiN or TaN or a multilayer of both TiN and TaN in some embodiments.

In some embodiments of the present disclosure, one or more work function adjustment layers 165 are interposed between the gate dielectric layer 155 or barrier layer and the gate electrode layer 170. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, HfTi, TiSi and TaSi is used as the work function adjustment layer, and for a p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers as the gate electrode layer 170.

It is understood that the GAA FETs formed according to the disclosed methods undergo further complementary metal oxide semiconductor (CMOS) processes to form various features such as cap insulating layers, contacts/vias, silicide layers, interconnect metal layers, dielectric layers, passivation layers, metallization layers with signal lines, etc.

Figure 17:
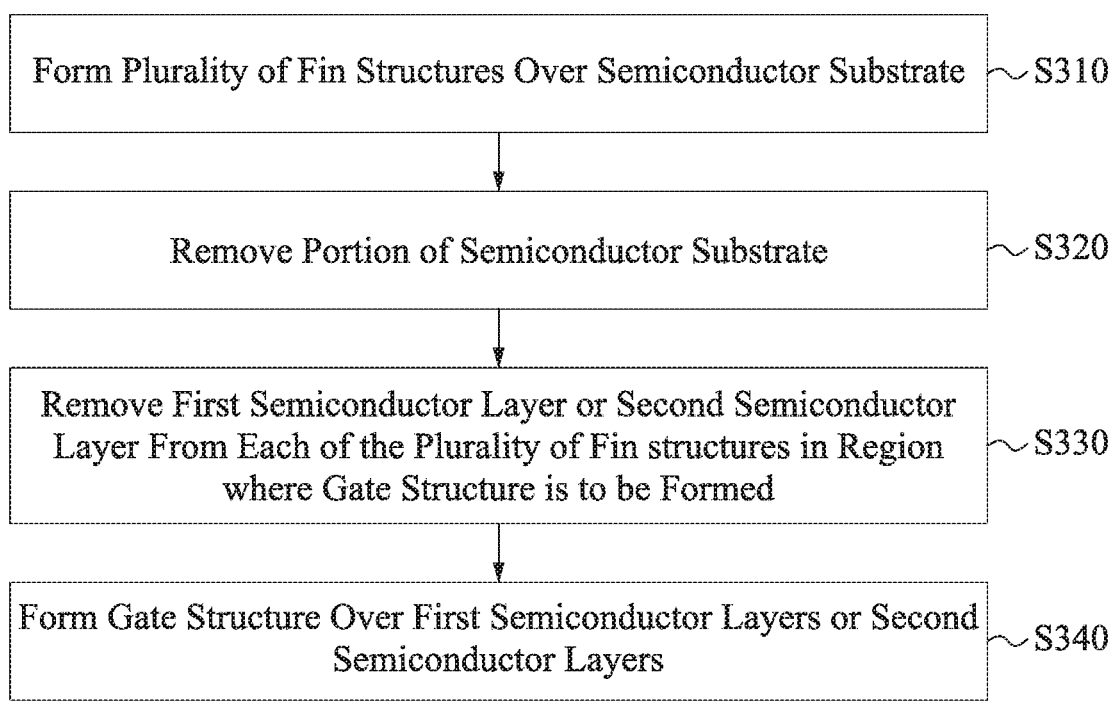
FIG. 17 is a flowchart of a method of manufacturing a semiconductor device according to embodiments of the present disclosure.

An embodiment of the present disclosure is a method 300 of manufacturing a semiconductor device according to the flowchart illustrated in FIG. 17. The method includes an operation S310 of forming a plurality of fin structures over a semiconductor substrate. The plurality of fin structures extend in a first direction over a first region of the semiconductor substrate, the plurality of fin structures are arranged along a second direction substantially perpendicular to the first direction, and each of the fin structures comprise an alternating stack of first semiconductor layers and second semiconductor layers arranged in a third direction substantially perpendicular to the first direction and the second direction (see, e.g. FIGS. 4A-4C). The first semiconductor layers and the second semiconductor layers are made of different materials. A portion of the semiconductor substrate is removed in operation S320. The portion of the semiconductor substrate removed is in second regions of the semiconductor substrate located on opposing sides of the first region of the semiconductor substrate along the second direction (see, e.g. FIGS. 6A-6C). In some embodiments, the portion of the semiconductor substrate is removed by forming a photoresist and/or BARC layer over the fin structures, patterning the photoresist and/or BARC layer so that portions of the substrate to be removed are not covered by the photoresist and/or BARC layer, performing an etching operation to remove the portion of the substrate not covered by the photoresist and/or BARC layer to a specific depth, and removing the remaining photoresist covering the fin structures after etching the substrate, thereby forming a plurality of fin structures on a common mesa structure. In operation S330, the first semiconductor layer or the second semiconductor layer removed from each of the plurality of fin structures in a region where a gate structure is to be formed (see, e.g. FIGS. 15A and 15B). Then, a gate structure is formed over the first semiconductor layers or the second semiconductor layers in operation S340. The gate structure wraps around either the first semiconductor layers or the second semiconductor layers (see, e.g. FIGS. 16A-16D). In some embodiments, the gate structure defines a channel region of the semiconductor device.

Figure 18:
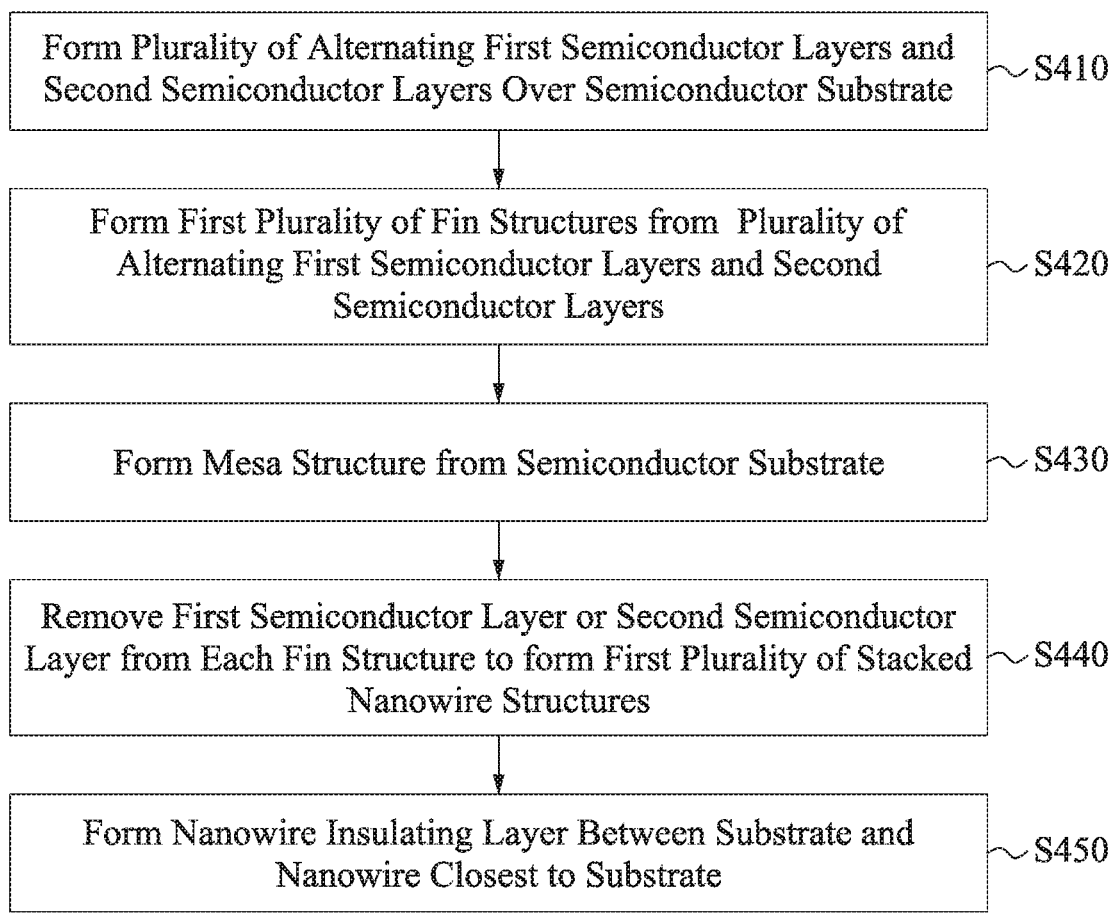
FIG. 18 is a flowchart of a method of manufacturing a semiconductor device according to embodiments of the present disclosure.

Another embodiment of the present disclosure is a method 400 of manufacturing a semiconductor device according to the flowchart illustrated in FIG. 18. The method includes an operation S410 of forming a plurality of alternating first semiconductor layers and second semiconductor layers over a semiconductor substrate (see, e.g. FIGS. 3A and 3B). The first semiconductor layers and the second semiconductor layers are made of different materials. A first plurality of fin structures are formed from the plurality of alternating first semiconductor layers and second semiconductor layers in operation S420. The plurality of fins extend in a first direction and are arranged along a second direction substantially perpendicular to the first direction (see, e.g. FIGS. 4A and 4B). Next, a mesa structure is formed from the semiconductor substrate in operation S430 by forming a photoresist and/or BARC layer over the fin structures, patterning the photoresist and/or BARC layer so that portions of the substrate to be subsequently removed are not covered by the photoresist and/or BARC layer, performing an etching operation to remove the portion of the substrate not covered by the photoresist and/or BARC layer to a specific depth, and removing the remaining photoresist covering the fin structures after etching the substrate. The first plurality of fin structures are disposed over the mesa structure (see, e.g. FIGS. 6A and 6C). In operation S440 the first semiconductor layer or the second semiconductor layer from each of the plurality of fin structures is removed to form a first plurality of stacked nanowire structures. The first or second semiconductor layers are removed in a region where a gate structure is to be formed. Each stacked nanowire structure includes a plurality of nanowires arranged in a third direction substantially perpendicular to the first and second directions (see, e.g. FIGS. 15A and 15B). In operation S450, a nanowire stack insulating layer is formed between the substrate and a nanowire in the nanowire stacked structures located closest to the substrate in the third direction (see, e.g., FIGS. 16A and 16B).

Figure 19:
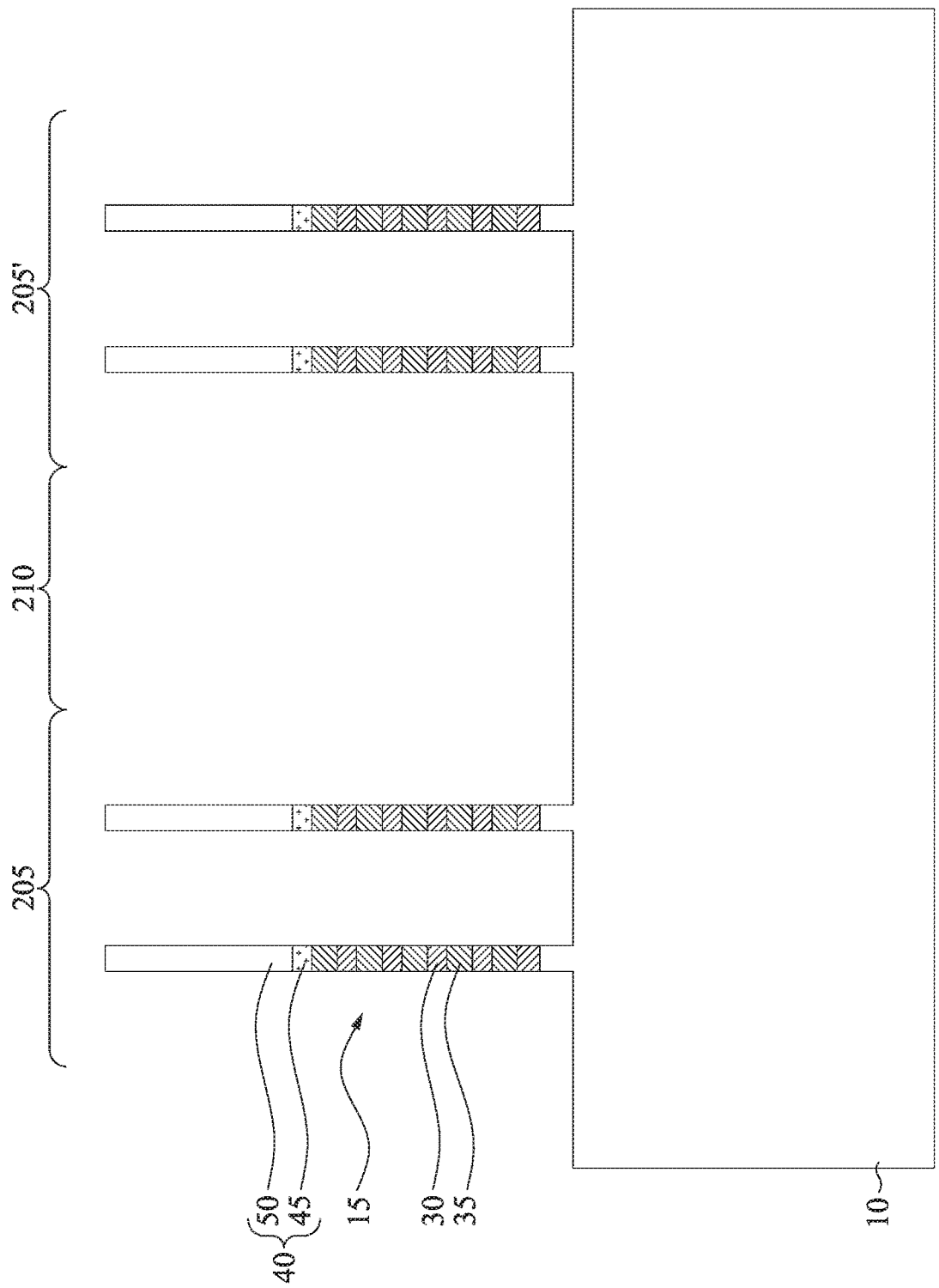
FIG. 19 is a cross-sectional view of one of the various stages of manufacturing a GAA FET semiconductor device according to embodiments of the present disclosure.

FIGS. 19-29 illustrate another method of manufacturing a GAA FET semiconductor device according to embodiments of the present disclosure. Starting with the structure of FIG. 3A, an alternating stack of first semiconductor layers 30 and second semiconductor layers 35 made of different materials are formed over the substrate 10, the structure is patterned to form a plurality of fin structures 15, as shown in FIG. 19. FIG. 19 is a cross-sectional view showing one of the various stages of manufacturing a GAA FET semiconductor device according to embodiments of the present disclosure.

The hard mask layer 40 is patterned into a mask pattern by using patterning operations including photolithography and etching. Then, the stacked layers of the first and second semiconductor layers 30, 35 and the underlying substrate 10 are patterned by using the patterned mask layer, thereby the stacked layers and a portion of the substrate are formed into a first plurality of fin structures 15 arranged along the X direction over a first region 205 of the substrate 10, and a second plurality of fin structures 15 arranged over a second region 205' of the substrate 10. The first region 205 and second region 205' of the substrate 10 are spaced apart by an intervening third region 210. In FIG. 19, two fin structures 15 are included in the first plurality of fin structures and second plurality of fin structures. But the number of the fin structures in each plurality of fin structures is not limited to two, and may be more than two. In some embodiments, one or more dummy fin structures are formed on both sides of the pluralities of fin structures 15 to improve pattern fidelity in the patterning operations.

The width, height, and spacing of the fin structure 15 along the X direction may be within the ranges disclosed herein with reference to FIG. 4B. The fin structures 15 may be patterned by any suitable method, as previously explained herein.

Figure 20:
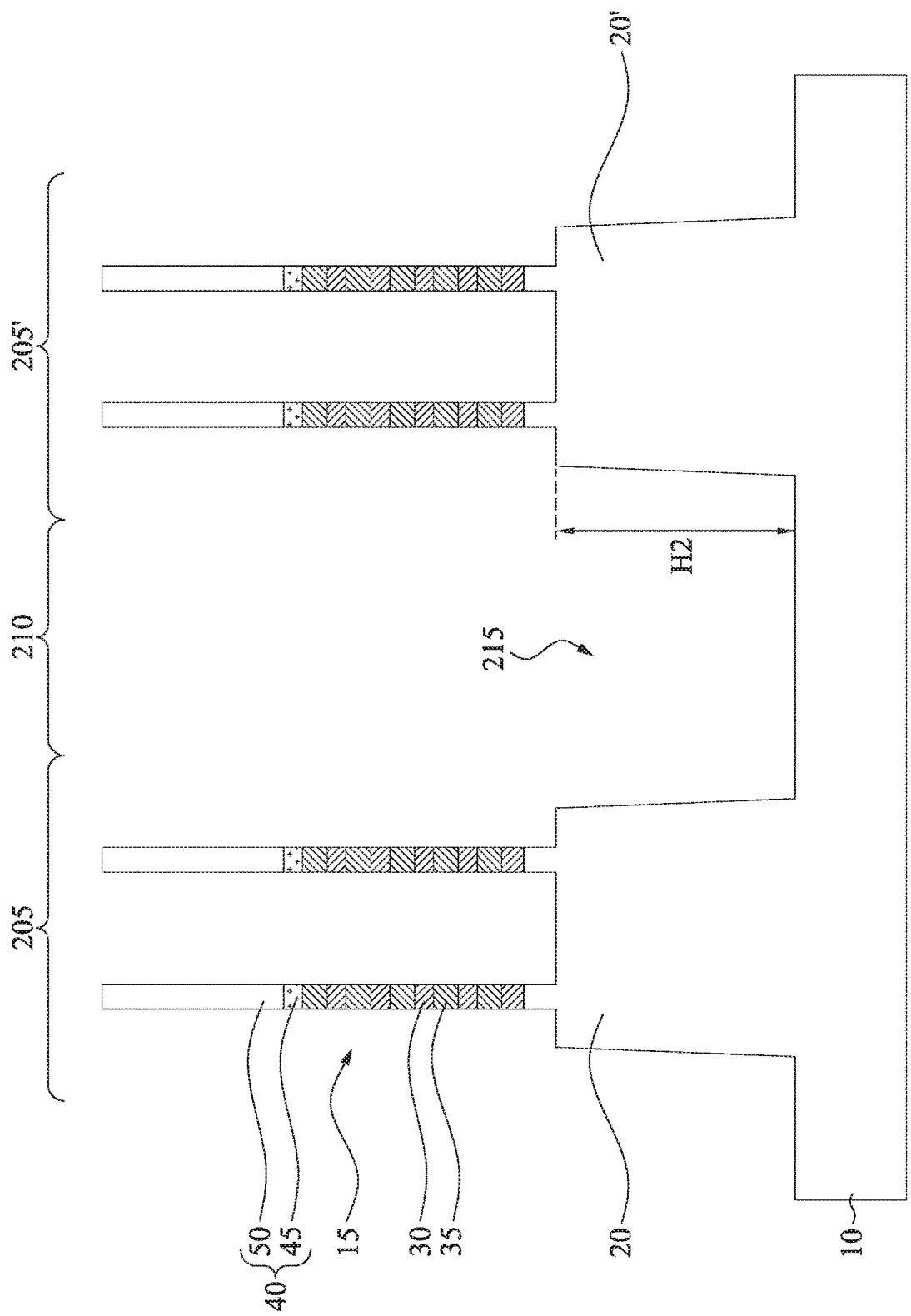
FIG. 20 is a cross-sectional view of one of the various stages of manufacturing a GAA FET semiconductor device according to embodiments of the present disclosure.

FIG. 20 is a cross-sectional view of one of the various stages of manufacturing a GAA FET semiconductor device according to embodiments of the present disclosure. Using suitable photolithographic and etching operations, portions of the substrate 10 are removed on both sides of the first and second regions 205, 205' along the X direction, thereby forming mesa structures 20, 20'. In some embodiments, the mesa structures 20, 20' are formed by the operations of forming a photoresist and/or BARC layer over the fin structures 15. The photoresist and/or BARC layer is patterned that portions of the substrate on both sides of the first and second regions 205, 205' are exposed. The exposed first and second regions 205, 205' are subsequently etched using a suitable etching operation, and the patterned photoresist and/or BARC layers are removed using a suitable removal operation, such as photoresist stripping or oxygen plasma ashing. In some embodiments, the substrate is etched to form a recess 215 in the third region 210 of the substrate having a depth H2 in a range from about 20 nm to about 100 nm from the upper surface of the substrate 10, as explained with reference to FIG. 6B. In other embodiments, the depth of the recess H2 ranges from about 40 nm to about 80 nm. As shown in FIG. 20, a first plurality of fin structures 15 are formed on common mesa structure 20 over region 205 of the substrate and a second plurality of fin structures 15 are formed on common mesa structure 20' over region 205' of the substrate. No recesses are formed between adjacent fin structures 15 on a common mesa structures 20, 20' in some embodiments.

Figure 21:
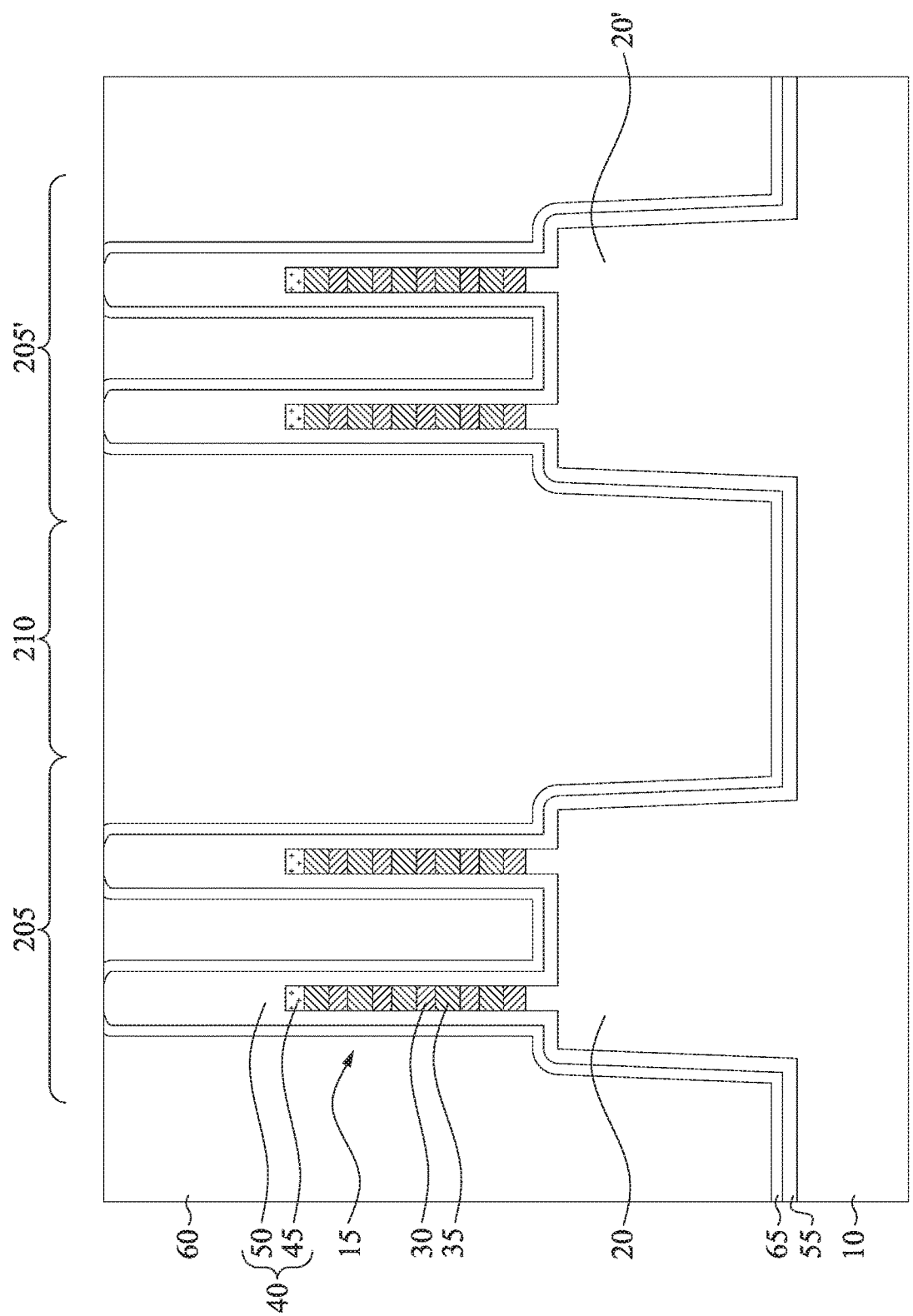
FIG. 21 is a cross-sectional view of one of the various stages of manufacturing a GAA FET semiconductor device according to embodiments of the present disclosure.

An insulating liner layer 55 is subsequently formed over the hard mask layer 40, fin structures 15, and substrate 10, as shown in FIG. 21. FIG. 21 is a cross-sectional view of one of the various stages of manufacturing a GAA FET semiconductor device according to embodiments of the present disclosure. The insulating liner layer 55 conformally covers the hard mask layer 40, fin structures 15, and substrate 10 in some embodiments. In an embodiment, the insulating liner layer 55 is made of a nitride, such as silicon nitride, a silicon nitride-based material (e.g., SiON, SiCN, or SiOCN), or a carbon nitride. The insulating liner layer 55 may be formed by CVD, LPCVD, PECVD, PVD, ALD, or other suitable process. The thickness of the insulating liner layer 55 ranges from about 1 nm to about 20 nm in some embodiments. In some embodiments, the thickness of the insulating liner layer ranges from about 3 nm to about 15 nm. In some embodiments, the insulating liner layer 55 includes two or more layers of different materials.

In some embodiments, an additional liner layer 65, such as a silicon oxide liner layer is formed over the nitride insulating liner layer 55. The additional liner layer 65 may be formed by CVD, LPCVD, PECVD, PVD, ALD, or other suitable process. The thickness of the additional liner layer 65 ranges from about 1 nm to about 20 nm in some embodiments. In some embodiments, the thickness of the additional liner layer 65 ranges from about 3 nm to about 15 nm.

Then, a first insulating material layer 60 including one or more layers of insulating material is formed over the substrate 10 so that the fin structures are fully embedded in the insulating layer. The insulating material for the first insulating material layer 60 may include silicon oxide, silicon nitride, silicon oxynitride (SiON), SiOCN, SiCN, fluorine-doped silicate glass (FSG), or a low-K dielectric material, formed by LPCVD, PECVD, or flowable CVD. An anneal operation may be performed after the formation of the insulating material layer 60. Then, a planarization operation, such as a chemical mechanical polishing (CMP) method and/or an etch-back method, is performed such that the upper surface of the insulating liner layer 55 is exposed from the first insulating material layer 60.

Figure 22:
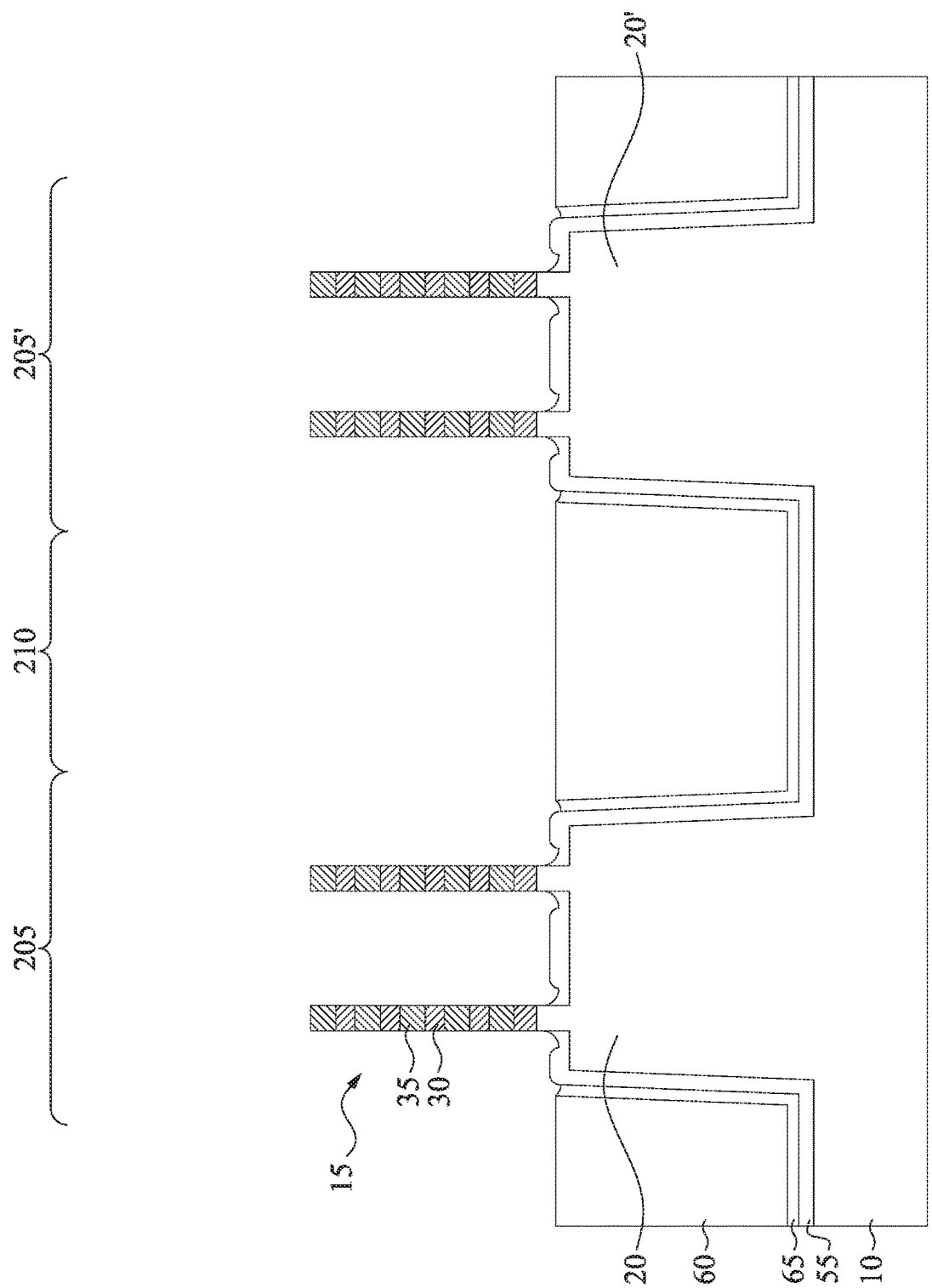
FIG. 22 is a cross-sectional view of one of the various stages of manufacturing a GAA FET semiconductor device according to embodiments of the present disclosure.

Then, as shown in FIG. 22 the upper portion of the first insulating material layer 60 is removed exposing fin structures 15 and the insulating liner layer 55 over the mesas 20, 20'. FIG. 22 is a cross-sectional view of one of the various stages of manufacturing a GAA FET semiconductor device according to embodiments of the present disclosure. Suitable etching operations are used to remove the portions of the insulating material 60 from between the fin structures 15. The first insulating material layer 60 filling the recesses 215 is also called an isolation insulating layer or a shallow trench isolation (STI) layer. There are no shallow trench isolation layers 60 formed between fin structures 15 on a common mesa structures 20, 20' in some embodiments.

Figure 23:
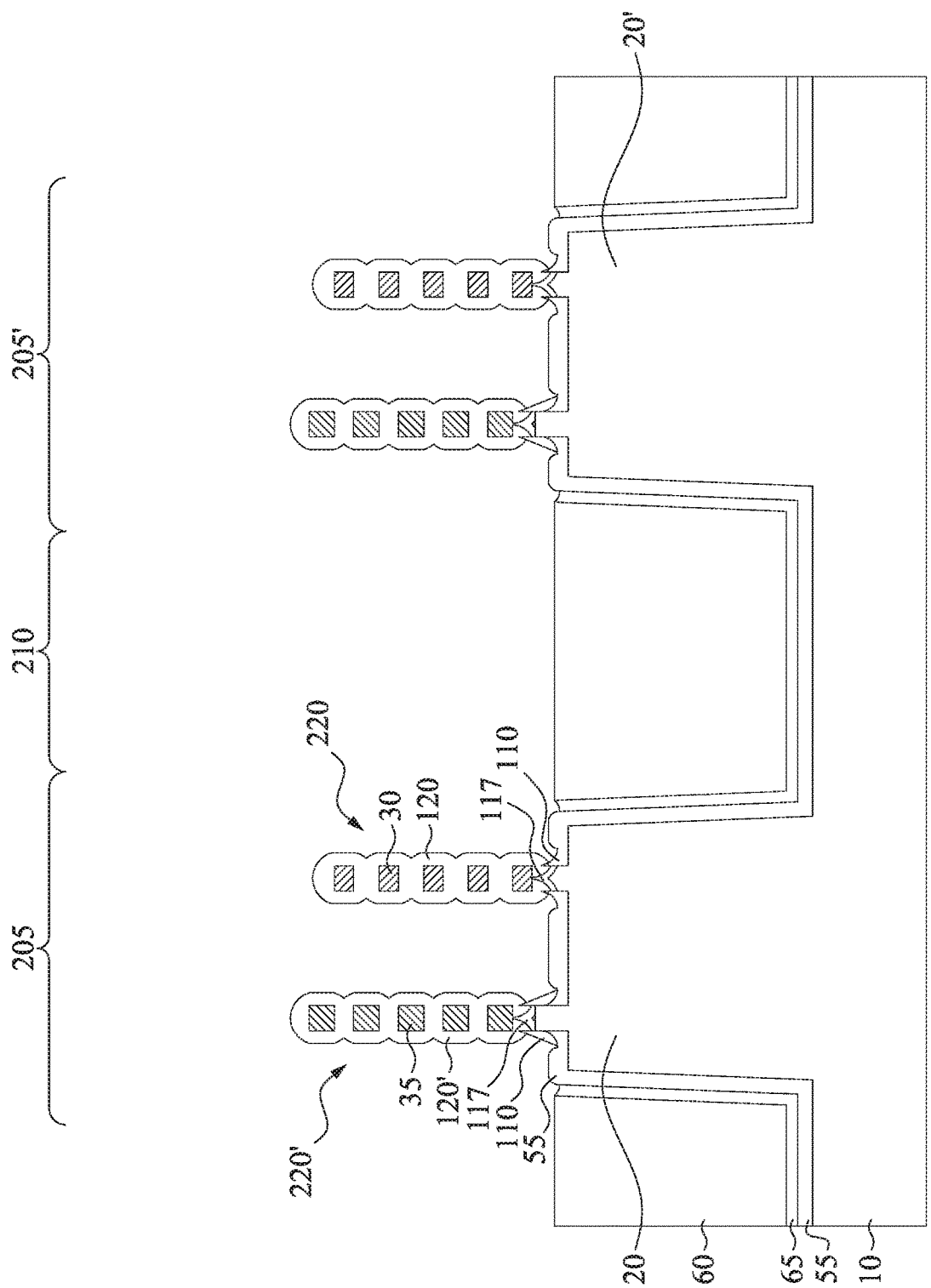
FIG. 23 is a cross-sectional view of one of the various stages of manufacturing a GAA FET semiconductor device according to embodiments of the present disclosure.

FIG. 23 is a cross-sectional view along the source/drain region of one of the various stages of manufacturing a GAA FET semiconductor device according to embodiments of the present disclosure. As shown in FIG. 23, the first semiconductor layers 30 or second semiconductor layers 35 in the source/drain regions of the fin structures 15 are removed using suitable etching operations to form stacked nanowire structures 220, 220'. The removal of the first semiconductor layers 30 or second semiconductor layers 35 results in the formation of first nanowires 30 and second nanowires 35 from the remaining first semiconductor layers 30 or second semiconductor layers 35, respectively. The first nanowires (or first semiconductor layers 30) or the second nanowires (or second semiconductor layers) 35 are arranged substantially parallel to each other along the Z direction.

The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, $HF:HNO_3$ solution, $HF:CH_3COOH:HNO_3$, or $H_2SO_4$ solution and $HF:H_2O_2:CH_3COOH$. In some embodiments, a combination of dry etching techniques and wet etching techniques are used to remove the first semiconductor layers 30. In some embodiments, a portion of the sidewall spacer layer 110 remains below the nanowire 30, 35 closest to the substrate along the Z direction.

Prior to removing the first or second semiconductor layers, operations of: forming a sacrificial gate dielectric layer, forming a sacrificial gate layer, forming an upper insulating layer, forming, and sidewall spacer layers, as disclosed herein with reference to FIGS. 9A-11B, are performed in some embodiments.

The first semiconductor layer removal and second semiconductor layer removal are performed in separate operations in some embodiments. In some embodiments, a first fin structure 15 is masked and the first semiconductor layers 30 are removed from a second unmasked fin structure 15 to form a second nanowire structure 220'. Then the first fin structure 15 is unmasked, and the second nanowire structure 220' is masked. The second semiconductor layers 35 are subsequently removed from the unmasked first fin structure 15 forming a first nanowire structure 220. Then the second nanowire structure 220' is unmasked. Thus, nanowire structures 220, 220' having nanowires of different materials are formed, and different devices, such as nFETs and pFETs can be formed on the same mesa 20.

After removing the first semiconductor layers 30 in the source/drain regions, an inner spacer layer 115 is formed along exposed sides sacrificial gate dielectric layer between the first semiconductor layers 30 and the second semiconductor layers 35 to electrically isolate the source/drain regions from the channel region, and a nanowire stack insulating layer 117 is formed between the substrate 10 and the first semiconductor layer 30 and second semiconductor layer 35 to electrically isolate the source/drains from the channel region and from the substrate 10. In some embodiments, the nanowire stack insulating layer 117 substantially fills the space between the nanowire 30, 35 closest to the substrate and the substrate 10. In some embodiments, the inner spacer layer 115 substantially fills the space between the nanowires 30, 35 below the sidewall spacers 110 (see FIGS. 16C and 16D for example). In some embodiments, the inner spacer layer 115 and the nanowire stack insulating layer 117 are formed of the same material, including an oxide, such as silicon oxide or a nitride, such as $Si_3N_4$, SiON, and SiCN, or any other suitable dielectric material, including low-k materials. In some embodiments, the low-k material is selected from the group consisting of porous silicon dioxide, carbon doped silicon dioxides, and fluorine doped silicon dioxide. The inner spacer layer 115 and nanowire stack insulating layer 117 can be formed by ALD or CVD, or any other suitable process.

In some embodiments, the nanowire stack insulating layer 117 is formed by deposition and etching operations. In some embodiments, nanowire stack insulating layer metal is formed around all the exposed nanowires or in the space between the first nanowires 30 and the second nanowires and the space between the first nanowires 30 and the second nanowires 35, and then the nanowire stack insulating material is removed from between the first nanowires 30 and the second nanowires 35 and from around all the nanowires except between the nanowire 30, 35 closest to the substrate and the substrate 10.

Subsequently, a source/drain epitaxial layer 120, 120' is formed. The source/drain epitaxial layer 120, 120' includes one or more layers of Si, SiP, SiC and SiCP for an n-channel FET or Si, SiGe, Ge for a p-channel FET. For the P-channel FET, boron (B) may also be contained in the source/drain. The source/drain epitaxial layers 120 are formed by an epitaxial growth method using CVD, ALD or molecular beam epitaxy (MBE). The source/drain epitaxial layers 120, 120' grow on the first semiconductor layer 30 and the second semiconductor 35. In some embodiments, the source/drain epitaxial layers 120, 120' wrap around exposed portions of the first and second semiconductor layers (nanowires) 30, 35. In some embodiments, the grown source/drain epitaxial layers 120, 120' on adjacent fin structures merge with each other. In some embodiments, the source/drain epitaxial layer 120 has a diamond shape, a hexagonal shape, other polygonal shapes, or a semi-circular shape in cross section.

Figure 24:
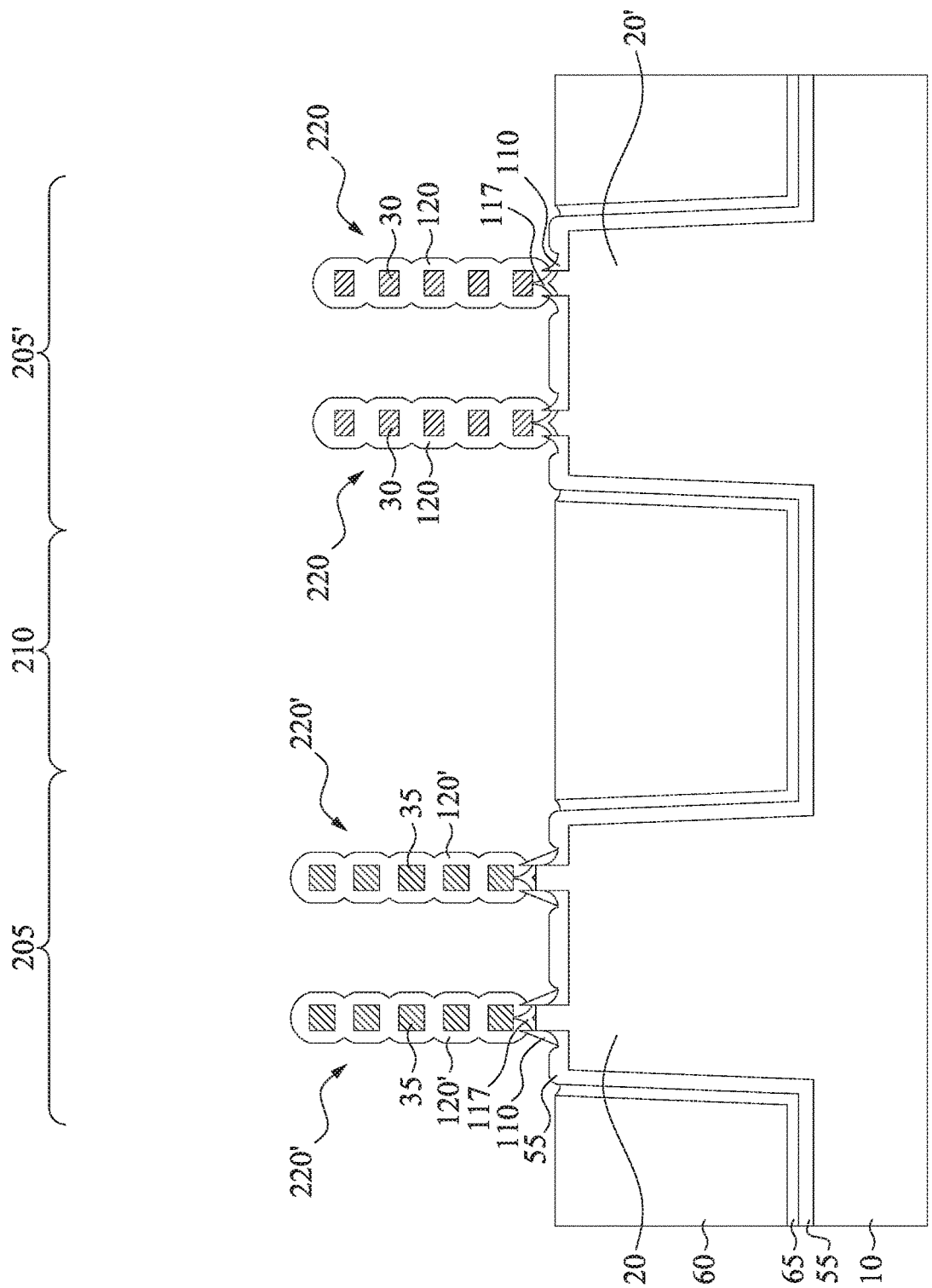
FIG. 24 is a cross-sectional view of one of the various stages of manufacturing a GAA FET semiconductor device according to another embodiment of the present disclosure.

FIG. 24 is a cross-sectional view along the source/drain region of one of the various stages of manufacturing a GAA FET semiconductor device according to another embodiment of the present disclosure. The present disclosure is not limited to forming two different types of nanowire structures 220, 220'(first nanowires 30 and second nanowires 35) and two different source/drain layers 120, 120' (n-type or p-type) on a common mesa 20, 20'. The present disclosure includes forming the same type of nanowire structures (only first nanowires 30 or only second nanowires 35) and the same type of source/drain layers 120, 120' (only n-type or only p-type) on a common mesa 20, 20', as shown in FIG. 24. Embodiments of the present disclosure include forming a plurality of nFETs on a single mesa, a plurality of pFETS on a single mesa, or forming a combination of nFETs and pFETs on a single mesa.

Figure 25:
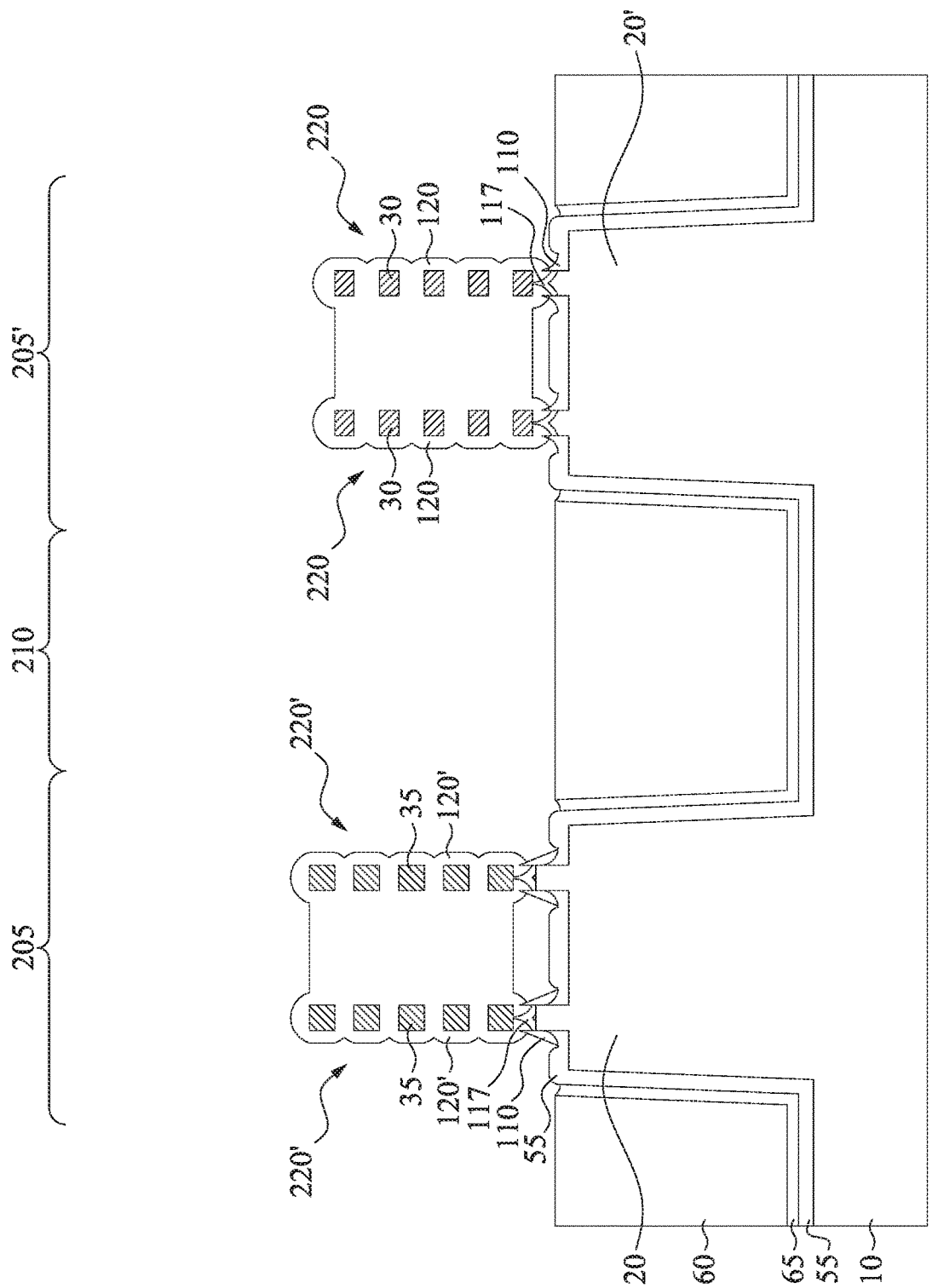
FIG. 25 is a cross-sectional view of one of the various stages of manufacturing a GAA FET semiconductor device according to another embodiment of the present disclosure.

FIG. 25 is a cross-sectional view along the source/drain region of one of the various stages of manufacturing a GAA FET semiconductor device according to another embodiment of the present disclosure. In some embodiments, the source/drain layers 120, 120' on adjacent nanowire structures 220, 220' merge during the epitaxial growth operation as shown in FIG. 25.

Figure 26:
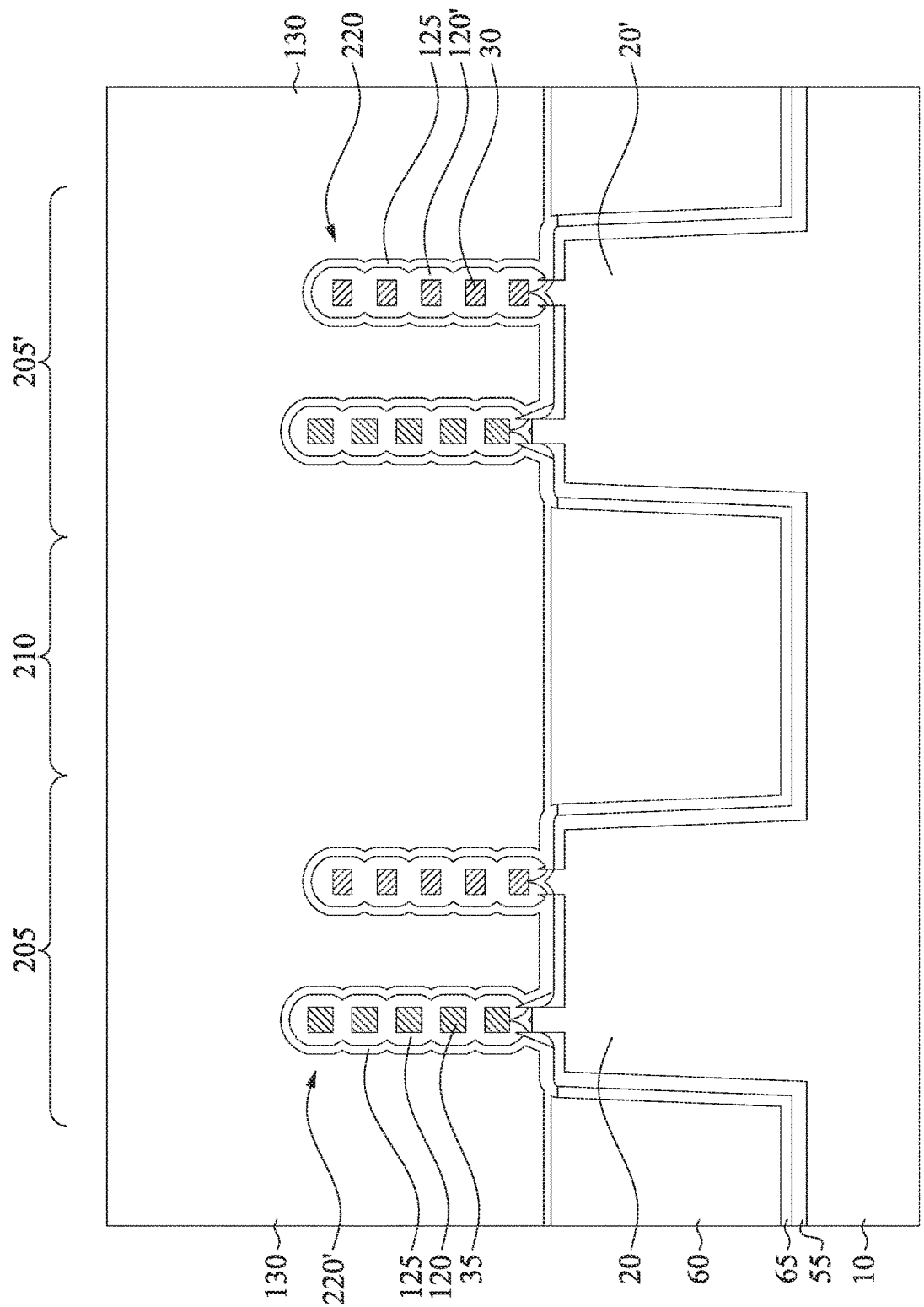
FIG. 26 is a cross-sectional view of one of the various stages of manufacturing a GAA FET semiconductor device according to embodiments of the present disclosure.

Subsequently, a contact etch stop layer (CESL) 125 is formed on the source/drain layers 120, 120', the shallow trench isolation layer 60, and sidewalls of the sidewall spacer layers 110, and then an interlayer dielectric (ILD) layer 130 is formed over the source/drain regions, as shown in FIG. 26. FIG. 26 is a cross-sectional view along the source/drain region of one of the various stages of manufacturing a GAA FET semiconductor device according to embodiments of the present disclosure.

The CESL 125 overlying the source/drain regions has a thickness of about 1 nm to about 15 nm in some embodiments. The CESL 125 may include $Si_3N_4$, SiON, SiCN or any other suitable material, and may be formed by CVD, PVD, or ALD. The materials for the ILD layer 130 include compounds comprising Si, O, C, and/or H, such as silicon oxide, SiCOH and SiOC. Organic materials, such as polymers, may be used for the ILD layer 130. After the ILD layer 130 is formed, a planarization operation, such as chemical-mechanical polishing (CMP), is performed.

Figure 27:
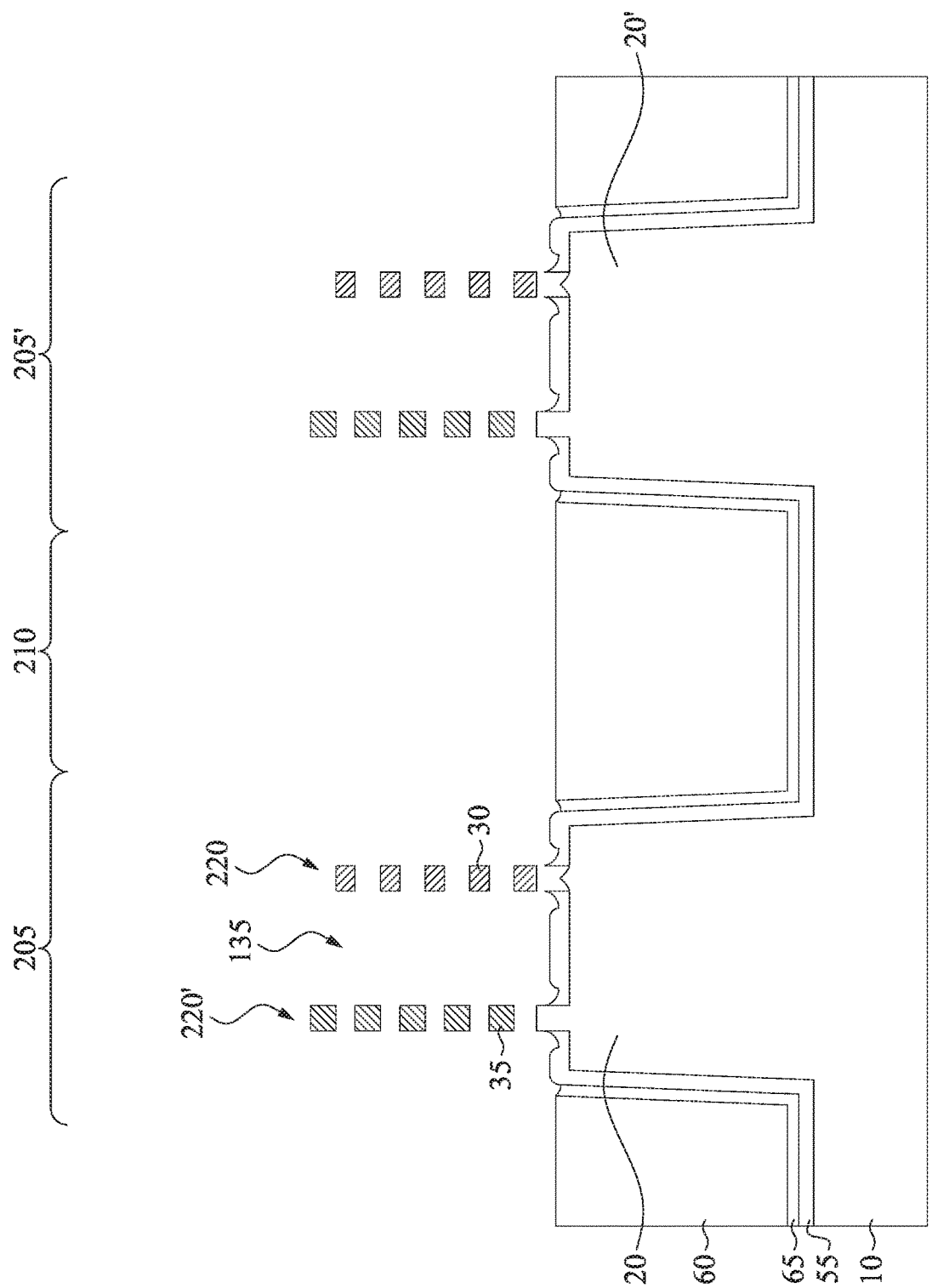
FIG. 27 is a cross-sectional view of one of the various stages of manufacturing a GAA FET semiconductor device according to embodiments of the present disclosure.

The channel regions of the fin structures 15 are exposed, thereby forming a gate space 135, as shown in FIG. 27. FIG. 27 is a cross-sectional view along the channel region of one of the various stages of manufacturing a GAA FET semiconductor device according to embodiments of the present disclosure. Prior to exposing the channel regions, sacrificial gate structures are removed, as explained herein with reference to FIGS. 14A and 14B. The first semiconductor layers 30 or second semiconductor layers 35 in the channel regions of the fin structures 15 are removed using suitable etching operations to form stacked nanowire structures 220, 220' made up of stack of either the first semiconductor layers or nanowires 30 or the second semiconductor layers or nanowires 35 arranged substantially parallel to each other along the Z direction. In some embodiments, the removal of the first semiconductor layers 30 and the second semiconductor layers 35 is performed in separate operations as explained herein with reference to FIG. 23.

The first semiconductor layers 30 and the second semiconductor layers 35 are made of different materials having different etch selectivities. Therefore, a suitable etchant for the first semiconductor layer 30 does not substantially etch the second semiconductor layer 35. For example, when the first semiconductor layers 30 are Si and the second semiconductor layers 35 are Ge or SiGe, the first semiconductor layers 30 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. On the other hand, when the first semiconductor layers 30 are SiGe or Ge and the second semiconductor layers 35 Si, the first semiconductor layers 30 can be selectively removed using a wet etchant such as, but not limited to, HF:HNO$_3$ solution, HF:CH$_3$COOH:HNO$_3$, or H$_2$SO$_4$ solution and HF:H$_2$O$_2$:CH$_3$COOH. In some embodiments, a combination of dry etching techniques and wet etching techniques are used to remove the first and second semiconductor layers 30, 35.

The cross sectional shape of the semiconductor nanowires 35 in the channel region are shown as rectangular, but can be any polygonal shape (triangular, diamond, etc.), polygonal shape with rounded corners, circular, or oval (vertically or horizontally).

Figure 28:
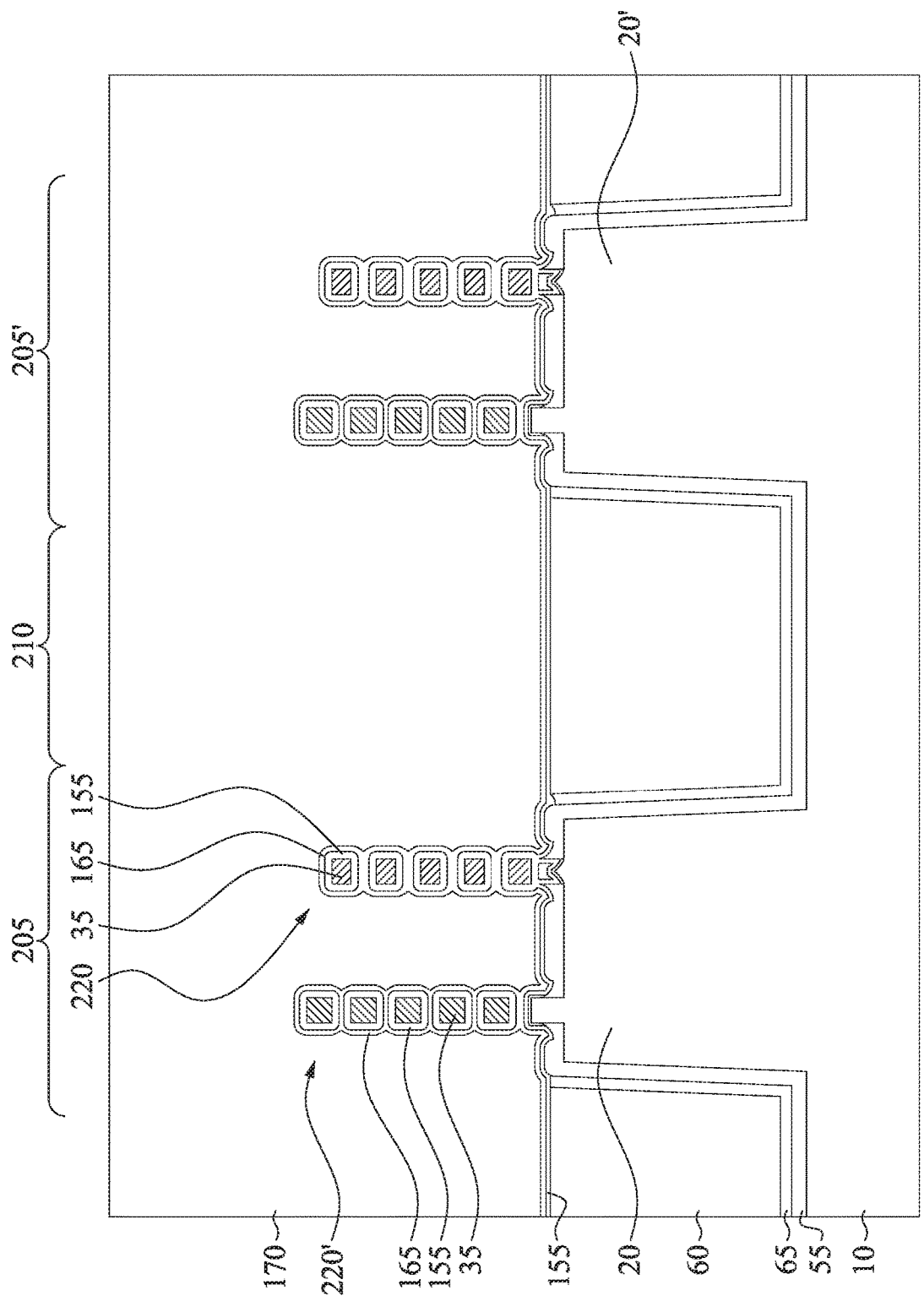
FIG. 28 is a cross-sectional view of one of the various stages of manufacturing a GAA FET semiconductor device according to embodiments of the present disclosure.

After the semiconductor nanowires of the first and second semiconductor layers 30, 35 are formed, a gate dielectric layer 155 is formed around each of the channel region nanowires 30, 35, over the isolation insulation layers 60, and between substrate 10 and the nanowire 30, 35 closest to the substrate in the Z direction, as shown in FIG. 28. FIG. 28 is a cross-sectional view along the channel region of one of the various stages of manufacturing a GAA FET semiconductor device according to embodiments of the present disclosure.

In certain embodiments, the gate dielectric layer 155 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 155 includes an interfacial layer formed between the channel layers and the dielectric material.

The gate dielectric layer 155 may be formed by CVD, ALD, or any suitable method. In one embodiment, the gate dielectric layer 155 is formed using a highly conformal deposition process such as ALD in order to ensure the formation of a gate dielectric layer having a uniform thickness around each channel layer. The thickness of the gate dielectric layer 155 is in a range from about 1 nm to about 6 nm in some embodiments. In some embodiments, the gate dielectric layer 155 functions as a nanowire stack insulating layer isolating the nanowire stack from the substrate, or as the inner spacer layer 115.

After the gate dielectric layer 155 is formed, a gate electrode layer 170 is formed over the gate dielectric layer 155 in the gate space 135 in some embodiments. The gate electrode layer 170 is formed on the gate dielectric layer 155 to surround each nanowire 30, 35.

The gate electrode layer 170 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 170 may be formed by CVD, ALD, electro-plating, or other suitable method. The gate electrode layer 170 is also deposited over the upper surface of the ILD layer 130 in some embodiments, and then the portion of the gate electrode layer formed over the ILD layer 130 is planarized by using, for example, CMP, until the top surface of the ILD layer 130 is revealed.

In some embodiments of the present disclosure, one or more barrier layers and/or work function adjustment layers 165 are interposed between the gate dielectric layer 155 and the gate electrode layer 170. The barrier layer is made of a conductive material such as a single layer of TiN or TaN or a multilayer of both TiN and TaN in some embodiments.

In some embodiments of the present disclosure, one or more work function adjustment layers 165 are interposed between the gate dielectric layer 115 or barrier layer and the gate electrode layer 170. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, HfTi, TiSi and TaSi is used as the work function adjustment layer, and for a p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers as the gate electrode layer 170.

In some embodiments, the semiconductor devices formed over the first and second regions of the substrate 10 are complementary metal oxide semiconductor field effect transistors (CMOSFET). The CMOSFET is provided with a pFET and nFET formed on the same mesa structure 20, 20', where one of the nanowire stacks is a pFET and the other nanowire stack on a common mesa structure 20, 20' is an nFET. The CMOSFETs on the adjacent mesa structures 20, 20' are separated by an isolation insulation layer or shallow trench isolation 60, while the pFET and nFET fin structures 15 on a common mesa are not separated an isolation insulating layer or shallow trench isolation 60.

In some embodiments, individual fin structures 15' are formed outside of the mesa structures 20, 20' that are separated from the mesa structures 20, 20' by a shallow trench isolation 60 (see, e.g. FIG. 1). In some embodiments, the individual fin structures 15' are dummy fin structures formed outside of the mesa structures 20, 20' to reduce stress induced by the shallow trench isolation formation process.

Figure 29:
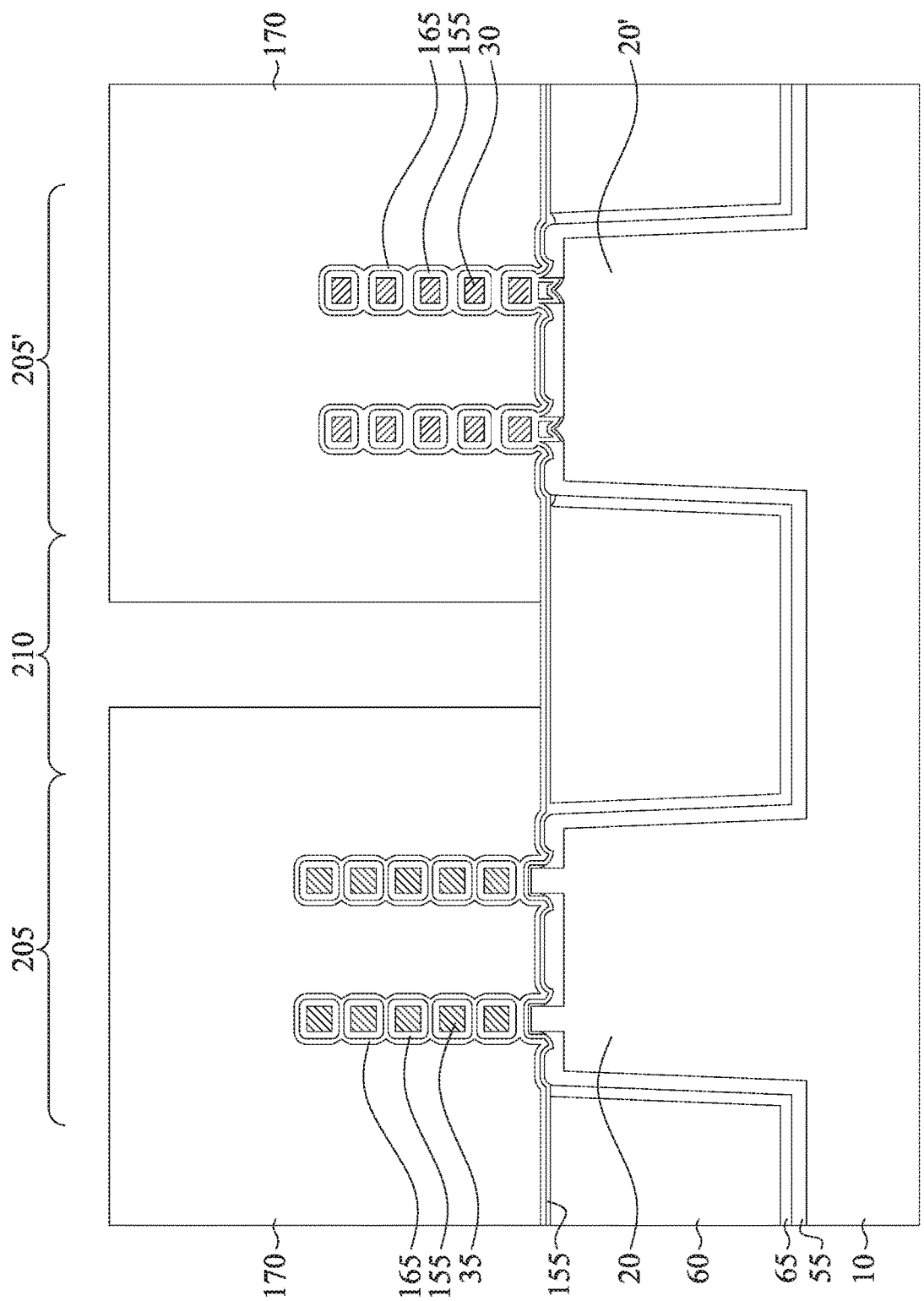
FIG. 29 is a cross-sectional view of one of the various stages of manufacturing a GAA FET semiconductor device according to another embodiment of the present disclosure.

FIG. 29 is a cross-sectional view along the channel region of one of the various stages of manufacturing a GAA FET semiconductor device according to another embodiment of the present disclosure. The present disclosure is not limited to forming two different types of nanowire structures 220, 220'(first nanowires 30 and second nanowires 35) on a common mesa 20, 20'. The present disclosure includes forming the same type of nanowire structures (only first nanowires 30 or only second nanowires 35) on a common mesa 20, 20', as shown in FIG. 29. Embodiments of the present disclosure include forming a plurality of nFETs on a single mesa, a plurality of pFETS on a single mesa, or forming a combination of nFETs and pFETs on a single mesa. While two stacked nanowire structures are shown on each mesa, in some embodiments, three, four, five, or more stacked nanowire structures are formed on each mesa. In some embodiments, up to ten stacked nanowire structures are formed on each mesa.

It is understood that the GAA FETs formed according to the disclosed methods undergo further complementary metal oxide semiconductor (CMOS) processes to form various features such as cap insulating layers, contacts/vias, silicide layers, interconnect metal layers, dielectric layers, passivation layers, metallization layers with signal lines, etc.

Figure 30:
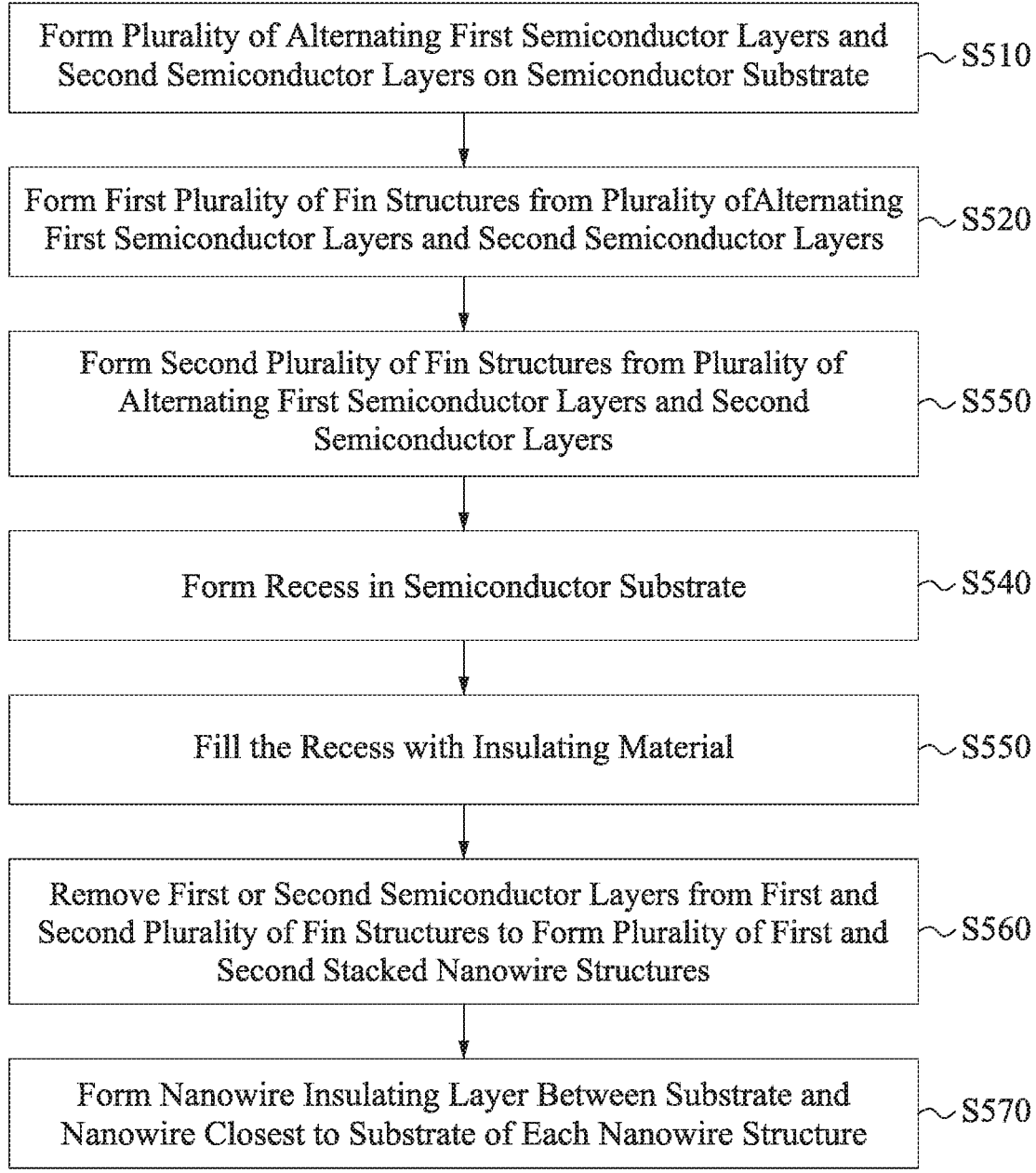
FIG. 30 is a flowchart of a method of manufacturing a semiconductor device according to embodiments of the present disclosure.

An embodiment of the present disclosure is a method 500 of manufacturing a semiconductor device according to the flowchart illustrated in FIG. 30. The method includes an operation S510 of forming a plurality of alternating first semiconductor layers and second semiconductor layers on a semiconductor substrate (see, e.g. FIGS. 3A and 3B). The first semiconductor layers and the second semiconductor layers are made of different materials. In operation S520 a first plurality of fin structures are formed from the plurality of alternating first semiconductor layers and second semiconductor layers, and in operation S530 a second plurality of fin structures are formed from the plurality of alternating first semiconductor layers and second semiconductor layers. The first and second plurality of fin structures extend in a first direction over first and second regions of the semiconductor substrate, respectively. The first and second plurality of fin structures are arranged along a second direction substantially perpendicular to the first direction (see, e.g. FIG. 19). A recess is formed in the semiconductor substrate in operation S540. The recess is formed in a third region between the first and second regions of the semiconductor substrate (see, e.g. FIG. 20). In some embodiments, forming the recess includes: forming a photoresist and/or BARC layer over the first plurality of fin structures and the second plurality of fin structures, patterning the photoresist and/or BARC layer using suitable photolithographic operations to expose a portion of the substrate in the third region between the first and second regions of the semiconductor substrate, etching the third region of the semiconductor substrate to a depth, and subsequently removing the remaining photoresist and/or BARC layer using a suitable photoresist removal operation. The recess is filled with an insulating material in operation S550 (see, e.g. FIGS. 21 and 22). Then, in operation S560 the first semiconductor layer or the second semiconductor layer is removed from each of first plurality and second plurality of fin structures, thereby forming a plurality of first stacked nanowire structures and a plurality of second stacked nanowire structures, respectively. A nanowire stack insulating layer is subsequently formed between the substrate and a nanowire closest to the substrate of each nanowire structure of the first plurality of stacked nanowire structures and second plurality of stacked nanowire structures, respectively in operation S570.

Figure 31:
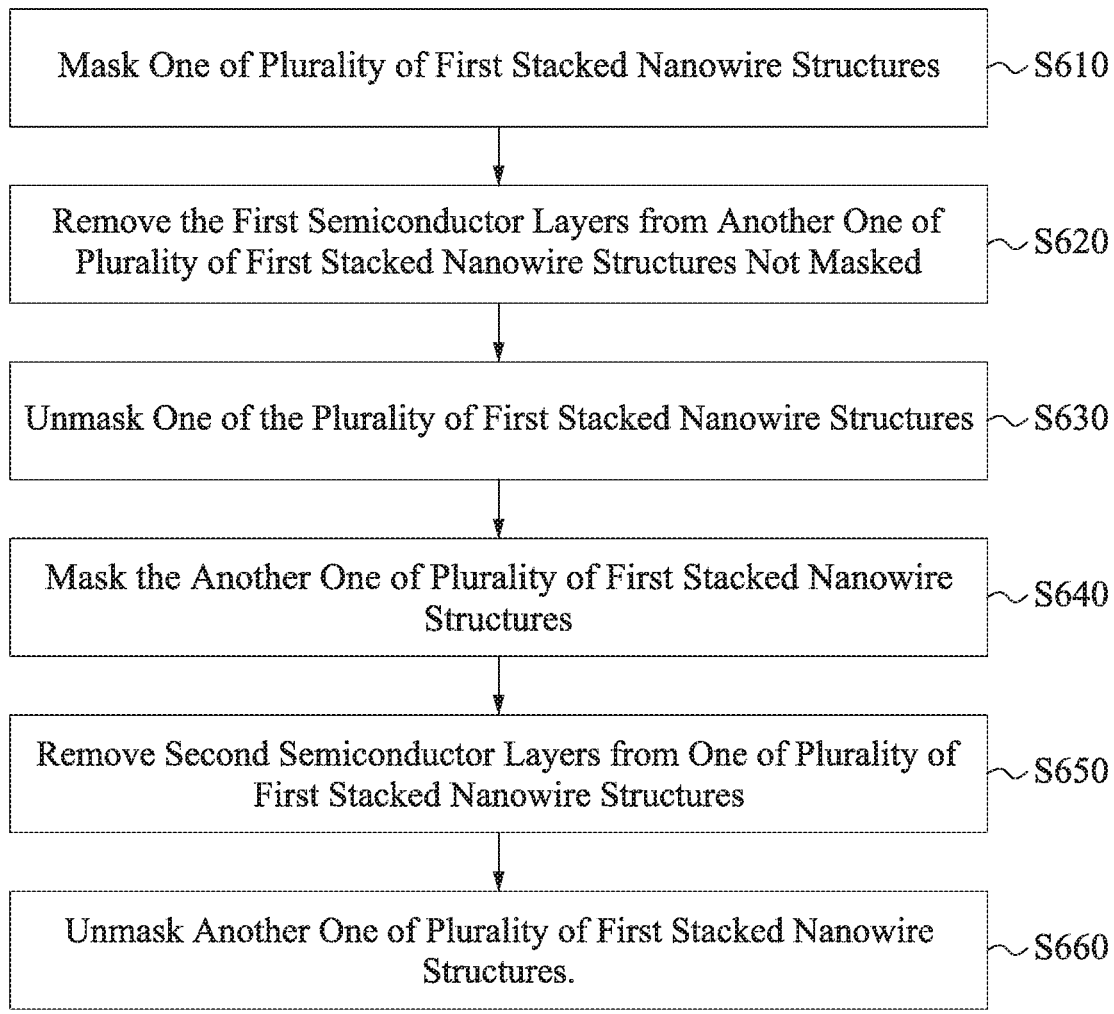
FIG. 31 is a flowchart of a method of manufacturing a semiconductor device according to embodiments of the present disclosure.

In some embodiments, removing the first semiconductor layer or the second semiconductor layer from each of the first plurality and second plurality of fin structures is performed as set forth in the operations shown in FIG. 31. FIG. 31 is a flowchart illustrating a method 600 of removing the first or second semiconductor layers from the fin structures. In operation S610, one of the plurality of first stacked nanowire structures is masked. Then in operation S620 the first semiconductor layers are removed from another one of the plurality of first stacked nanowire structures that is not masked. The one of the plurality of first stacked nanowire structures is unmasked in operation S630 and the another one of the plurality of first stacked nanowire structures is masked in operation S640. In operation S650 the second semiconductor layers from the one of the plurality of first stacked nanowire structures are removed. Then, the another one of the plurality of first stacked nanowire structures is unmasked in operation S660.

Embodiments of the present disclosure include shallow trench isolation (STI) layers between mesa structures having a plurality of stacked nanowire structures, instead of between individual stacked nanowire structures. By eliminating shallow trench isolation layers between individual stacked nanowire structures, embodiments of the present disclosure provide high aspect ratio (>9) and increased device density. The present disclosure provides semiconductor devices with reduced stacked nanowire structure height and pitch, and reduced STI depth. A reduced amount of etching is required to form semiconductor devices according to the present disclosure. Embodiments of the present disclosure have improved charge transport and short channel control, thereby providing improved device performance. The disclosed methods can be efficiently integrated into the semiconductor device manufacturing process flow.

An embodiment of the present disclosure is a semiconductor device, including a first plurality of stacked nanowire structures extending in a first direction disposed over a first region of a semiconductor substrate. Each nanowire structure of the first plurality of stacked nanowire structures includes a plurality of nanowires arranged in a second direction substantially perpendicular to the first direction. A nanowire stack insulating layer is between the substrate and a nanowire closest to the substrate of each nanowire structure of the first plurality of stacked nanowire structures. At least one second stacked nanowire structure is disposed over a second region of the semiconductor substrate, and a shallow trench isolation layer is between the first region and the second region of the semiconductor substrate. In an embodiment, there are no shallow trench isolation layers between the stacked nanowire structures of the first plurality of stacked nanowire structures. In an embodiment, the first plurality of stacked nanowire structures are disposed over a common mesa structure. In an embodiment, the semiconductor device includes a gate structure defining a channel region disposed over each nanowire structure, wherein the gate structure extends in a third direction substantially perpendicular to the first direction and the second direction. In an embodiment, the gate structure wraps around each of the nanowires. In an embodiment, the semiconductor device includes source/drains disposed on opposing sides of the gate structure. In an embodiment, the nanowire stack insulating layer includes a first nanowire stack insulating layer made of silicon nitride, silicon carbon nitride, or a low-k material disposed between the source/drain regions and the substrate. In an embodiment, the low-k material is selected from the group consisting of porous silicon dioxide, carbon doped silicon dioxides, and fluorine doped silicon dioxide. In an embodiment, the nanowire stack insulating layer includes a second nanowire stack insulating layer in the channel region made of a silicon oxide or a high-k material disposed between the nanowire closest to the substrate and the substrate.

Another embodiment of the present disclosure is a semiconductor device including a first plurality of stacked nanowire structures extending in a first direction disposed over a first region of a semiconductor substrate. Each nanowire structure of the first plurality of stacked nanowire structures includes a plurality of nanowires arranged in a second direction substantially perpendicular to the first direction. At least one second stacked nanowire structure is disposed over a second region of the semiconductor substrate. Each nanowire structure of the at least one second stacked nanowire structure includes a plurality of nanowires arranged in the second direction. A shallow trench isolation layer is between the first region and the second region of the semiconductor substrate. There is no shallow trench isolation layer between and below a level of the stacked nanowire structures of the first plurality of stacked nanowire structures. In an embodiment, the at least one second stacked nanowire structure disposed over a second region of the semiconductor substrate includes a second plurality of stacked nanowire structures. In an embodiment, there is no shallow trench isolation layer between and below a level of the stacked nanowire structures of the second plurality of stacked nanowire structures. In an embodiment, the nanowires in each stacked nanowire structure are arranged substantially parallel to each other. In an embodiment, the first plurality of stacked nanowire structures are disposed over a common mesa structure. In an embodiment, the semiconductor device includes a gate structure disposed over each nanowire structure, wherein the gate structure extends in a third direction substantially perpendicular to the first direction and the second direction. In an embodiment, the gate structure wraps around each of the nanowires.

Another embodiment of the present disclosure is a semiconductor device including a first complementary metal oxide field effect transistor (CMOSFET) disposed over a first mesa structure on a semiconductor substrate. The first CMOSFET includes a first stacked nanowire structure and a second stacked nanowire structure. A second CMOSFET is disposed over a second mesa structure on the semiconductor substrate. The second CMOSFET includes a third stacked nanowire structure and a fourth stacked nanowire structure. A shallow trench isolation layer is disposed between the first mesa structure and the second mesa structure. There is no shallow trench isolation layer between the first stacked nanowire structure and the second stacked nanowire structure, and there is no shallow trench isolation layer between the third stacked nanowire structure and the fourth stacked nanowire structure. In an embodiment, the semiconductor device includes a first nanowire stack insulating layer between the first mesa and a nanowire closest to the first mesa of the first stacked nanowire structure, and a second nanowire stack insulating layer between the second mesa and a nanowire closest to the second mesa of the third stacked nanowire structure. In an embodiment, a gate structure is disposed over each nanowire structure. In an embodiment, the gate structure wraps around each of the nanowires.

Another embodiment of the present disclosure is a method of manufacturing a semiconductor device including forming a plurality of fin structures extending in a first direction over a first region of a semiconductor substrate. The plurality of fin structures are arranged along a second direction substantially perpendicular to the first direction, and each of the fin structures comprises an alternating stack of first semiconductor layers and second semiconductor layers arranged in a third direction substantially perpendicular to the first direction and the second direction. The first semiconductor layers and the second semiconductor layers are made of different materials. A portion of the semiconductor substrate is removed in second regions of the semiconductor substrate located on opposing sides of the first region of the semiconductor substrate along the second direction, thereby forming a mesa structure in the first region. The first semiconductor layers or the second semiconductor layers are removed from each of the plurality of nanowire structures in a region where a gate structure is to be formed to form a plurality of nanowire structures. A gate structure extending in the second direction is formed over remaining first semiconductor layers or remaining second semiconductor layers after the removing the first semiconductor layers or the second semiconductor layers. The gate structure wraps around the remaining first semiconductor layers or the remaining second semiconductor layers. In an embodiment, the second region of the semiconductor substrate is removed by masking the first region and etching the second region. In an embodiment, no recess is formed in the first region of the substrate between adjacent nanowire structures. In an embodiment, the method includes forming an insulating layer between the substrate and each of the plurality of nanowire structures. In an embodiment, the method includes forming source/drains on opposing sides of the gate structure. In an embodiment, the method includes forming a nanowire structure insulating layer between the substrate and each of the plurality of nanowire structures in a region where the source/drains are to be formed. In an embodiment, the forming source/drains includes forming epitaxial semiconductor layers over the nanowires on opposing sides of the gate structure. In an embodiment, forming a gate structure includes forming a gate dielectric layer over the semiconductor substrate and forming a gate electrode layer over the gate dielectric layer.

Another embodiment of the present disclosure is a method of manufacturing a semiconductor device including forming a plurality of alternating first semiconductor layers and second semiconductor layers over a semiconductor substrate. The first semiconductor layers and the second semiconductor layers are made of different materials. A first plurality of fin structures is formed extending in a first direction from the plurality of alternating first semiconductor layers and second semiconductor layers. The first plurality of fin structures are arranged along a second direction substantially perpendicular to the first direction. A masking layer is formed over a first portion of the semiconductor substrate where the first plurality of fin structures are formed. Unmasked portions of the semiconductor substrate are etched to form a first mesa structure. The first plurality of fin structures are disposed over the mesa structure. The first semiconductor layer or the second semiconductor layer is removed from each of the plurality of fin structures in a region where a gate structure is to be formed to form a first plurality of stacked nanowire structures. Each stacked nanowire structure includes a plurality of nanowires arranged in a third direction substantially perpendicular to the first and second directions. A nanowire stack insulating layer is formed between the substrate and a nanowire in the nanowire stacked structures located closest to the substrate in the third direction. In an embodiment, the nanowire stack insulating layer is formed after removing the first semiconductor layer or the second semiconductor layer from each of the plurality of fin structures. In an embodiment, the nanowire stack insulating layer is formed over the semiconductor substrate before forming the plurality of alternating first semiconductor layers and second semiconductor layers. In an embodiment, shallow trench isolation layers are not formed in portions of the substrate between adjacent fin structures. In an embodiment, the method includes forming at least one second fin structure extending in a first direction from the plurality of alternating first semiconductor layers and second semiconductor layers, and a shallow trench isolation layer is formed in the semiconductor substrate between the first plurality of fin structures and the at least one second fin structure. In an embodiment, the at least one second fin structure includes a plurality of fin structures arranged along the second direction. In an embodiment, the method includes forming a second mesa structure from the substrate, wherein the second fin structure is disposed over the second mesa structure. In an embodiment, there are no shallow trench isolation layers between adjacent second fin structures.

In another embodiment of the present disclosure, a method of manufacturing a semiconductor device includes forming a plurality of alternating first semiconductor layers and second semiconductor layers on a semiconductor substrate. The first semiconductor layers and the second semiconductor layers are made of different materials. A first plurality of fin structures is formed from the plurality of alternating first semiconductor layers and second semiconductor layers extending in a first direction over a first region of the semiconductor substrate. A second plurality of fin structures is formed from the plurality of alternating first semiconductor layers and second semiconductor layers extending in a first direction over a second region of the semiconductor substrate. The first and second plurality of fin structures are arranged along a second direction substantially perpendicular to the first direction. The first region is spaced apart from the second region. The first region and the second region are masked. A first recess is formed in a third region of the semiconductor substrate between the first region and the second region along the second direction. A second recess is formed in the semiconductor substrate adjacent the first region on an opposing side of the first plurality of fin structures from the third region. A third recess is formed in the semiconductor substrate adjacent the second region on an opposing side of the second plurality of fin structures from the third region. The first recess, second recess, and third recess are filled with an insulating material. The first semiconductor layer or the second semiconductor layer is removed from each of first plurality and second plurality of fin structures, thereby forming a plurality of first stacked nanowire structures and a plurality of second stacked nanowire structures, respectively. A nanowire stack insulating layer is formed between the substrate and a nanowire closest to the substrate of each nanowire structure of the first plurality of stacked nanowire structures and second plurality of stacked nanowire structures. In an embodiment, gate electrode structures are formed over the plurality of first stacked nanowire structures and the plurality of second stacked nanowire structures, and source/drains are formed on opposing sides of the gate electrode structures. In an embodiment, one of the plurality of first nanowire structures includes the gate electrode structure wrapped around the first semiconductor layer, and another one of the plurality of first nanowire structures includes the gate electrode structure wrapped around the second semiconductor layer. In an embodiment, removing the first semiconductor layer or the second semiconductor layer from each of first plurality and second plurality of fin structures includes: masking one of the plurality of first stacked nanowire structures, removing the first semiconductor layers from another one of the plurality of first stacked nanowire structures that is not masked, unmasking the one of the plurality of first stacked nanowire structures, masking the another one of the plurality of first stacked nanowire structures, removing the second semiconductor layers from the one of the plurality of first stacked nanowire structures, and unmasking the another one of the plurality of first stacked nanowire structures.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

It will be understood that not all advantages have been necessarily discussed herein, no particular advantage is required for all embodiments or examples, and other embodiments or examples may offer different advantages.

What is claimed is:

1. A semiconductor device, comprising:
    a first plurality of stacked nanowire structures extending in a first direction disposed over a first region of a semiconductor substrate,
    wherein each nanowire structure of the first plurality of stacked nanowire structures includes a plurality of nanowires arranged in a second direction substantially perpendicular to the first direction, and the nanowire structures of the first plurality of stacked nanowire structures are arranged along a third direction substantially perpendicular to the first direction and the second direction;
    a nanowire stack insulating layer between the substrate and a nanowire closest to the substrate of each nanowire structure of the first plurality of stacked nanowire structures;
    at least one second stacked nanowire structure disposed over a second region of the semiconductor substrate; and
    a shallow trench isolation layer between the first region and the second region of the semiconductor substrate.

2. The semiconductor device of claim 1, wherein there are no shallow trench isolation layers between the stacked nanowire structures of the first plurality of stacked nanowire structures.

3. The semiconductor device of claim 1, wherein the first plurality of stacked nanowire structures are disposed over a common mesa structure.

4. The semiconductor device of claim 1, further comprising a gate structure defining a channel region disposed over each nanowire structure, wherein the gate structure extends in the third direction.

5. The semiconductor device of claim 4, wherein the gate structure wraps around each of the nanowires.

6. The semiconductor device of claim 4, further comprising source/drains disposed on opposing sides of the gate structure.

7. The semiconductor device of claim 6, wherein the nanowire stack insulating layer includes a first nanowire stack insulating layer made of silicon nitride, silicon carbon nitride, or a low-k material disposed between the source/drain regions and the substrate.

8. The semiconductor device of claim 7, wherein the low-k material is selected from the group consisting of porous silicon dioxide, carbon doped silicon dioxides, and fluorine doped silicon dioxide.

9. The semiconductor device of claim 7, wherein the nanowire stack insulating layer includes a second nanowire stack insulating in the channel region made of a silicon oxide or a high-k material disposed between the nanowire closest to the substrate and the substrate.

10. A semiconductor device, comprising:
    a first plurality of stacked nanowire structures extending in a first direction disposed over a first region of a semiconductor substrate,
    wherein each nanowire structure of the first plurality of stacked nanowire structures includes a plurality of nanowires arranged in a second direction substantially perpendicular to the first direction, and the nanowire structures of the first plurality of stacked nanowire structures are arranged along a third direction substantially perpendicular to the first direction and the second direction;

at least one second stacked nanowire structure disposed over a second region of the semiconductor substrate, wherein each nanowire structure of the at least one second stacked nanowire structure includes a plurality of nanowires arranged in the second direction; and a shallow trench isolation layer between the first region and the second region of the semiconductor substrate, wherein there is no shallow trench isolation layer between and below a level of the stacked nanowire structures of the first plurality of stacked nanowire structures.

11. The semiconductor device of claim 10, wherein the at least one second stacked nanowire structure disposed over a second region of the semiconductor substrate includes a second plurality of stacked nanowire structures.

12. The semiconductor device of claim 11, wherein there is no shallow trench isolation layer between and below a level of the stacked nanowire structures of the second plurality of stacked nanowire structures.

13. The semiconductor device of claim 10, wherein the nanowires in each stacked nanowire structure are arranged substantially parallel to each other.

14. The semiconductor device of claim 10, the first plurality of stacked nanowire structures are disposed over a common mesa structure.

15. The semiconductor device of claim 10, further comprising a gate structure disposed over each nanowire structure, wherein the gate structure extends in the third direction.

16. The semiconductor device of claim 15, wherein the gate structure wraps around each of the nanowires.

17. A semiconductor device, comprising:

a first complementary metal oxide field effect transistor (CMOSFET) disposed over a first mesa structure on a semiconductor substrate, wherein the first CMOSFET includes a first stacked nanowire structure and a second stacked nanowire structure, the first and second stacked nanowire structures extend along a first direction, are stacked along a second direction substantially perpendicular to the first direction, and spaced apart from each other along a third direction substantially perpendicular to the first direction and the second direction;

a second CMOSFET disposed over a second mesa structure on the semiconductor substrate, wherein the second CMOSFET includes a third stacked nanowire structure and a fourth stacked nanowire structure; and a shallow trench isolation layer disposed between the first mesa structure and the second mesa structure, wherein there is no shallow trench isolation layer between the first stacked nanowire structure and the second stacked nanowire structure, and wherein there is no shallow trench isolation layer between the third stacked nanowire structure and the fourth stacked nanowire structure.

18. The semiconductor device of claim 17, further comprising:

a first nanowire stack insulating layer between the first mesa and a nanowire closest to the first mesa of the first stacked nanowire structure; and a second nanowire stack insulating layer between the second mesa and a nanowire closest to the second mesa of the third stacked nanowire structure.

19. The semiconductor device of claim 17, further comprising a gate structure disposed over each nanowire structure.

20. The semiconductor device of claim 19, wherein the gate structure wraps around each of the nanowires.

* * * * *